(12) United States Patent
Kanesaka et al.

(10) Patent No.: US 9,818,946 B2
(45) Date of Patent: Nov. 14, 2017

(54) FILM AND ORGANIC SEMICONDUCTOR DEVICE CONTAINING THE FILM

(71) Applicant: SUMITOMO CHEMICAL COMPANY, LIMITED, Tokyo (JP)

(72) Inventors: Sho Kanesaka, Tsukuba (JP); Hidekazu Yoshida, Osaka (JP); Tomoya Kashiki, Tsukuba (JP); Takayuki Okachi, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/129,028

(22) PCT Filed: Apr. 15, 2015

(86) PCT No.: PCT/JP2015/061555
§ 371 (c)(1),
(2) Date: Sep. 26, 2016

(87) PCT Pub. No.: WO2015/163207
PCT Pub. Date: Oct. 29, 2015

(65) Prior Publication Data
US 2017/0110665 A1    Apr. 20, 2017

(30) Foreign Application Priority Data
Apr. 21, 2014  (JP) .................................. 2014-087098

(51) Int. Cl.
*H01L 35/24* (2006.01)
*H01L 51/00* (2006.01)
(Continued)

(52) U.S. Cl.
CPC ............ *H01L 51/0036* (2013.01); *C08K 5/45* (2013.01); *C08K 5/54* (2013.01); *C08L 65/00* (2013.01);
(Continued)

(58) Field of Classification Search
None
See application file for complete search history.

(56) References Cited

U.S. PATENT DOCUMENTS

| | | |
|---|---|---|
| 2010/0171102 A1 | 7/2010 | Ie et al. |
| 2011/0108813 A1 | 5/2011 | Kohiro et al. |

(Continued)

FOREIGN PATENT DOCUMENTS

| | | | |
|---|---|---|---|
| JP | 2006-514710 A1 | 5/2006 | |
| JP | 2012-39103 A | 2/2012 | |

(Continued)

OTHER PUBLICATIONS

English Translation of International Search Report dated Jul. 21, 2015, from the International Bureau in counterpart International application No. PCT/JP2015/061555 (WO2015163207).

(Continued)

*Primary Examiner* — Jack Chen
(74) *Attorney, Agent, or Firm* — Sughrue Mion, PLLC

(57) ABSTRACT

A film comprising a polymer compound and a low molecular weight compound having carrier transportability, wherein the content of the low molecular weight compound is 5 to 40 parts by mass with respect to 100 parts by mass of the sum of the polymer compound and the low molecular weight compound, the diffraction intensity A specified by the following measuring method A is 3 to 50, and the intensity ratio (A/B) of the diffraction intensity A specified by the following measuring method A to the diffraction intensity B specified by the following measuring method B is 30 or less: (Measuring method A) the diffraction intensity A is the maximum diffraction intensity in a range of scattering vector of 1 $nm^{-1}$ to 5 $nm^{-1}$ in a profile obtained by an Out-of plane measuring method using a film X-ray diffraction method; (Measuring method B) the diffraction intensity B is the maximum diffraction intensity in a range of scattering vector (Continued)

of 10 nm$^{-1}$ to 21 nm$^{-1}$ in a profile obtained by an In-plane measuring method using a film X-ray diffraction method.

10 Claims, 7 Drawing Sheets

(51) Int. Cl.

| | | |
|---|---|---|
| C08K 5/45 | (2006.01) | |
| C08K 5/54 | (2006.01) | |
| C08L 65/00 | (2006.01) | |
| H01L 29/80 | (2006.01) | |
| H01L 51/05 | (2006.01) | |
| C09D 5/24 | (2006.01) | |
| C09D 7/12 | (2006.01) | |
| C09D 165/00 | (2006.01) | |

(52) U.S. Cl.
CPC ............ *C09D 5/24* (2013.01); *C09D 7/1233* (2013.01); *C09D 165/00* (2013.01); *H01L 29/80* (2013.01); *H01L 51/0074* (2013.01); *H01L 51/05* (2013.01); *C08G 2261/124* (2013.01); *C08G 2261/1412* (2013.01); *C08G 2261/3246* (2013.01); *C08G 2261/411* (2013.01); *C08G 2261/92* (2013.01); *C08K 2201/001* (2013.01); *H01L 51/057* (2013.01); *H01L 51/0541* (2013.01); *H01L 51/0545* (2013.01); *H01L 51/0554* (2013.01); *H01L 51/0566* (2013.01)

(56) References Cited

U.S. PATENT DOCUMENTS

| | | |
|---|---|---|
| 2012/0313086 A1 | 12/2012 | Sadamitsu |
| 2013/0140548 A1 | 6/2013 | Kohiro et al. |
| 2013/0324685 A1 | 12/2013 | Aso et al. |
| 2017/0025613 A1* | 1/2017 | Kanesaka ............ C08G 61/126 |
| 2017/0110665 A1* | 4/2017 | Kanesaka ............... C08K 5/45 |

FOREIGN PATENT DOCUMENTS

| | | |
|---|---|---|
| WO | 2004/057688 A1 | 7/2004 |
| WO | 2008/111461 A1 | 9/2008 |
| WO | 2009/122956 A1 | 10/2009 |
| WO | 2012/033073 A1 | 3/2012 |
| WO | 2012/105511 A1 | 8/2012 |
| WO | 2013/041822 A1 | 3/2013 |

OTHER PUBLICATIONS

English Translation of International Preliminary Report on Patentability, dated Oct. 25, 2016, from the International Bureau in counterpart International application No. PCT/JP2015/061555 (WO2015163207).

Zhang, W., et al., " Indacenodithiophene Semiconducting Polymers for High-Performance, Air-Stable Transistors", J. American Chemical Society, vol. 132, No. 33, Jun. 9, 2010, pp. 11437-11439.

* cited by examiner

[Fig. 1]
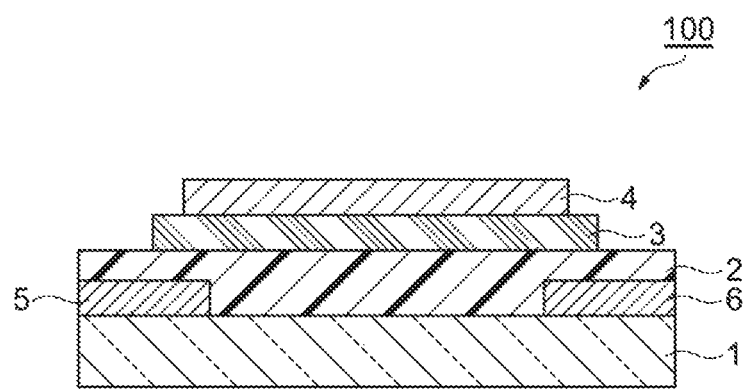

[Fig. 2]
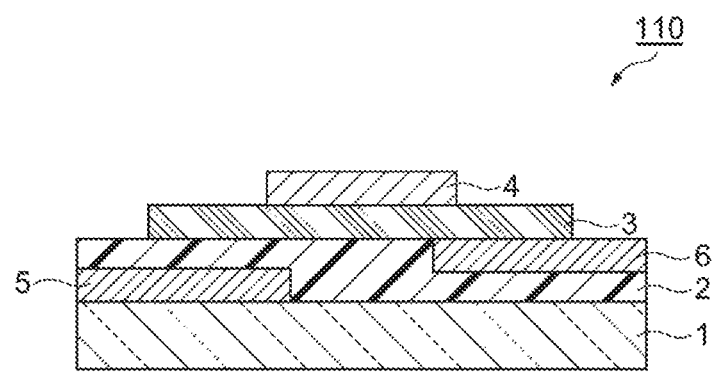

[Fig. 3]
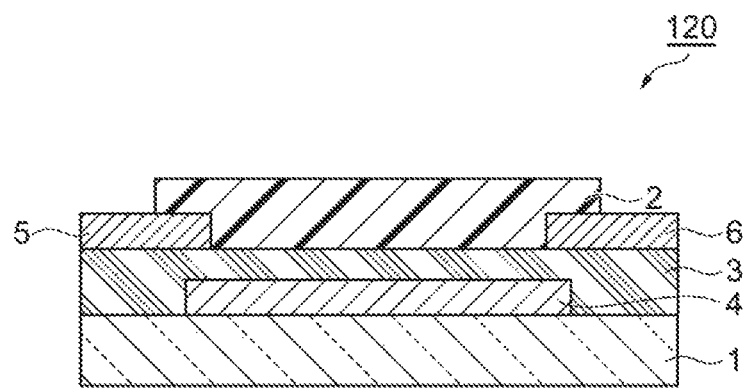

[Fig. 4]
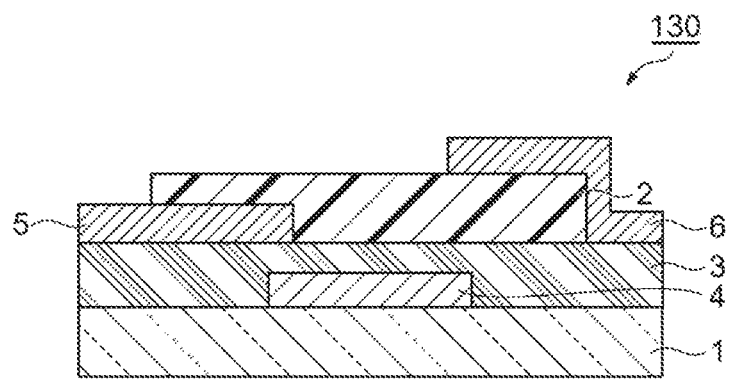

[Fig. 5]
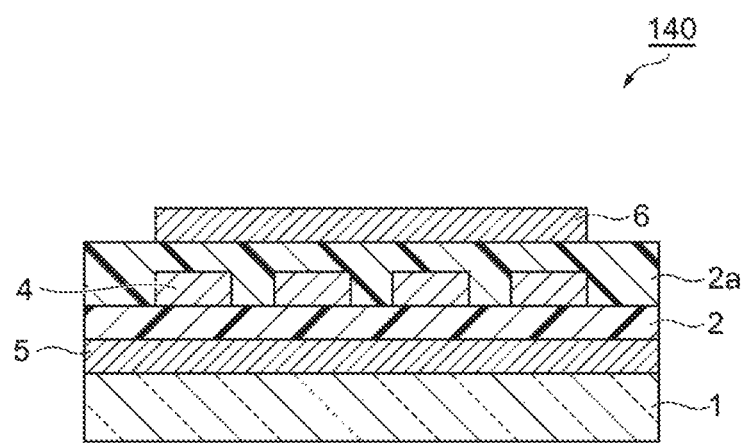

[Fig. 6]
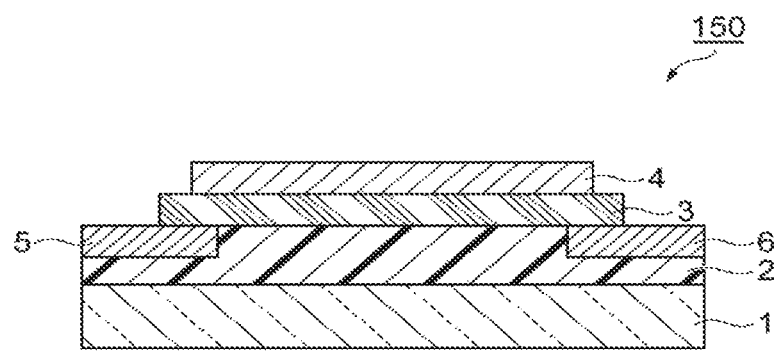

[Fig. 7]
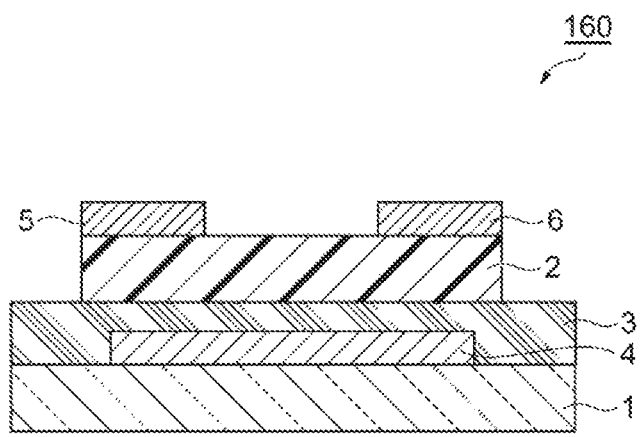

FILM AND ORGANIC SEMICONDUCTOR DEVICE CONTAINING THE FILM

CROSS REFERENCE TO RELATED APPLICATIONS

This application is a National Stage of International Application No. PCT/JP2015/061555 filed Apr. 15, 2015, claiming priority based on Japanese Patent Application No. 2014-087098 filed Apr. 21, 2014, the contents of all of which are incorporated herein by reference in their entirety.

TECHNICAL FIELD

The present invention relates to a film and an organic semiconductor device comprising the film.

BACKGROUND ART

Organic film transistors using a film containing an organic semiconductor material are actively studied and developed, since the organic film transistors can be produced at lower temperature, and additionally, reduction in weight of the device and decrease in production cost thereof are expected, as compared with conventional transistors using an inorganic semiconductor material.

Electric field effect mobility, a measure indicating the performance of an organic film transistor, depends largely on the electric field effect mobility of a film containing an organic semiconductor material used in an active layer. Therefore, the film containing an organic semiconductor material used in an active layer of an organic film transistor is variously investigated.

As the film used in an active layer of an organic film transistor, Patent document 1 suggests, for example, a film containing a polymer compound 1 composed of a structural unit represented by the following formula and a low molecular weight compound 1 represented by the following formula.

[chemical formula 1]

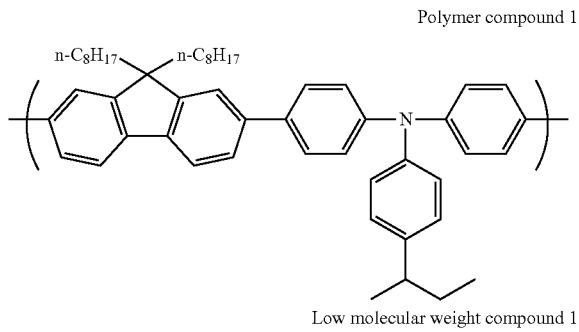

Polymer compound 1

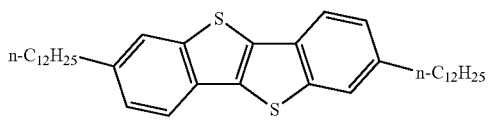

Low molecular weight compound 1

PRIOR ART DOCUMENT

Non-Patent Document

Patent document 1: International Publication WO2009/122956

SUMMARY OF THE INVENTION

However, the electric field effect mobility of an organic film transistor using the above-described film in an active layer is not necessarily sufficient.

The present invention has an object of providing a film which is useful for production of an organic film transistor excellent in electric field effect mobility. Further, the present invention has an object of providing an organic semiconductor device using this film in an active layer.

The present invention provides a film described below and an organic semiconductor device using the film in an active layer.

[1] A film comprising a polymer compound and a low molecular weight compound having carrier transportability, wherein
the content of the low molecular weight compound is 5 to 40 parts by mass with respect to 100 parts by mass of the sum of the polymer compound and the low molecular weight compound,
the diffraction intensity A specified by the following measuring method A is 3 to 50, and
the intensity ratio (A/B) of the diffraction intensity A specified by the following measuring method A to the diffraction intensity B specified by the following measuring method B is 30 or less:
(Measuring Method A)
the diffraction intensity A is the maximum diffraction intensity in a range of scattering vector of 1 $nm^{-1}$ to 5 $nm^{-1}$ in a profile obtained by an Out-of plane measuring method using a film X-ray diffraction method,
(Measuring Method B)
the diffraction intensity B is the maximum diffraction intensity in a range of scattering vector of 10 $nm^{-1}$ to 21 $nm^{-1}$ in a profile obtained by an In-plane measuring method using a film X-ray diffraction method.
[2] The film according to [1], wherein the above-described diffraction intensity A is 3 to 30.
[3] The film according to [1] or [2], wherein the intensity ratio (A/B) of the above-described diffraction intensity A to the above-described diffraction intensity B is 20 or less.
[4] The film according to any one of [1] to [3], wherein the above-described low molecular weight compound is a low molecular weight compound represented by the formula (1):

[chemical formula 2]

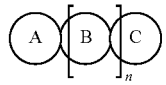

(1)

[wherein
n represents an integer of 1 or more.
Ring A and Ring C each independently represent a benzene ring, a 5-membered heterocyclic ring or a 6-membered heterocyclic ring, and these rings may have a substituent.
Ring B represents a benzene ring, a cyclopentadiene ring, a 5-membered heterocyclic ring or a 6-membered heterocyclic ring, and these rings may have a substituent. When there are a plurality of Rings B, they may be the same or different.
Ring A and Ring B are mutually condensed to form a condensed ring, Ring B and Ring C are mutually condensed to form a condensed ring, and when there are a plurality of Rings B, adjacent Rings B are mutually condensed to form a condensed ring.].

[5] The film according to [4], wherein the compound represented by the above-described formula (1) is a compound represented by the formula (1-1), a compound represented by the formula (1-2), a compound represented by the formula (1-3), a compound represented by the formula (1-4), a compound represented by the formula (1-5), a compound represented by the formula (1-6), a compound represented by the formula (1-7), a compound represented by the formula (1-8), a compound represented by the formula (1-9), a compound represented by the formula (1-10), a compound represented by the formula (1-11), a compound represented by the formula (1-12), a compound represented by the formula (1-13) or a compound represented by the formula (1-14):

[chemical formula 3]

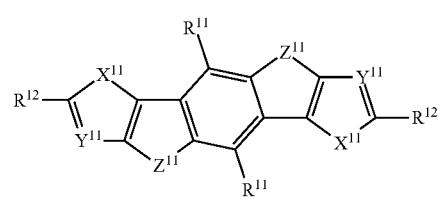
(1-1)

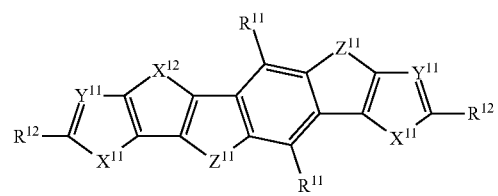
(1-2)

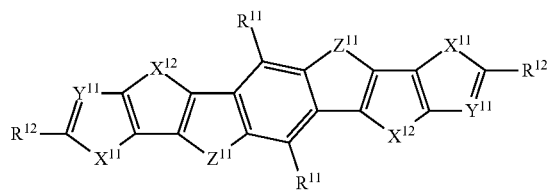
(1-3)

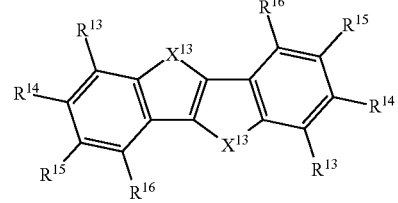
(1-4)

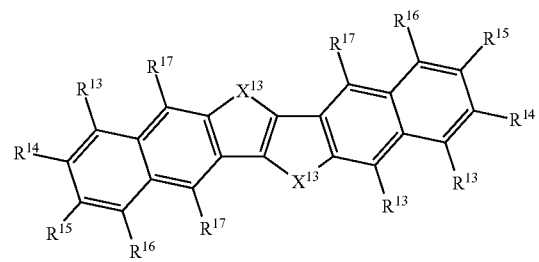
(1-5)

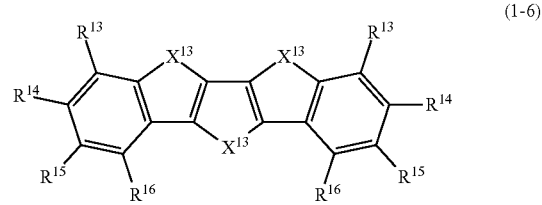
(1-6)

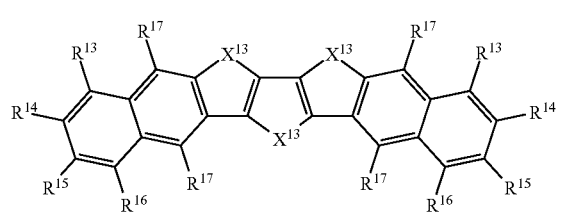
(1-7)

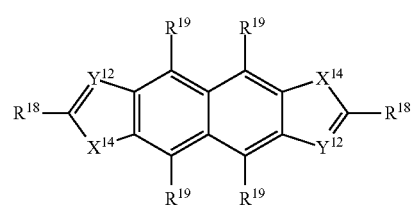
(1-8)

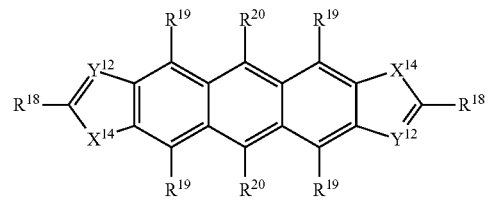
(1-9)

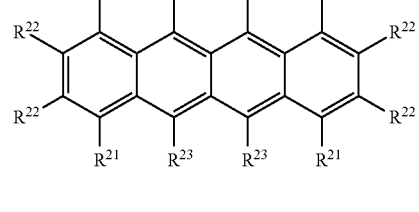
(1-10)

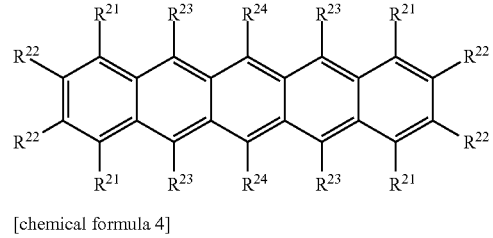
(1-11)

[chemical formula 4]

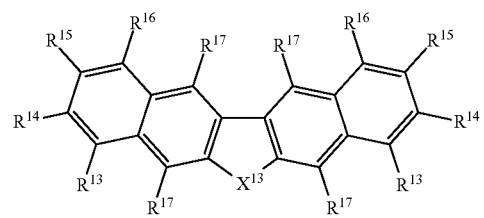
(1-12)

-continued (1-13)

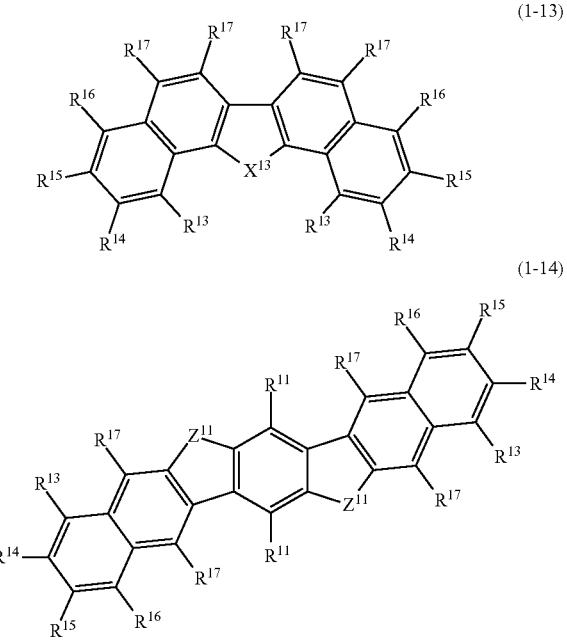

(1-14)

[wherein
Z$^{11}$ represents a group represented by the formula (Z-1), a group represented by the formula (Z-2), a group represented by the formula (Z-3), a group represented by the formula (Z-4) or a group represented by the formula (Z-5). A plurality of Z$^1$ may be mutually the same or different.

X$^{11}$, X$^{12}$, X$^{13}$ and X$^{14}$ each independently represent an oxygen atom, a sulfur atom or a selenium atom. A plurality of X$^{11}$, X$^{13}$ and X$^{14}$ each may be mutually the same or different. When there are a plurality of X$^{12}$, they may be the same or different.

Y$^{11}$ and Y$^{12}$ each independently represent a nitrogen atom or a group represented by —CR$^2$=. R$^2$ represents a hydrogen atom, an alkyl group, a cycloalkyl group, an alkoxy group, a cycloalkoxy group, an alkylthio group, a cycloalkylthio group, an aryl group, a monovalent heterocyclic group or a halogen atom. Of these groups, the alkyl group, the cycloalkyl group, the alkoxy group, the cycloalkoxy group, the alkylthio group, the cycloalkylthio group, the aryl group and the monovalent heterocyclic group each may have a substituent. A plurality of Y$^{11}$ and Y$^{12}$ each may be mutually the same or different.

R$^{11}$, R$^{12}$, R$^{13}$, R$^{14}$, R$^{15}$, R$^{16}$, R$^{17}$, R$^{18}$, R$^{19}$, R$^{20}$, R$^{21}$, R$^{22}$, R$^{23}$ and R$^{24}$ each independently represent a hydrogen atom, an alkyl group, a cycloalkyl group, an alkoxy group, a cycloalkoxy group, an alkylthio group, a cycloalkylthio group, an aryl group, an alkynyl group, a monovalent heterocyclic group or a halogen atom. Of these groups, the alkyl group, the cycloalkyl group, the alkoxy group, the cycloalkoxy group, the alkylthio group, the cycloalkylthio group, the aryl group, the alkynyl group and the monovalent heterocyclic group each may have a substituent. A plurality of R$^{11}$, R$^{12}$, R$^{13}$, R$^{14}$, R$^{15}$, R$^{16}$, R$^{17}$, R$^{18}$, R$^{19}$, R$^{20}$, R$^{21}$, R$^{22}$, R$^{23}$ and R$^{24}$ each may be mutually the same or different.]

[chemical formula 5]

(Z-1)

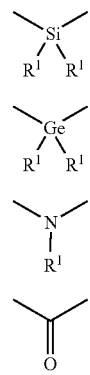

(Z-2)

(Z-3)

(Z-4)

(Z-5)

[wherein R$^1$ represents an alkyl group, a cycloalkyl group, an alkoxy group, a cycloalkoxy group, an alkylthio group, a cycloalkylthio group, an aryl group or a monovalent heterocyclic group, and these groups may have a substituent. When there are a plurality of R$^1$, they may be the same or different.].

[6] The film according to any one of [1] to [5], wherein the above-described polymer compound is a polymer compound containing a structural unit represented by the formula (2):

[chemical formula 6]

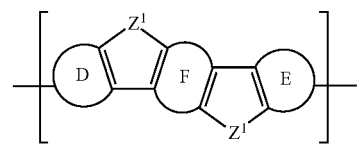

(2)

[wherein
Ring D and Ring E each independently represent a heterocyclic ring, and this heterocyclic ring may have a substituent.

Ring F represents an aromatic hydrocarbon ring or a heterocyclic ring, and these rings may have a substituent.

Z$^1$ represents a group represented by the formula (Z-1'), a group represented by the formula (Z-2'), a group represented by the formula (Z-3'), a group represented by the formula (Z-4') or a group represented by the formula (Z-5'). A plurality of Z$^1$ may be mutually the same or different.]

[chemical formula 7]

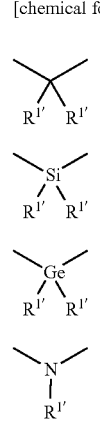

(Z-1')

(Z-2')

(Z-3')

(Z-4')

-continued

(Z-5')

[wherein R[1'] represents an alkyl group, a cycloalkyl group, an alkoxy group, a cycloalkoxy group, an alkylthio group, a cycloalkylthio group, an aryl group or a monovalent heterocyclic group, and these groups may have a substituent. When there are a plurality of R[1'], they may be the same or different.].

[7] The film according to [6], wherein the structural unit represented by the above-described formula (2) is a structural unit represented by the formula (2-1), a structural unit represented by the formula (2-2) or a structural unit represented by the formula (2-3):

[chemical formula 8]

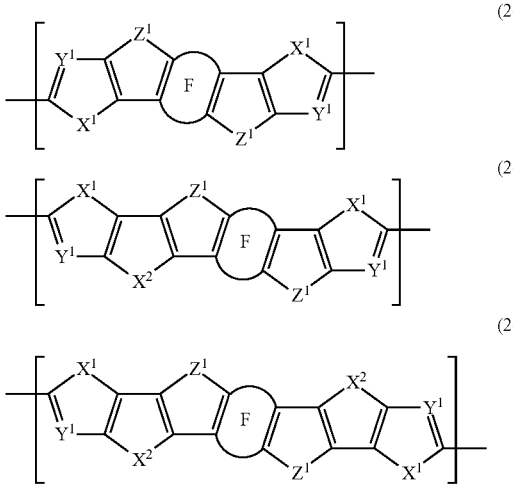

[wherein

Ring F and Z represent the same meaning as described above.

$X^1$ and $X^2$ each independently represent an oxygen atom, a sulfur atom or a selenium atom. A plurality of $X^1$ may be mutually the same or different. When there are a plurality of $X^2$, they may be the same or different.

$Y^1$ represents a nitrogen atom or a group represented by $-CR^{2'}=$. $R^{2'}$ represents a hydrogen atom, an alkyl group, a cycloalkyl group, an alkoxy group, a cycloalkoxy group, an alkylthio group, a cycloalkylthio group, an aryl group, a monovalent heterocyclic group or a halogen atom. A plurality of $Y^1$ may be mutually the same or different.].

[8] An organic semiconductor device having a first electrode and a second electrode and having an active layer between the first electrode and the second electrode, wherein the active layer is the film according to any one of [1] to [7].

[9] The organic semiconductor device according to [8], wherein the organic semiconductor device is any one of an organic film transistor, an organic film solar battery, an organic electroluminescent device, an organic electric field effect transistor sensor and an organic conductivity modulation type sensor.

[10] The organic semiconductor device according to [9], wherein the organic semiconductor device is an organic film transistor.

BRIEF EXPLANATION OF DRAWINGS

FIG. 1 is a schematic cross-sectional view of an organic film transistor according to a first embodiment.
FIG. 2 is a schematic cross-sectional view of an organic film transistor according to a second embodiment.
FIG. 3 is a schematic cross-sectional view of an organic film transistor according to a third embodiment.
FIG. 4 is a schematic cross-sectional view of an organic film transistor according to a fourth embodiment.
FIG. 5 is a schematic cross-sectional view of an organic film transistor according to a fifth embodiment.
FIG. 6 is a schematic cross-sectional view of an organic film transistor according to a sixth embodiment.
FIG. 7 is a schematic cross-sectional view of an organic film transistor according to a seventh embodiment.

MODES FOR CARRYING OUT THE INVENTION

Suitable embodiments of the present invention will be illustrated in detail, if necessary referring to drawings, below. In explanation of drawings, the same elements are denoted by the same reference numerals, and duplicated explanations are omitted.

<Film>

The film of the present invention is a film comprising a polymer compound and a low molecular weight compound having carrier transportability, wherein the content of the low molecular weight compound is 5 to 40 parts by mass with respect to 100 parts by mass of the sum of the polymer compound and the low molecular weight compound, the diffraction intensity A specified by the measuring method A is 3 to 50, and the intensity ratio (A/B) of the diffraction intensity A specified by the measuring method A to the diffraction intensity B specified by the measuring method B is 30 or less.

"Having carrier transportability" denotes having a property of transferring carriers (holes or electrons) in the interior of a film or the like when the film or the like is formed, the electric field effect mobility being an indication thereof. The low molecular weight compound having carrier transportability is preferably a low molecular weight compound which a film formed solely of the compound shows an electric field effect mobility of $1 \times 10^{-6}$ cm$^2$/Vs or more (preferably $1 \times 10^{-5}$ cm$^2$/Vs or more). The upper limit of the electric field effect mobility is not particularly restricted and is usually $1 \times 10^2$ cm$^2$/Vs.

<Low Molecular Weight Compound Having Carrier Transportability>

The low molecular weight compound having carrier transportability contained in the film of the present invention includes, for example, a polycyclic aromatic compound.

The polycyclic aromatic compound includes, for example, naphthalene, anthracene, tetracene, rubrene, pentacene, benzopentacene, dibenzopentacene, tetrabenzopentacene, naphthopentacene, hexacene, heptacene, nanoasen, fluorene, fluoranthene, phenanthrene, chrysene, triphenylene, tetraphene, picene, flumilene, tetraphene, pyrene, anthanthrene, peropyrene, coronene, benzocoronene, dibenzocoronene, hexabenzocoronene, benzodicoronene, perylene, terrylene, diperylene, quaterrylene, trinaphthylene, heptaphene, ovalene, rubicene, violanthrone, isoviolanthrone, circumanthracene, bisanthene, zethrene, heptazethrene, pyranth, kekulene, truxene, fullerene ($C_{60}$, $C_{70}$, $C_{60}$-PCBM, $C_{70}$-PCBM and the like), and derivatives thereof. Of them, tetracene, rubrene, pentacene, hexacene, perylene, terrylene or fullerene is preferable, tetracene, rubrene, pentacene or hexacene is more preferable, as the polycyclic aromatic compound, since an organic film transistor produced by using the film of the present invention is more excellent in electric field effect mobility.

The polycyclic aromatic compound may be one containing a hetero atom. The polycyclic aromatic compound containing a hetero atom includes, for example, benzodithiophene, naphthodithiophene, anthradithiophene, dibenzothiophene, dibenzothienodibenzothiophene, dibenzodithienothiophene, thienothiophene, dithienothiophene, tetrathienoacene, pentathienoacene, indacenodithiophene, dibenzofuran, carbazole, dibenzosilole, benzodithiadiazole, naphthodithiadiazole, anthradithiadiazole, tetradithiadiazole, pentadithiadiazole, hexadithiadiazole, thiazolothiazole, tetrathiafulvalene, dibenzothiafulvalene, dithiophenethiafulvalene, tetracyanoquinodimethane, tetracyanonaphthoquinodimethane, naphthalenetetracarboxylic diimide, perylenetetracarboxylic diimide, phthalocyanine, porphyrin, tetrabenzoporphyrin, triphenylamine, and derivatives thereof. Of them, benzodithiophene, naphthodithiophene, anthradithiophene, dibenzothienodibenzothiophene, indacenodithiophene, tetrathiafulvalene, naphthalenetetracarboxylic diimide, perylenetetracarboxylic diimide, phthalocyanine, porphyrin, tetrabenzoporphyrin or derivatives thereof are preferable, benzodithiophene, naphthodithiophene, anthradithiophene, dibenzothienodibenzothiophene or indacenodithiophene is more preferable, as the polycyclic aromatic compound containing a hetero atom, since an organic film transistor produced by using the film of the present invention is more excellent in electric field effect mobility.

The polycyclic aromatic compound described above may have a substituent.

The substituent which the polycyclic aromatic compound may have includes, for example, an alkyl group, a cycloalkyl group, an alkoxy group, a cycloalkoxy group, an alkylthio group, a cycloalkylthio group, an aryl group, a monovalent heterocyclic ring group, a halogen atom, a silyl group, an amino group, an alkenyl group, a cycloalkenyl group, an alkynyl group, a cycloalkynyl group, a hydroxyl group, a nitro group, a cyano group, a carboxyl group, an alkylcarbonyl group, a cycloalkylcarbonyl group, an alkoxycarbonyl group and a cycloalkoxycarbonyl group.

The alkyl group as the substituent which the polycyclic aromatic compound may have may be any of a linear alkyl group or a branched alkyl group. The number of carbon atoms of the alkyl group is usually 1 to 30 (in the case of a branched alkyl group, usually 3 to 30), and preferably 1 to 20 (in the case of a branched alkyl group, 3 to 20). The number of carbon atoms of the cycloalkyl group as the substituent which the polycyclic aromatic compound may have is usually 3 to 30, preferably 3 to 20. Here, the above-described number of carbon atoms does not include the number of carbon atoms of a substituent.

The alkyl group includes, for example, linear alkyl groups such as a methyl group, an ethyl group, a n-propyl group, a n-butyl group, a n-hexyl group, a n-octyl group, a n-dodecyl group, a n-hexadecyl group and the like, and branched alkyl groups such as an isopropyl group, an isobutyl group, a sec-butyl group, a tert-butyl group, a 2-ethylhexyl group, a 3,7-dimethyloctyl group and the like. The cycloalkyl group includes, for example, a cyclopentyl group and a cyclohexyl group.

The alkyl group may have a substituent, and the substituent includes, for example, a cycloalkyl group, an alkoxy group, a cycloalkoxy group, an aryl group and a halogen atom. The cycloalkyl group may have a substituent, and the substituent includes, for example, an alkyl group, a cycloalkyl group, an alkoxy group, a cycloalkoxy group, an aryl group and a halogen atom. The alkyl group having a substituent includes, for example, a methoxyethyl group, a benzyl group, a trifluoromethyl group and a perfluorohexyl group.

The alkoxy group as the substituent which the polycyclic aromatic compound may have may be any of a linear alkoxy group or a branched alkoxy group. The number of carbon atoms of the alkoxy group is usually 1 to 30 (in the case of a branched alkoxy group, usually 3 to 30), and preferably 1 to 20 (in the case of a branched alkoxy group, 3 to 20). The number of carbon atoms of the cycloalkoxy group as the substituent which the polycyclic aromatic compound may have is usually 3 to 30, preferably 3 to 20. Here, the above-described number of carbon atoms does not include the number of carbon atoms of a substituent.

The alkoxy group includes, for example, linear alkoxy groups such as a methoxy group, an ethoxy group, a n-propyloxy group, a n-butyloxy group, a n-hexyloxy group, a n-octyloxy group, a n-dodecyloxy group, a n-hexadecyloxy group and the like, and branched alkoxy groups such as an isopropyloxy group, an isobutyloxy group, a sec-butyloxy group, a tert-butyloxy group, a 2-ethylhexyloxy group, a 3,7-dimethyloctyloxy group and the like. The cycloalkoxy group includes, for example, a cyclopentyloxy group and a cyclohexyloxy group.

The alkoxy group may have a substituent, and the substituent includes, for example, a cycloalkyl group, an alkoxy group, a cycloalkoxy group, an aryl group and a halogen atom. The cycloalkoxy group may have a substituent, and the substituent includes, for example, an alkyl group, a cycloalkyl group, an alkoxy group, a cycloalkoxy group, an aryl group and a halogen atom.

The alkylthio group as the substituent which the polycyclic aromatic compound may have may be any of a linear alkylthio group or a branched alkylthio group. The number of carbon atoms of the alkylthio group is usually 1 to 30 (in the case of a branched alkylthio group, usually 3 to 30), and preferably 1 to 20 (in the case of a branched alkylthio group, 3 to 20). The number of carbon atoms of the cycloalkylthio group as the substituent which the polycyclic aromatic compound may have is usually 3 to 30, preferably 3 to 20. Here, the above-described number of carbon atoms does not include the number of carbon atoms of a substituent.

The alkylthio group includes, for example, linear alkylthio groups such as a methylthio group, an ethylthio group, a n-propylthio group, a n-butylthio group, a n-hexylthio group, a n-octylthio group, a n-dodecylthio group, a n-hexadecylthio group and the like, and branched alkylthio groups such as an isopropylthio group, an isobutylthio group, a sec-butylthio group, a tert-butylthio group, a 2-ethylhexylthio group, a 3,7-dimethyloctylthio group and the like. The cycloalkylthio group includes, for example, a cyclopentylthio group and a cyclohexylthio group.

The alkylthio group may have a substituent, and the substituent includes, for example, a cycloalkyl group, an alkoxy group, a cycloalkoxy group, an aryl group and a halogen atom. The cycloalkylthio group may have a substituent, and the substituent includes, for example, an alkyl group, a cycloalkyl group, an alkoxy group, a cycloalkoxy group, an aryl group and a halogen atom.

The aryl group as the substituent which the polycyclic aromatic compound may have is an atomic group remaining after removing from an aromatic hydrocarbon which may have a substituent one hydrogen atom linking directly to a carbon atom constituting the ring, and includes a group having a condensed ring, and a group obtained by directly bonding two or more moieties selected from the group consisting of an independent benzene ring and condensed rings. The number of carbon atoms of the aryl group is usually 6 to 30, preferably 6 to 20. Here, the above-described number of carbon atoms does not include the number of carbon atoms of a substituent.

The aryl group includes, for example, a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group and a 4-phenylphenyl group.

The aryl group may have a substituent, and the substituent includes, for example, an alkyl group, a cycloalkyl group, an alkoxy group, a cycloalkoxy group, an alkylthio group, a cycloalkylthio group, a monovalent heterocyclic ring group and a halogen atom. The aryl group having a substituent includes, for example, a 4-hexadecylphenyl group, a 3,5-dimethoxyphenyl group and a pentafluorophenyl group. When the aryl group has a substituent, the substituent is preferably an alkyl group or a cycloalkyl group.

The monovalent heterocyclic ring group as the substituent which the polycyclic aromatic compound may have is an atomic group remaining after removing from a heterocyclic compound which may have a substituent one hydrogen atom linking directly to a carbon atom or a hetero atom constituting the ring, and includes a group having a condensed ring, and a group obtained by directly bonding two or more moieties selected from the group consisting of independent heterocyclic rings and condensed rings. The number of carbon atoms of the monovalent heterocyclic ring group is usually 2 to 30, preferably 3 to 20. Here, the above-described number of carbon atoms does not include the number of carbon atoms of a substituent.

The monovalent heterocyclic ring group includes, for example, a 2-furyl group, a 3-furyl group, a 2-thienyl group, a 3-thienyl group, a 2-pyrrolyl group, a 3-pyrrolyl group, a 2-oxazolyl group, a 2-thiazolyl group, a 2-imidazolyl group, a 2-pyridyl group, a 3-pyridyl group, a 4-pyridyl group, a 2-benzofuryl group, a 2-benzothienyl group, a 2-thienothienyl group and a 4-(2,1,3-benzothiadiazolyl) group.

The monovalent heterocyclic ring group may have a substituent, and the substituent includes, for example, an alkyl group, a cycloalkyl group, an alkoxy group, a cycloalkoxy group, an alkylthio group, a cycloalkylthio group, an aryl group and a halogen atom. The monovalent heterocyclic ring group having a substituent includes, for example, a 5-octyl-2-thienyl group and a 5-phenyl-2-furyl group. When the monovalent heterocyclic ring group has a substituent, the substituent is preferably an alkyl group or a cycloalkyl group.

The halogen atom as the substituent which the polycyclic aromatic compound may have includes, for example, a fluorine atom, a chlorine atom, a bromine atom and an iodine atom.

The silyl group as the substituent which the polycyclic aromatic compound may have may have a substituent. The substituent which the silyl group may have includes, for example, an alkyl group, a cycloalkyl group and an aryl group. The silyl group having a substituent includes, for example, a trimethylsilyl group, a triethylsilyl group, a triisopropylsilyl group, a tert-butyldimethylsilyl group, a phenylsilyl group and a triphenylsilyl group.

The amino group as the substituent which the polycyclic aromatic compound may have may have a substituent. The substituent which the amino group may have includes, for example, an alkyl group, a cycloalkyl group and an aryl group. The amino group having a substituent includes, for example, a dimethylamino group, a diethylamino group, a diisopropylamino group and a diphenylamino group.

The alkenyl group as the substituent which the polycyclic aromatic compound may have may be any of a linear alkenyl group or a branched alkenyl group. The number of carbon atoms of the alkenyl group is usually 2 to 30 (in the case of a branched alkenyl group, usually 3 to 30), and preferably 2 to 20 (in the case of a branched alkenyl group, 3 to 20). The number of carbon atoms of the cycloalkenyl group as the substituent which the polycyclic aromatic compound may have is usually 3 to 30, preferably 3 to 20. Here, the above-described number of carbon atoms does not include the number of carbon atoms of a substituent.

The alkenyl group includes, for example, a vinyl group, a 1-propenyl group, a 2-propenyl group, a 1-hexenyl group, a 1-dodecenyl group, a 1-hexadecenyl group and a 1-cyclohexenyl group.

The alkenyl group may have a substituent, and the substituent includes, for example, an aryl group, a halogen atom and a silyl group. The cycloalkenyl group may have a substituent, and the substituent includes, for example, an aryl group, a halogen atom and a silyl group.

The alkynyl group as the substituent which the polycyclic aromatic compound may have may be any of a linear alkynyl group or a branched alkynyl group. The number of carbon atoms of the alkynyl group is usually 2 to 30 (in the case of a branched alkynyl group, usually 4 to 30), and preferably 2 to 20 (in the case of a branched alkynyl group, 4 to 20). The number of carbon atoms of the cycloalkynyl group as the substituent which the polycyclic aromatic compound may have is usually 6 to 30, preferably 6 to 20. Here, the above-described number of carbon atoms does not include the number of carbon atoms of a substituent.

The alkynyl group includes, for example, an ethynyl group, a 1-propynyl group, a 1-hexynyl group, a 1-dodecynyl group and a 1-hexadecynyl group.

The alkynyl group may have a substituent, and the substituent includes, for example, an aryl group, a halogen atom and a silyl group. The cycloalkynyl group may have a substituent, and the substituent includes an aryl group, a halogen atom and a silyl group.

The silyl group may have a substituent. The substituent which the silyl group may have includes, for example, an alkyl group, a cycloalkyl group and an aryl group. The silyl group having a substituent includes, for example, silyl groups having 3 to 18 carbon atoms such as a trimethylsilyl group, a triethylsilyl group, a triisopropylsilyl group, a tert-butyldimethylsilyl group, a phenylsilyl group, a triphenylsilyl group and the like.

The alkylcarbonyl group as the substituent which the polycyclic aromatic compound may have includes, for example, groups obtained by bonding of the above-described alkyl group and a carbonyl group. The cycloalkylcarbonyl group as the substituent which the polycyclic aromatic compound may have includes, for example, groups obtained by bonding of the above-described cycloalkyl group and a carbonyl group.

The alkylcarbonyl group includes, for example, linear alkylcarbonyl groups such as an acetyl group, a n-propanoyl group, a n-butanoyl group, a n-hexanoyl group, a n-octanoyl group, a n-dodecanoyl group, a n-hexadecanoyl group and the like, and branched alkylcarbonyl groups such as an isobutanoyl group, a sec-butanoyl group, a tert-butanoyl group, a 2-ethylhexanoyl group and the like. The cycloalkylcarbonyl group includes, for example, a cyclopentylcarbonyl group and a cyclohexylcarbonyl group.

The alkoxycarbonyl group as the substituent which the polycyclic aromatic compound may have includes, for example, groups obtained by bonding of the above-described alkoxy group and a carbonyl group. The cycloalkoxycarbonyl group as the substituent which the polycyclic aromatic compound may have includes, for example, groups obtained by bonding of the above-described cycloalkoxy group and a carbonyl group.

The alkoxycarbonyl group includes, for example, linear alkoxycarbonyl groups such as a methoxycarbonyl group, an ethoxycarbonyl group, a n-propyloxycarbonyl group, a n-butoxycarbonyl group, a n-hexyloxycarbonyl group, a n-octyloxycarbonyl group, a n-dodecyloxycarbonyl group, a n-hexadecyloxycarbonyl group and the like, and branched alkoxycarbonyl groups such as an isopropyloxycarbonyl group, an isobutyloxycarbonyl group, a sec-butyloxycarbonyl group, a tert-butyloxycarbonyl group, a 2-ethylhexyloxycarbonyl group and the like. The cycloalkoxycarbonyl group includes, for example, a cyclopentyloxycarbonyl group and a cyclohexyloxycarbonyl group.

The polycyclic aromatic compound as the low molecular weight compound having carrier transportability is preferably a low molecular weight compound represented by the formula (1), since an organic film transistor produced by using the film of the present invention is more excellent in electric field effect mobility.

[chemical formula 9]

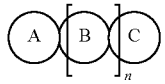

(1)

In the formula (1), n represents an integer of 1 or more. n is preferably an integer of 2 to 8, more preferably an integer of 2 to 6, further preferably an integer of 2 to 4, since an organic film transistor produced by using the film of the present invention is more excellent in electric field effect mobility.

In the formula (1), Ring A and Ring C each independently represent a benzene ring, a 5-membered heterocyclic ring or a 6-membered heterocyclic ring, and these rings may have a substituent. Ring A and Ring C are preferably a 5-membered heterocyclic ring or a benzene ring, more preferably a benzene ring, since an organic film transistor produced by using the film of the present invention is more excellent in electric field effect mobility.

The hetero atom which a 5-membered heterocyclic ring and a 6-membered heterocyclic ring have includes, for example, an oxygen atom, a sulfur atom, a fluorine atom, a nitrogen atom, a phosphorus atom and a silicon atom, and an oxygen atom, a sulfur atom, a nitrogen atom or a silicon atom is preferable and a sulfur atom is more preferable, since an organic film transistor produced by using the film of the present invention is more excellent in electric field effect mobility.

The 5-membered heterocyclic ring and the 6-membered heterocyclic ring include, for example, a furan ring, a thiophene ring, a selenophene ring, a pyrrole ring, an oxazole ring, a thiazole ring, an imidazole ring and a pyridine ring, and a furan ring, a thiophene ring or a thiazole ring is preferable, a thiophene ring or a thiazole ring is more preferable and a thiophene ring is further preferable, since an organic film transistor produced by using the film of the present invention is more excellent in electric field effect mobility.

The substituent which the benzene ring, the 5-membered heterocyclic ring and the 6-membered heterocyclic ring represented by Ring A and Ring C may have includes, for example, an alkyl group, a cycloalkyl group, an alkoxy group, a cycloalkoxy group, an alkylthio group, a cycloalkylthio group, an aryl group, a monovalent heterocyclic ring group, a halogen atom, a silyl group, an amino group, an alkenyl group, a cycloalkenyl group, an alkynyl group, a cycloalkynyl group, a hydroxyl group, a nitro group, a cyano group, a carboxyl group, an alkylcarbonyl group, a cycloalkylcarbonyl group, an alkoxycarbonyl group or a cycloalkoxycarbonyl group, and the definition and specific examples of these substituents are the same as the definition and specific examples of the alkyl group, the cycloalkyl group, the alkoxy group, the cycloalkoxy group, the alkylthio group, the cycloalkylthio group, the aryl group, the monovalent heterocyclic ring group, the halogen atom, the silyl group, the amino group, the alkenyl group, the cycloalkenyl group, the alkynyl group, the cycloalkynyl group, the alkylcarbonyl group, the cycloalkylcarbonyl group, the alkoxycarbonyl group and the cycloalkoxycarbonyl group as the substituent which the polycyclic aromatic compound may have described above.

In the formula (1), Ring B represents a benzene ring, a cyclopentadiene ring, a 5-membered heterocyclic ring or a 6-membered heterocyclic ring, and these rings may have a substituent. When there are a plurality of Rings B, they may be the same or different. The 5-membered heterocyclic ring and the 6-membered heterocyclic ring include, for example, a furan ring, a thiophene ring, a selenophene ring, a pyrrole ring, an oxazole ring, a thiazole ring, an imidazole ring and a pyridine ring. Ring B is preferably a cyclopentadiene ring, a benzene ring or a thiophene ring, more preferably a benzene ring or a thiophene ring, since an organic film transistor produced by using the film of the present invention is more excellent in electric field effect mobility.

The substituent which the benzene ring, the cyclopentadiene ring, the 5-membered heterocyclic ring and the 6-membered heterocyclic ring represented by Ring B may have includes, for example, an alkyl group, a cycloalkyl group, an alkoxy group, a cycloalkoxy group, an alkylthio group, a cycloalkylthio group, an aryl group, a monovalent heterocyclic ring group, a halogen atom, a silyl group, an amino group, an alkenyl group, a cycloalkenyl group, an alkynyl group, a cycloalkynyl group, a hydroxyl group, a nitro group, a cyano group, a carboxyl group, an alkylcarbonyl group, a cycloalkylcarbonyl group, an alkoxycarbonyl group or a cycloalkoxycarbonyl group, and the definition and specific examples of these substituents are the same as the definition and specific examples of the alkyl group, the cycloalkyl group, the alkoxy group, the cycloalkoxy group, the alkylthio group, the cycloalkylthio group, the aryl group, the monovalent heterocyclic ring group, the halogen atom, the silyl group, the amino group, the alkenyl group, the cycloalkenyl group, the alkynyl group, the cycloalkynyl group, the alkylcarbonyl group, the cycloalkylcarbonyl group, the alkoxycarbonyl group and the cycloalkoxycarbonyl group as the substituent which the polycyclic aromatic compound may have described above.

It is preferable that at least one ring among Ring A, Ring B and Ring C is a thiophene ring, since an organic film transistor produced by using the film of the present invention is more excellent in electric field effect mobility.

The low molecular weight compound represented by the formula (1) is preferably a low molecular weight compound represented by the formula (1-1) to the formula (1-14), more preferably a low molecular weight compound represented by the formula (1-1), the formula (1-4), the formula (1-5), the formula (1-6), the formula (1-9), the formula (1-11) or the formula (1-12), further preferably a low molecular weight compound represented by the formula (1-4), the formula (1-6), the formula (1-9), the formula (1-11), the formula (1-12), the formula (1-13) or the formula (1-14), particularly preferably a low molecular weight compound represented by the formula (1-4) or the formula (1-6), since an organic film transistor produced by using the film of the present invention is more excellent in electric field effect mobility.

[chemical formula 10]

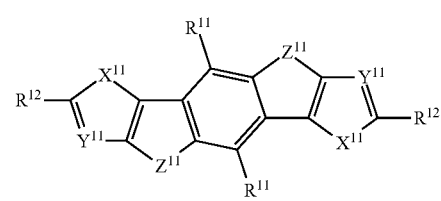

(1-1)

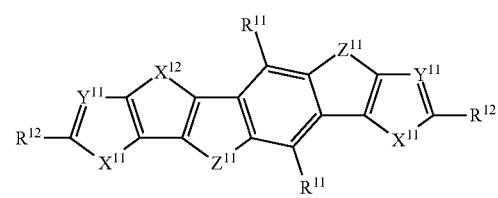

(1-2)

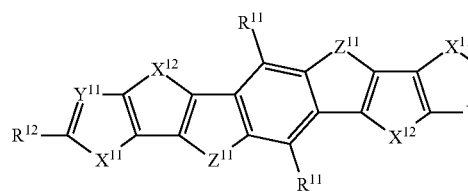

(1-3)

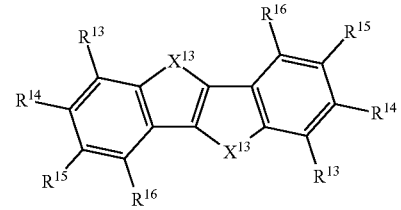

(1-4)

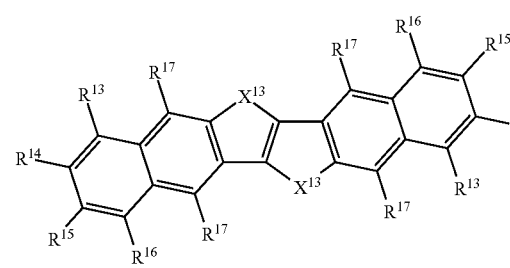

(1-5)

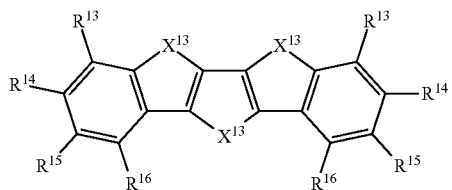

(1-6)

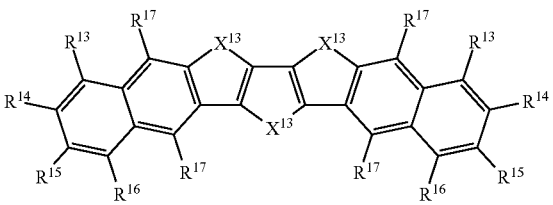

(1-7)

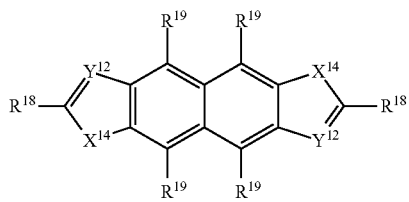

(1-8)

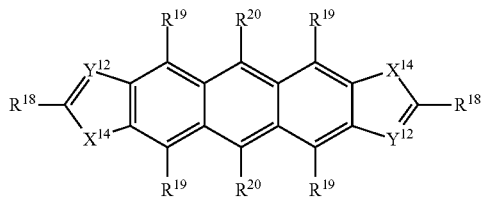

(1-9)

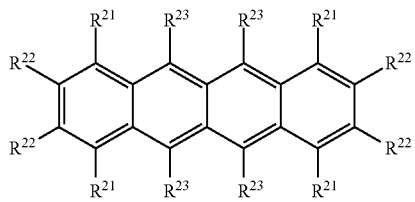

(1-10)

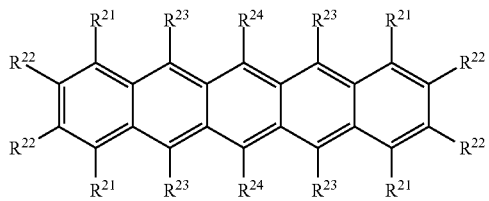

(1-11)

[chemical formula 11]

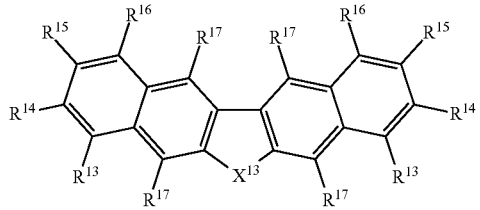

(1-12)

(1-13)

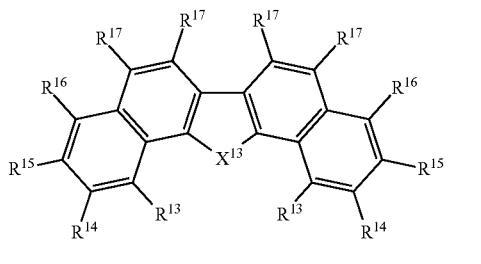

(1-14)

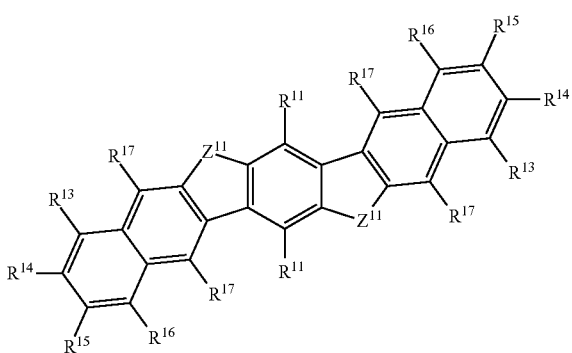

In the formula (1-1) to the formula (1-14), $Z^{11}$ represents a group represented by the formula (Z-1), a group represented by the formula (Z-2), a group represented by the formula (Z-3), a group represented by the formula (Z-4) or a group represented by the formula (Z-5). A plurality of $Z^{11}$ may be mutually the same or different.

[chemical formula 12]

(Z-1)

(Z-2)

(Z-3)

(Z-4)

(Z-5)

In the formula (Z-1) to the formula (Z-5), $R^1$ represents an alkyl group, a cycloalkyl group, an alkoxy group, a cycloalkoxy group, an alkylthio group, a cycloalkylthio group, an aryl group or a monovalent heterocyclic ring group, and these groups may have a substituent.

The definition and specific examples of the alkyl group, the cycloalkyl group, the alkoxy group, the cycloalkoxy group, the alkylthio group, the cycloalkylthio group, the aryl group and the monovalent heterocyclic ring group are the same as the definition and specific examples of the alkyl group, the cycloalkyl group, the alkoxy group, the cycloalkoxy group, the alkylthio group, the cycloalkylthio group, the aryl group and the monovalent heterocyclic ring group as the substituent which the polycyclic aromatic compound may have described above.

$R^1$ is preferably an alkyl group, a cycloalkyl group or an aryl group, since an organic film transistor produced by using the film of the present invention is more excellent in electric field effect mobility.

$Z^{11}$ is preferably a group represented by the formula (Z-1) or the formula (Z-2), more preferably a group represented by the formula (Z-1), since an organic film transistor produced by using the film of the present invention is more excellent in electric field effect mobility.

In the formula (1-1) to the formula (1-14), $X^{11}$, $X^{12}$, $X^{13}$ and $X^{14}$ each independently represent an oxygen atom, a sulfur atom or a selenium atom. A plurality of $X^{11}$, $X^{13}$ and $X^{14}$ each may be mutually the same or different. When there are a plurality of $X^{12}$, they may be the same or different.

It is preferable that $X^{11}$, $X^{12}$, $X^{13}$ and $X^{14}$ are a sulfur atom, since an organic film transistor produced by using the film of the present invention is more excellent in electric field effect mobility.

In the formula (1-1) to the formula (1-14), $Y^{11}$ and $Y^{12}$ each independently represent a nitrogen atom or a group represented by —$CR^2$=. $R^2$ represents a hydrogen atom, an alkyl group, a cycloalkyl group, an alkoxy group, a cycloalkoxy group, an alkylthio group, a cycloalkylthio group, an aryl group, a monovalent heterocyclic ring group or a halogen atom. A plurality of $Y^{11}$ and $Y^{12}$ each may be mutually the same or different.

The definition and specific examples of the alkyl group, the cycloalkyl group, the alkoxy group, the cycloalkoxy group, the alkylthio group, the cycloalkylthio group, the aryl group and the monovalent heterocyclic ring group are the same as the definition and specific examples of the alkyl group, the cycloalkyl group, the alkoxy group, the cycloalkoxy group, the alkylthio group, the cycloalkylthio group, the aryl group and the monovalent heterocyclic ring group as the substituent which the polycyclic aromatic compound may have described above.

$R^2$ is preferably a hydrogen atom, an alkyl group, a cycloalkyl group, an alkoxy group, a cycloalkoxy group or a halogen atom, more preferably a hydrogen atom, an alkyl group, a cycloalkyl group or a halogen atom, since synthesis of the low molecular weight compound contained in the film of the present invention is easy.

$Y^{11}$ and $Y^{12}$ are preferably a group represented by —$CR^2$=, more preferably a group represented by —CH=, since synthesis of the low molecular weight compound contained in the film of the present invention is easy.

In the formula (1-1) to the formula (1-14), $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$ and $R^{24}$ each independently represent a hydrogen atom, an alkyl group, a cycloalkyl group, an alkoxy group, a cycloalkoxy group, an alkylthio group, a cycloalkylthio group, an aryl group, an alkynyl group, a monovalent heterocyclic ring group or a halogen atom. A plurality of $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$ and $R^{24}$ each may be mutually the same or different. Of these groups, the alkyl group, the cycloalkyl group, the alkoxy group, the cycloalkoxy group, the alkylthio group, the cycloalkylthio group, the aryl group, the alkynyl group and the monovalent heterocyclic ring group each may have a substituent.

The definition and specific examples of the alkyl group, the cycloalkyl group, the alkoxy group, the cycloalkoxy group, the alkylthio group, the cycloalkylthio group, the aryl group, the alkynyl group and the monovalent heterocyclic ring group are the same as the definition and specific examples of the alkyl group, the cycloalkyl group, the alkoxy group, the cycloalkoxy group, the alkylthio group, the cycloalkylthio group, the aryl group, the alkynyl group and the monovalent heterocyclic ring group as the substituent which the polycyclic aromatic compound may have described above.

The low molecular weight compound represented by the formula (1) (may also be a low molecular weight compound represented by the formula (1-1) to the formula (1-14)) includes, for example, low molecular weight compounds represented by the formula (1-101) to the formula (1-127), and is preferably a low molecular weight compound represented by the formula (1-102), the formula (1-107), the formula (1-108), the formula (1-109), the formula (1-110), the formula (1-111), the formula (1-114), the formula (1-118), the formula (1-120), the formula (1-121) or the formula (1-122), more preferably a low molecular weight compound represented by the formula (1-107), the formula (1-108), the formula (1-111) or the formula (1-118), further preferably a low molecular weight compound represented by the formula (1-107), the formula (1-108) or the formula (1-111), since an organic film transistor produced by using the film of the present invention is more excellent in electric field effect mobility.

[chemical formula 13]

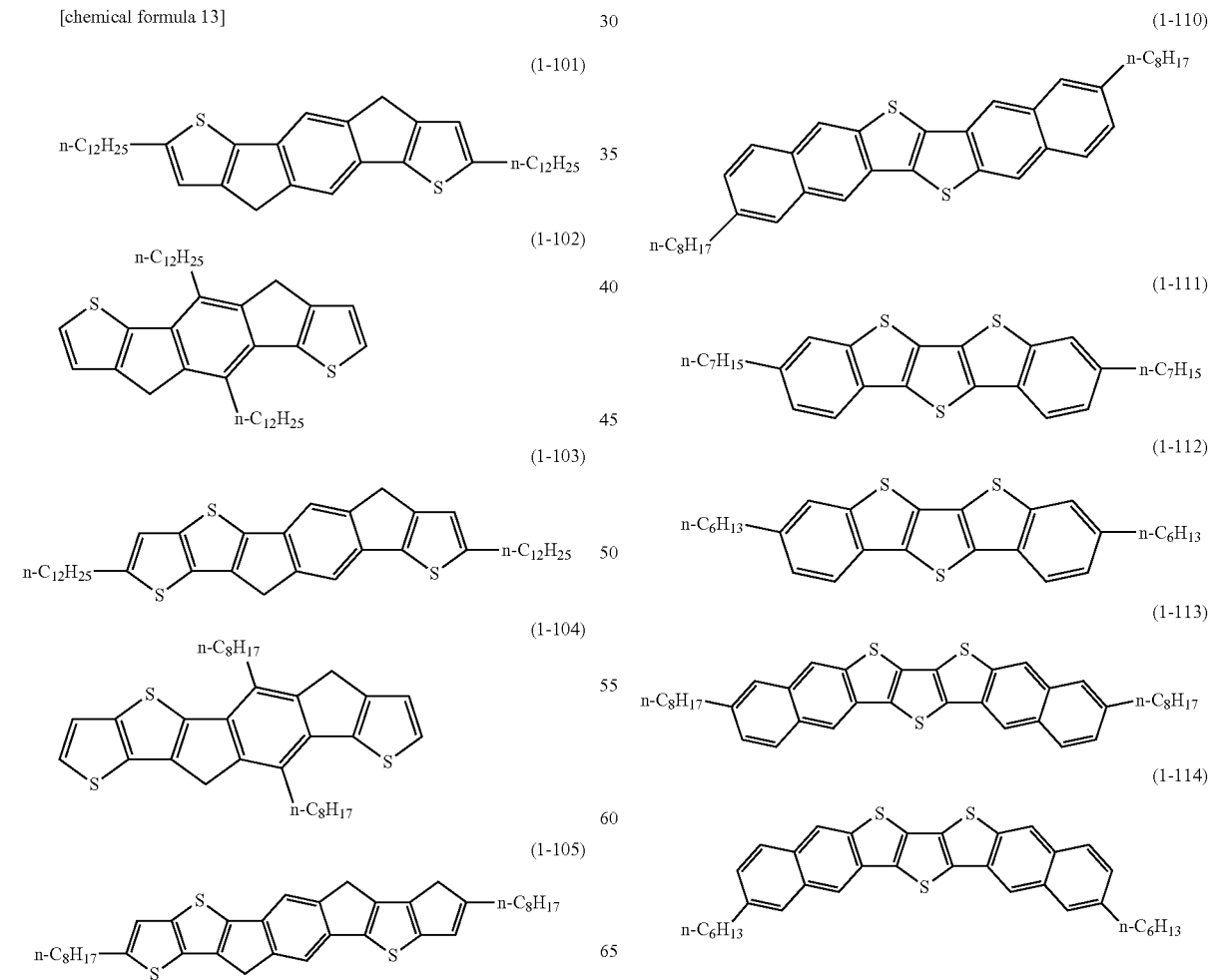
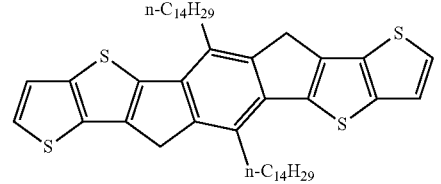
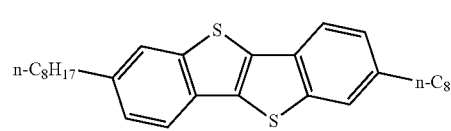
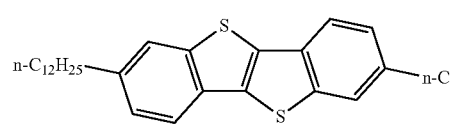
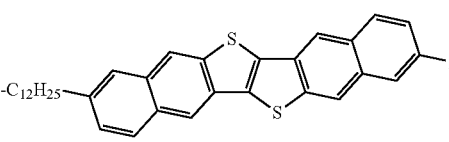
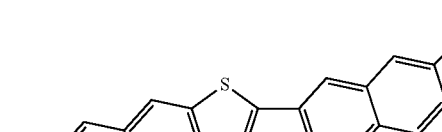
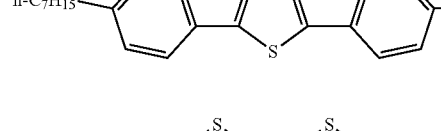
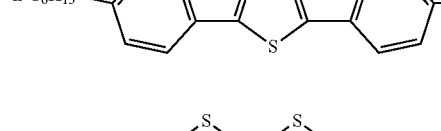
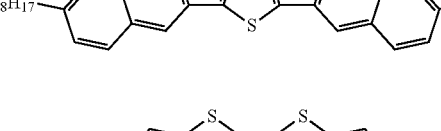
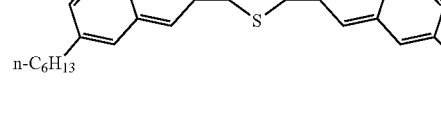

[chemical formula 14]
(1-115)
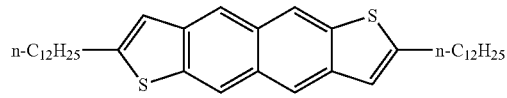
(1-116)
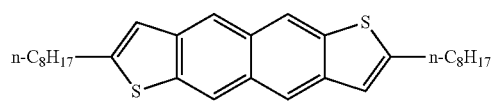
(1-117)
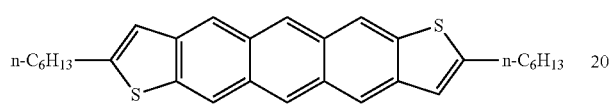
(1-118)
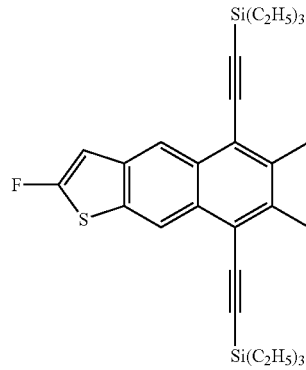
(1-119)
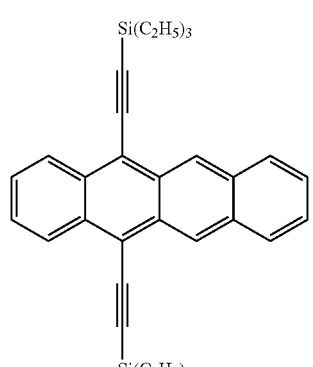
(1-120)
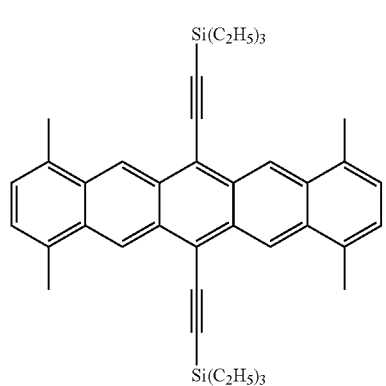
(1-121)
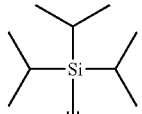
[chemical formula 15]
(1-122)
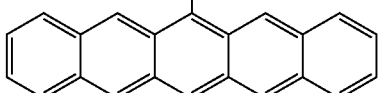
(1-123)
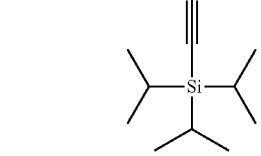
(1-124)
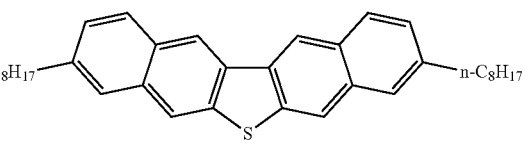
(1-125)
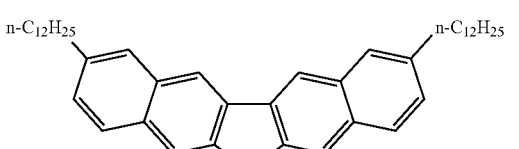
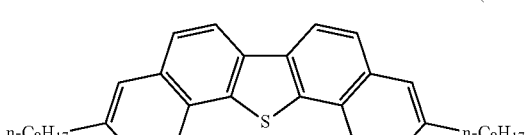
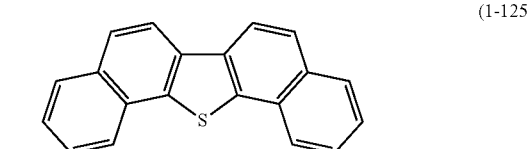
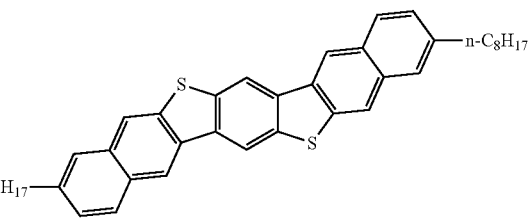

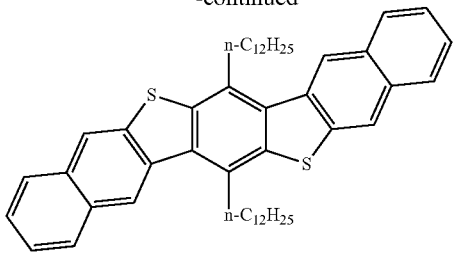

The low molecular weight compound represented by the formula (1) can be synthesized, for example, according to methods described in JP-A No. 2009-267372, JP-A No. 2012-39103, JP-A No. 2009-209134 and Japanese Patent Application National Publication No. 2013-501076.

<Polymer Compound>

The polymer compound contained in the film of the present invention includes, for example, poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, poly acrylate, polymethyl acrylate, polymethyl methacrylate, polyvinyl chloride, polysiloxane, polystyrene and derivatives thereof, polymethyl methacrylate and derivatives thereof, and a polymer compound having a n conjugated structure. Of them, a polymer compound having a n conjugated structure is preferable as the polymer compound, since an organic film transistor produced by using the film of the present invention is more excellent in electric field effect mobility.

The polymer compound having a n conjugated structure includes polymer compounds containing, for example, fluorene, triphenylamine, thiophene, dithiophene, thienothiophene, naphthalene, anthracene, tetracene, rubrene, pentacene, benzopentacene, dibenzopentacene, tetrabenzopentacene, naphthopentacene, hexacene, heptacene, nanoasen, fluoranthene, phenanthrene, chrysene, triphenylene, tetraphene, picene, furumiren, tetraphene, pyrene, anthanthrene, peropyrene, coronene, benzocoronene, dibenzocoronene, hexabenzocoronene, benzodicoronene, perylene, terrylene, diperylene, quaterrylene, trinaphthylene, heptaphene, ovalene, rubicene, violanthrone, isoviolanthrone, circamanthracene, bisanthene, zethrene, heptazethrene, pyranth, kekulene, truxene or a derivative thereof, as a structural unit.

The polymer compound having a n-conjugated structure is preferably a polymer compound containing a structural unit represented by the formula (2) (hereinafter, referred to as "first structural unit" in some cases), since an organic film transistor produced by using the film of the present invention is more excellent in electric field effect mobility. The first structural unit may be contained only singly in the polymer compound or two or more of the first structural units may be contained in the polymer compound. The polymer compound containing the first structural unit is preferably a conjugated polymer compound.

[chemical formula 16]

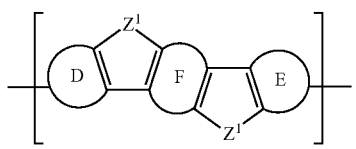

(2)

In the formula (2), Ring D and Ring E each independently represent a heterocyclic ring, and this heterocyclic ring may have a substituent. The heterocyclic ring has a number of carbon atoms of preferably 2 to 30, more preferably 2 to 14, further preferably 3 to 10. Here, the above-described number of carbon atoms does not include the number of carbon atoms of a substituent.

The heterocyclic ring includes, for example, a furan ring, a thiophene ring, a selenophene ring, a pyrrole ring, an oxazole ring, a thiazole ring, an imidazole ring, a pyridine ring, a benzofuran ring, a benzothiophene ring, a thienothiophene ring and a 2,1,3-benzothiadiazole ring.

The substituent which the heterocyclic ring may have includes, for example, an alkyl group, a cycloalkyl group, an alkoxy group, a cycloalkoxy group, an alkylthio group, a cycloalkylthio group, an aryl group, a monovalent heterocyclic ring group, a halogen atom, a silyl group, an amino group, an alkenyl group, a cycloalkenyl group, an alkynyl group, a cycloalkynyl group, a hydroxyl group, a nitro group, a cyano group, a carboxyl group, an alkylcarbonyl group, a cycloalkylcarbonyl group, an alkoxycarbonyl group and a cycloalkoxycarbonyl group. The definition and specific examples of the alkyl group, the cycloalkyl group, the alkoxy group, the cycloalkoxy group, the alkylthio group, the cycloalkylthio group, the aryl group, the monovalent heterocyclic group, the halogen atom, the silyl group, the amino group, the alkenyl group, the cycloalkenyl group, the alkynyl group, the cycloalkynyl group, the hydroxyl group, the nitro group, the cyano group, the carboxyl group, the alkylcarbonyl group, the cycloalkylcarbonyl group, the alkoxylcarbonyl group and the cycloalkoxylcarbonyl group are the same as the definition and specific examples of the alkyl group, the cycloalkyl group, the alkoxy group, the cycloalkoxy group, the alkylthio group, the cycloalkylthio group, the aryl group, the monovalent heterocyclic group, the halogen atom, the silyl group, the amino group, the alkenyl group, the cycloalkenyl group, the alkynyl group, the cycloalkynyl group, the hydroxyl group, the nitro group, the cyano group, the carboxyl group, the alkylcarbonyl group, the cycloalkylcarbonyl group, the alkoxylcarbonyl group and the cycloalkoxylcarbonyl group as the substituent which the polycyclic aromatic compound may have described above.

It is preferable that Ring D and Ring E are the same heterocyclic ring, since synthesis of the polymer compound contained in the film of the present invention is easy.

Ring D and Ring E are preferably constituted of a 5-membered and/or a 6-membered heterocyclic ring, more preferably constituted only of a 5-membered heterocyclic ring, further preferably a 5-membered heterocyclic ring, since an organic film transistor produced by using the film of the present invention is more excellent in electric field effect mobility.

In the formula (2), Ring F represents an aromatic hydrocarbon ring or a heterocyclic ring, and these rings may have a substituent.

The aromatic hydrocarbon ring represented by Ring F has a number of carbon atoms of preferably 6 to 30, more preferably 6 to 24, further preferably 6 to 18. Here, the above-described number of carbon atoms does not include the number of carbon atoms of a substituent.

The aromatic hydrocarbon ring includes, for example, a benzene ring, a naphthalene ring, an anthracene ring, a pyrene ring and a fluorene ring.

The heterocyclic ring represented by Ring F has a number of carbon atoms of preferably 2 to 30, more preferably 2 to 14, further preferably 3 to 10. Here, the above-described number of carbon atoms does not include the number of carbon atoms of a substituent.

The heterocyclic ring includes, for example, a furan ring, a thiophene ring, a selenophene ring, a pyrrole ring, an oxazole ring, a thiazole ring, an imidazole ring, a pyridine ring, a benzofuran ring, a benzothiophene ring, a thienothiophene ring and a 2,1,3-benzothiadiazole ring.

The substituent which the heterocyclic ring may have includes, for example, an alkyl group, a cycloalkyl group, an alkoxy group, a cycloalkoxy group, an alkylthio group, a cycloalkylthio group, an aryl group, a monovalent heterocyclic ring group, a halogen atom, a silyl group, an amino group, an alkenyl group, a cycloalkenyl group, an alkynyl group, a cycloalkynyl group, a hydroxyl group, a nitro group, a cyano group, a carboxyl group, an alkylcarbonyl group, a cycloalkylcarbonyl group, an alkoxycarbonyl group and a cycloalkoxycarbonyl group.

The definition and specific examples of the alkyl group, the cycloalkyl group, the alkoxy group, the cycloalkoxy group, the alkylthio group, the cycloalkylthio group, the aryl group, the monovalent heterocyclic ring group, the halogen atom, the silyl group, the amino group, the alkenyl group, the cycloalkenyl group, the alkynyl group, the cycloalkynyl group, the alkylcarbonyl group, the cycloalkylcarbonyl group, the alkoxycarbonyl group and the cycloalkoxycarbonyl group are the same as the definition and specific examples of the alkyl group, the cycloalkyl group, the alkoxy group, the cycloalkoxy group, the alkylthio group, the cycloalkylthio group, the aryl group, the monovalent heterocyclic ring group, the halogen atom, the silyl group, the amino group, the alkenyl group, the cycloalkenyl group, the alkynyl group, the cycloalkynyl group, the alkylcarbonyl group, the cycloalkylcarbonyl group, the alkoxycarbonyl group and the cycloalkoxycarbonyl group as the substituent which the polycyclic aromatic compound may have described above.

Ring F is preferably an aromatic hydrocarbon ring, more preferably a benzene ring or a naphthalene ring, since an organic film transistor produced by using the film of the present invention is more excellent in electric field effect mobility, and these rings may have a substituent.

Ring F preferably has an alkyl group, a cycloalkyl group, an alkoxy group, a cycloalkoxy group, an alkylthio group, a cycloalkylthio group, an amino group or a hydroxyl group, more preferably has an alkyl group, a cycloalkyl group, an alkoxy group or a cycloalkoxy group, further preferably has an alkoxy group or a cycloalkoxy group.

In the formula (2), Z represents a group represented by the formula (Z-1'), a group represented by the formula (Z-2'), a group represented by the formula (Z-3'), a group represented by the formula (Z-4') or a group represented by the formula (Z-5'). A plurality of $Z^1$ may be mutually the same or different.

[chemical formula 17]

(Z-1')

(Z-2')

-continued

(Z-3')

(Z-4')

(Z-5')

In the formula (Z-1') to the formula (Z-5'), $R^{1'}$ represents an alkyl group, a cycloalkyl group, an alkoxy group, a cycloalkoxy group, an alkylthio group, a cycloalkylthio group, an aryl group or a monovalent heterocyclic ring group, and these groups may have a substituent.

The definition and specific examples of the alkyl group, the cycloalkyl group, the alkoxy group, the cycloalkoxy group, the alkylthio group, the cycloalkylthio group, the aryl group and the monovalent heterocyclic ring group are the same as the definition and specific examples of the alkyl group, the cycloalkyl group, the alkoxy group, the cycloalkoxy group, the alkylthio group, the cycloalkylthio group, the aryl group and the monovalent heterocyclic ring group as the substituent which the polycyclic aromatic compound may have described above.

$R^{1'}$ is preferably an alkyl group, a cycloalkyl group or an aryl group, since an organic film transistor produced by using the film of the present invention is more excellent in electric field effect mobility.

$Z^1$ is preferably a group represented by the formula (Z-1') or the formula (Z-2'), more preferably a group represented by the formula (Z-1'), since an organic film transistor produced by using the film of the present invention is more excellent in electric field effect mobility.

The structural unit represented by the formula (2) is preferably a structural unit represented by the formula (2-1), a structural unit represented by the formula (2-2) or a structural unit represented by the formula (2-3), more preferably a structural unit represented by the formula (2-1), since an organic film transistor produced by using the film of the present invention is more excellent in electric field effect mobility.

[chemical formula 18]

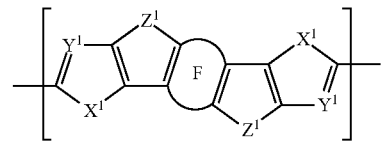
(2-1)

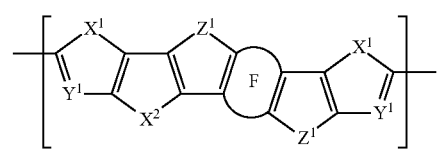
(2-2)

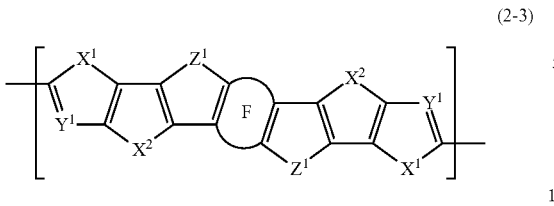
(2-3)

In the formula (2-1) to the formula (2-3), $X^1$ and $X^2$ each independently represent an oxygen atom, a sulfur atom or a selenium atom. A plurality of $X^1$ may be mutually the same or different. When there are a plurality of $X^2$, they may be the same or different.

$X^1$ and $X^2$ are preferably a sulfur atom, since an organic film transistor produced by using the film of the present invention is more excellent in electric field effect mobility.

In the formula (2-1) to the formula (2-3), $Y^1$ represents a nitrogen atom or a group represented by $-CR^{2'}=$. $R^{2'}$ represents a hydrogen atom, an alkyl group, a cycloalkyl group, an alkoxy group, a cycloalkoxy group, an alkylthio group, a cycloalkylthio group, an aryl group, a monovalent heterocyclic ring group or a halogen atom. A plurality of $Y^1$ may be mutually the same or different.

The definition and specific examples of the alkyl group, the cycloalkyl group, the alkoxy group, the cycloalkoxy group, the alkylthio group, the cycloalkylthio group, the aryl group and the monovalent heterocyclic ring group are the same as the definition and specific examples of the alkyl group, the cycloalkyl group, the alkoxy group, the cycloalkoxy group, the alkylthio group, the cycloalkylthio group, the aryl group and the monovalent heterocyclic ring group as the substituent which the polycyclic aromatic compound may have described above.

$R^{2'}$ is preferably a hydrogen atom, an alkyl group, a cycloalkyl group, an alkoxy group, a cycloalkoxy group or a halogen atom, more preferably a hydrogen atom, an alkyl group, a cycloalkyl group or a halogen atom, since synthesis of the low molecular weight compound contained in the film of the present invention is easy.

$Y^1$ is preferably a group represented by $-CR^{2'}=$, more preferably a group represented by $-CH=$, since synthesis of the polymer compound contained in the film of the present invention is easy.

The structural unit represented by the formula (2) (may also be a structural unit represented by the formula (2-1) to the formula (2-3)) includes, for example, structural units represented by the formula (2-11-1) to the formula (2-11-10), the formula (2-12-1) to the formula (2-12-10) and the formula (2-13-1) to the formula (2-13-10).

The structural unit represented by the formula (2) is preferably a structural unit represented by the formula (2-11-1), the formula (2-11-2), the formula (2-11-3), the formula (2-12-1), the formula (2-12-3), the formula (2-12-5), the formula (2-13-1), the formula (2-13-3) or the formula (2-13-5), more preferably a structural unit represented by the formula (2-11-1), the formula (2-11-2), the formula (2-11-3), the formula (2-12-1), the formula (2-12-3), the formula (2-13-1) or the formula (2-13-3), further preferably a structural unit represented by the formula (2-11-1), the formula (2-11-2) or the formula (2-11-3), since an organic film transistor produced by using the film of the present invention is more excellent in electric field effect mobility.

[chemical formula 19]

(2-11-1)

(2-11-2)

(2-11-3)

(2-11-4)

(2-11-5)

(2-11-6)

(2-11-7)

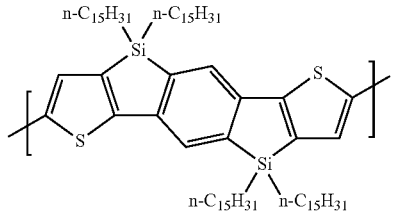

-continued
(2-11-8)
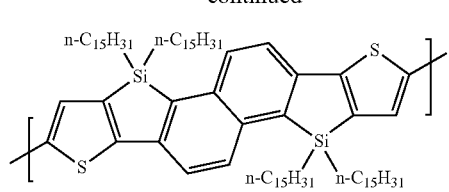
(2-11-9)
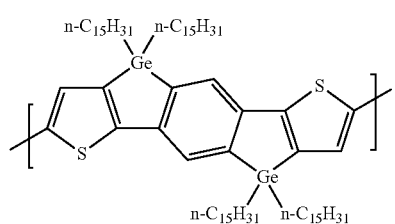
(2-11-10)
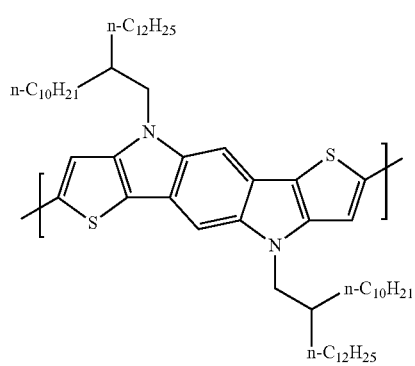
[chemical formula 20]
(2-12-1)
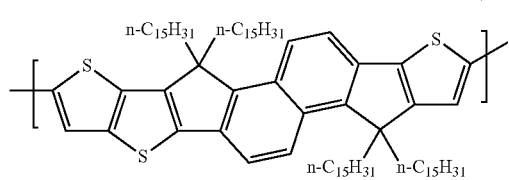
(2-12-2)
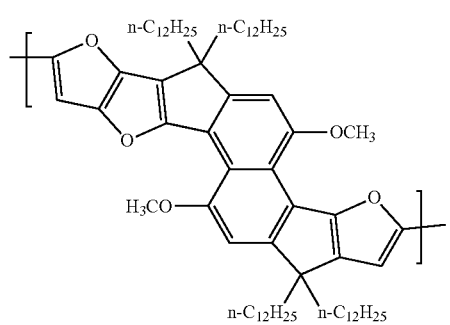
(2-12-3)
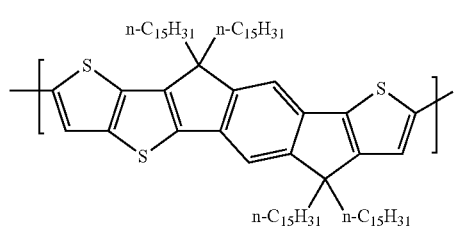
-continued
(2-12-4)
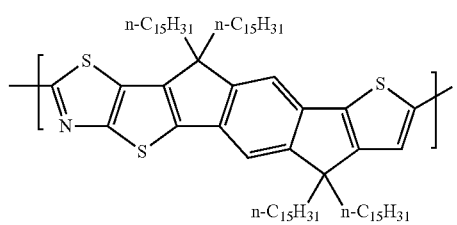
(2-12-5)
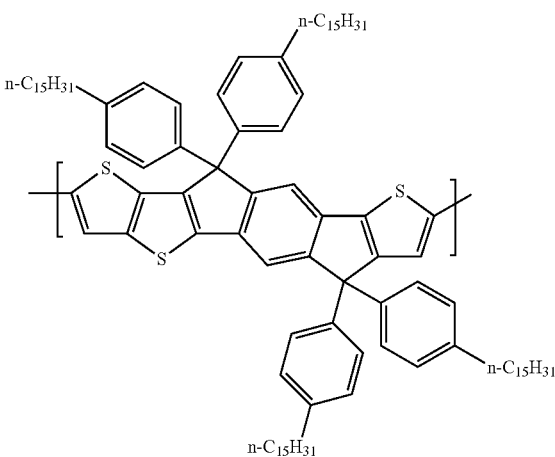
(2-12-6)
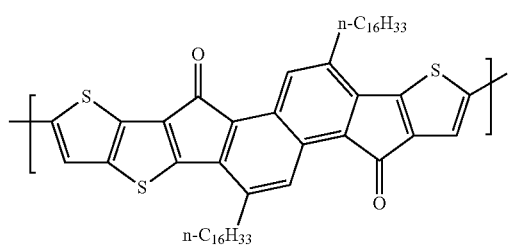
(2-12-7)
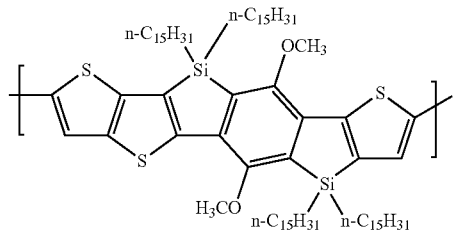
(2-12-8)
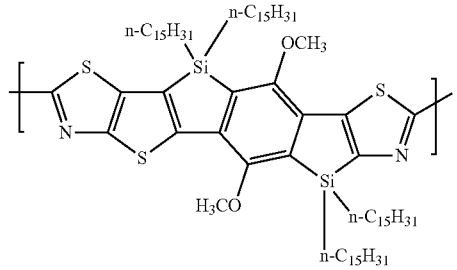

(2-12-9)
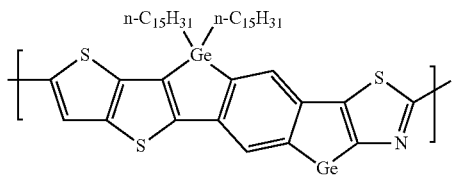
(2-12-10)
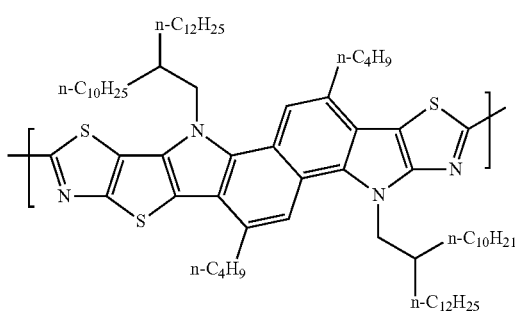
[chemical formula 21]
(2-13-1)
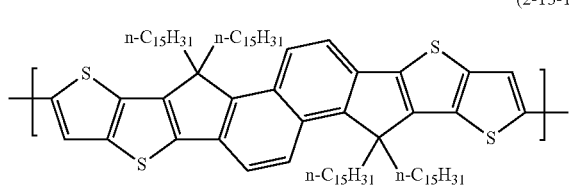
(2-13-2)
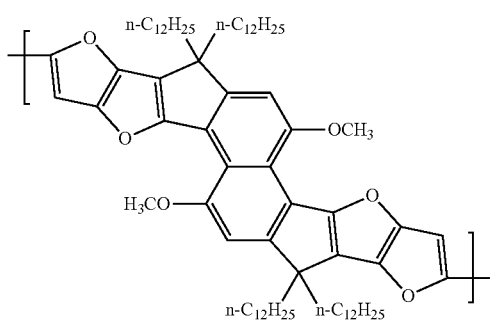
(2-13-3)
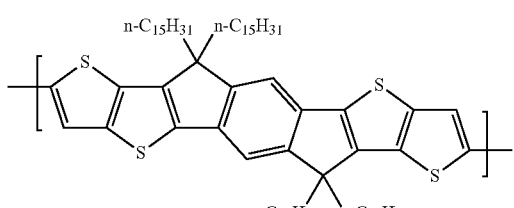
(2-13-4)
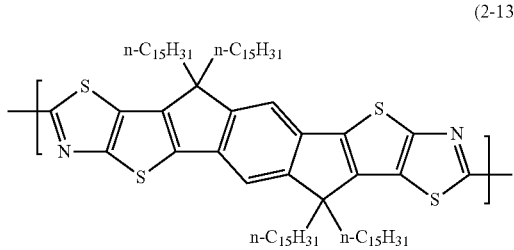
(2-13-5)
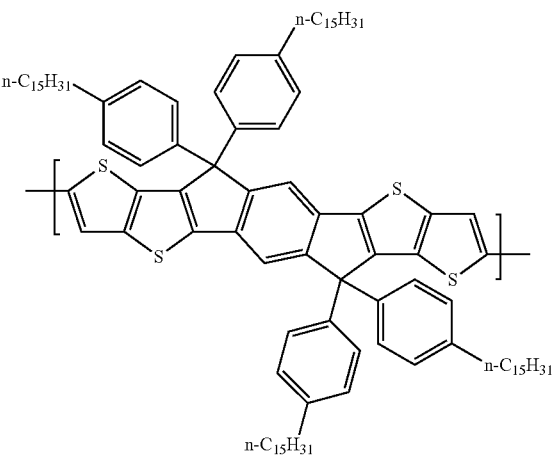
(2-13-6)
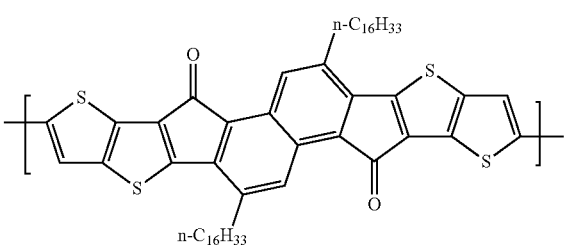
(2-13-7)
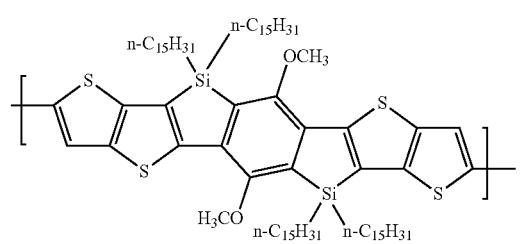
(2-13-8)
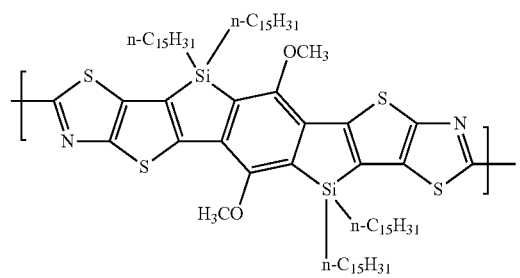
(2-13-9)
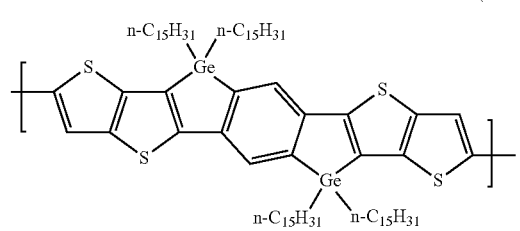

-continued (2-13-10)

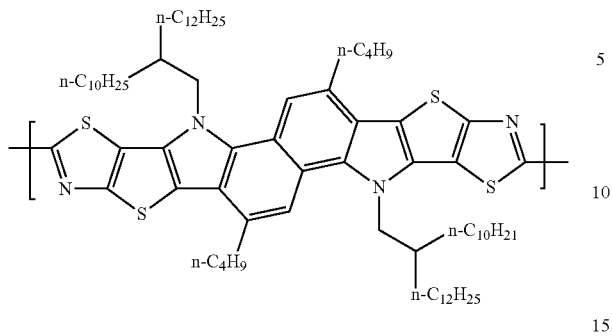

(Second Structural Unit)

It is preferable that the polymer compound contained in the film of the present invention further contains a structural unit represented by the formula (3) (different from the structural unit represented by the above-described formula (2)) (hereinafter, referred to as "second structural unit" in some cases), in addition to the structural unit represented by the formula (2).

[chemical formula 22]

—[Ar]— (3)

In the formula (3), Ar represents an arylene group or a divalent heterocyclic ring group, and these groups may have a substituent.

When the polymer compound of the present invention contains the second structural unit, it is preferable that a structural unit represented by the formula (2) (may also be a structural unit represented by the formula (2-1) to the formula (2-3)) and a structural unit represented by the formula (3) are conjugated.

In the present specification, conjugated denotes a state in which unsaturated bonds and single bonds range alternately and bonding electrons are present without localization, in the structure of the molecule. Here, the unsaturated bond denotes a double bond or a triple bond.

The arylene group is an atomic group remaining after removing from an aromatic hydrocarbon which may have a substituent two hydrogen atoms linking directly to carbon atoms constituting the ring, and includes preferably a group having a condensed ring, a group obtained by directly bonding two or more moieties selected from the group consisting of an independent benzene ring and condensed rings, and a group obtained by bonding two or more moieties selected from the group consisting of an independent benzene ring and condensed rings via vinylene or the like. Here, the above-described number of carbon atoms does not include the number of carbon atoms of a substituent.

The arylene group may have a substituent, and the substituent includes, for example, an alkyl group, a cycloalkyl group, an alkoxy group, a cycloalkoxy group, an alkylthio group, a cycloalkylthio group, a monovalent heterocyclic ring group and a halogen atom. The definition and specific examples of these substituents are the same as the definition and specific examples of the alkyl group, the cycloalkyl group, the alkoxy group, the cycloalkoxy group, the alkylthio group, the cycloalkylthio group, the monovalent heterocyclic ring group and the halogen atom as the substituent which the polycyclic aromatic compound may have described above.

The arylene group includes, for example, arylene groups represented by the following formulae 1 to 12.

[chemical formula 23]

1

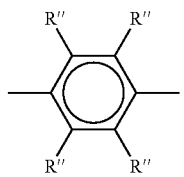

2

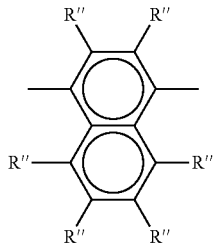

3

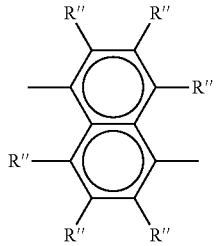

4

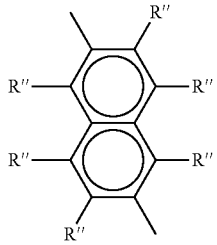

5

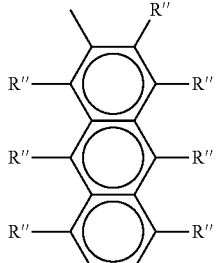

6

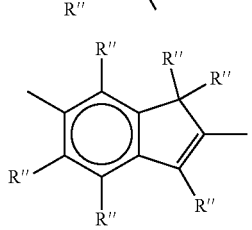

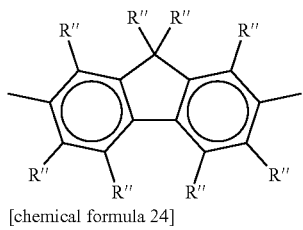

[chemical formula 24]

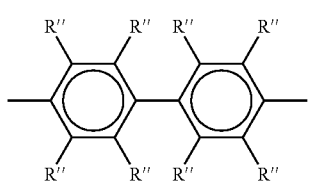

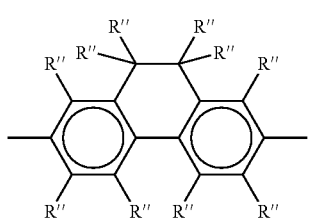

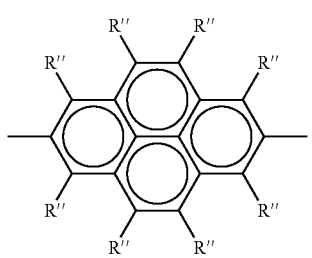

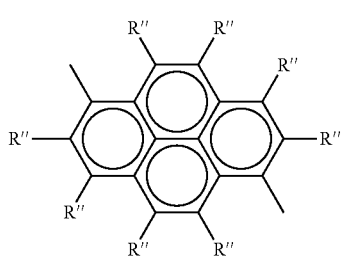

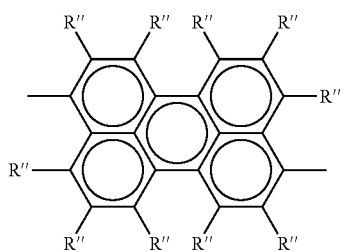

In the formulae 1 to 12, R″ represents a hydrogen atom, an alkyl group, a cycloalkyl group, an alkoxy group, a cycloalkoxy group, an alkylthio group, a cycloalkylthio group, an aryl group, a monovalent heterocyclic ring group or a halogen atom. A plurality of R″ may be the same or different.

The definition and specific examples of the alkyl group, the cycloalkyl group, the alkoxy group, the cycloalkoxy group, the alkylthio group, the cycloalkylthio group, the aryl group, the monovalent heterocyclic ring group and the halogen atom are the same as the definition and specific examples of the alkyl group, the cycloalkyl group, the alkoxy group, the cycloalkoxy group, the alkylthio group, the cycloalkylthio group, the aryl group, the monovalent heterocyclic ring group and the halogen atom as the substituent which the polycyclic aromatic compound may have described above.

The divalent heterocyclic ring group is an atomic group remaining after removing from a heterocyclic compound which may have a substituent two hydrogen atoms linking directly to carbon atoms or hetero atoms constituting the ring, and includes a group having a condensed ring, and a group obtained by directly bonding two or more moieties selected from the group consisting of independent heterocyclic rings and condensed rings. The number of carbon atoms of the divalent heterocyclic ring group is usually 2 to 30, preferably 3 to 20. Here, the above-described number of carbon atoms does not include the number of carbon atoms of a substituent. The divalent heterocyclic ring group is preferably a divalent aromatic heterocyclic ring group.

The divalent heterocyclic ring group may have a substituent, and the substituent includes, for example, an alkyl group, a cycloalkyl group, an alkoxy group, a cycloalkoxy group, an alkylthio group, a cycloalkylthio group, an aryl group and a halogen atom. The definition and specific examples of these substituents are the same as the definition and specific examples of the alkyl group, the cycloalkyl group, the alkoxy group, the cycloalkoxy group, the alkylthio group, the cycloalkylthio group, the aryl group and the halogen atom as the substituent which the polycyclic aromatic compound may have described above.

The divalent heterocyclic ring group includes, for example, divalent heterocyclic ring groups represented by the following formulae 13 to 64.

[chemical formula 25]

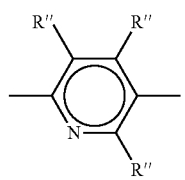

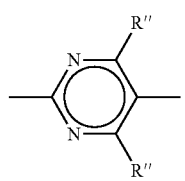

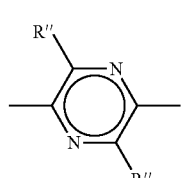

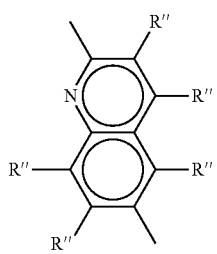
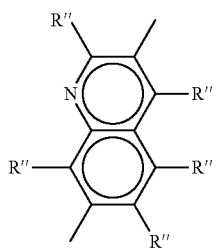
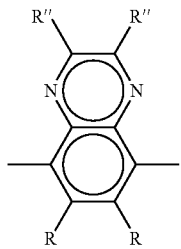
[chemical formula 26]
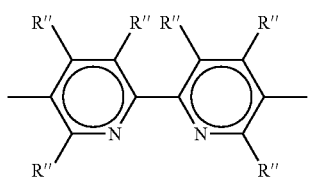
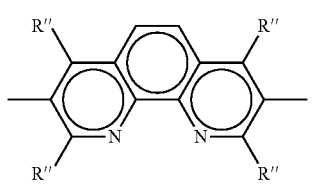
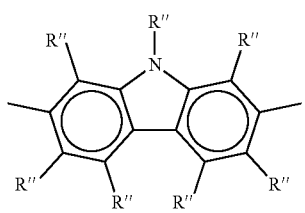
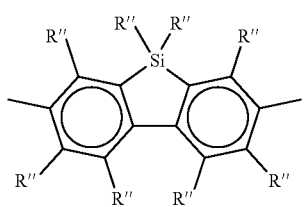
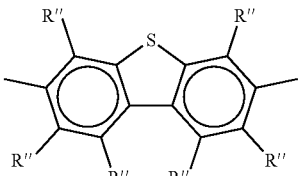
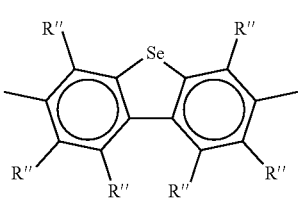
[chemical formula 27]
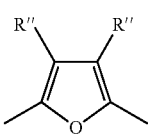
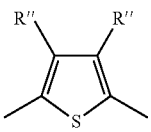
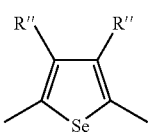
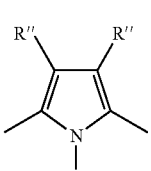
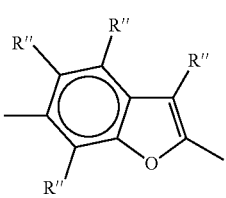
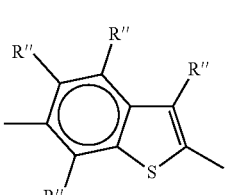
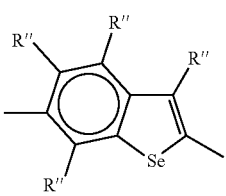

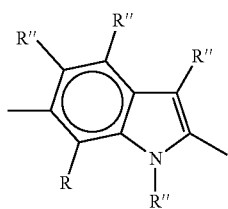
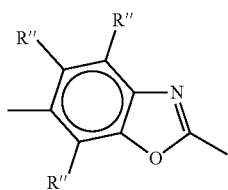
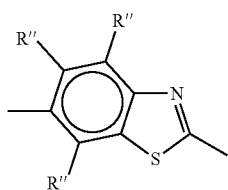
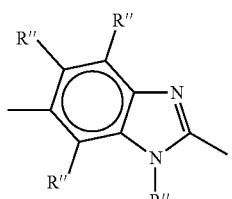
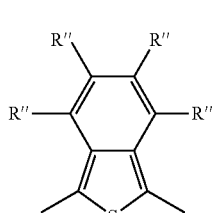
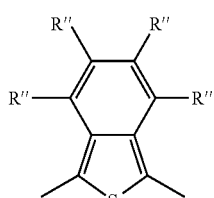
[chemical formula 28]
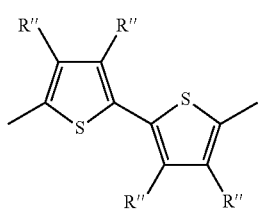
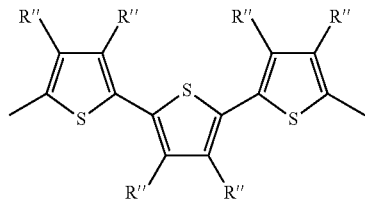
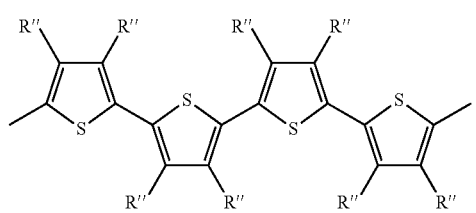
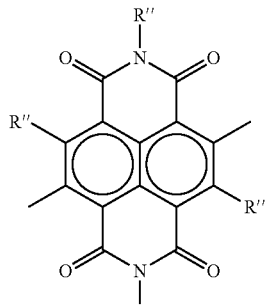
[chemical formula 29]
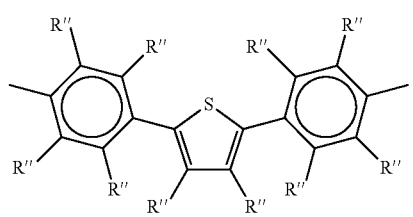
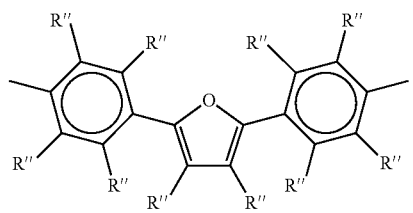
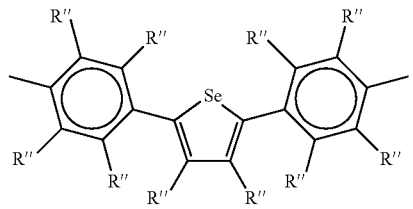
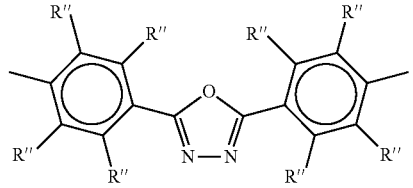

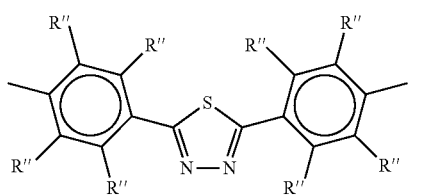
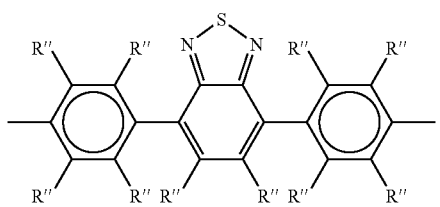
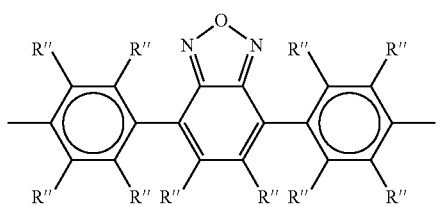
[chemical formula 30]
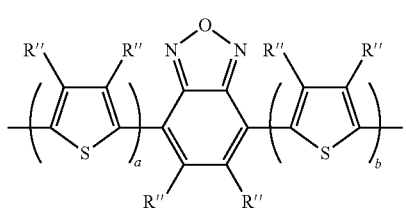
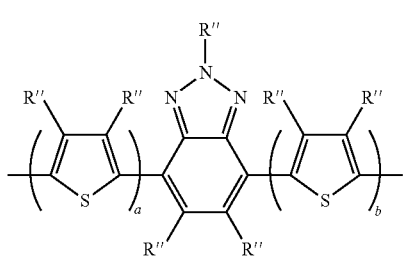
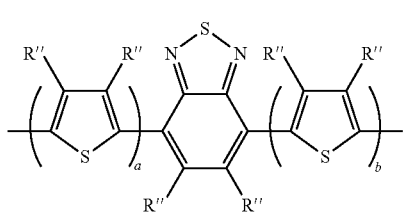
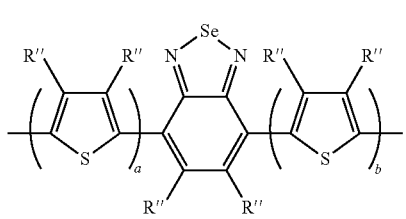
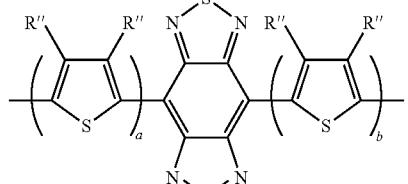
[chemical formula 31]
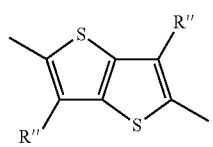
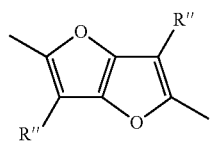
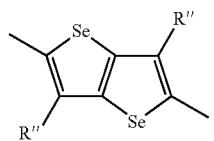
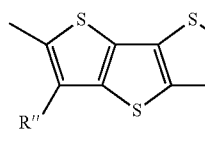
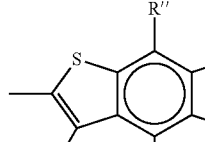
[chemical formula 32]

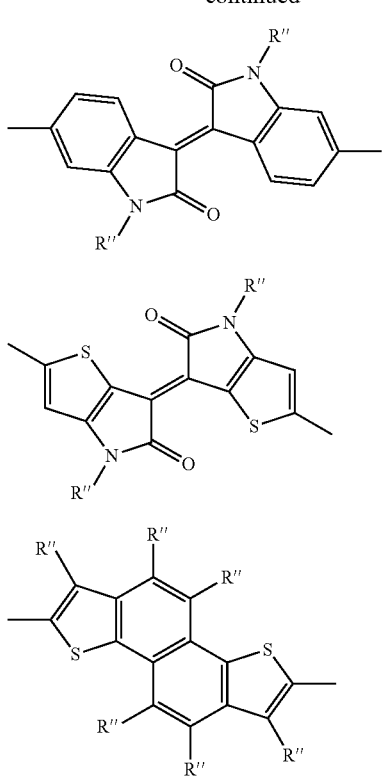

[chemical formula 33]

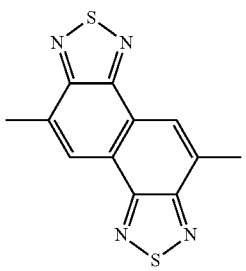

In the formulae 13 to 64, R″ represents the same meaning as described above. a and b each independently represent the number of repetition, and usually an integer of 0 to 5, preferably an integer of 0 to 3, more preferably an integer of 0 to 1.

The second structural unit is preferably a divalent heterocyclic ring group, more preferably a divalent heterocyclic ring group represented by the formula 49 to the formula 53, the formulae 59 to 62 or the formula 64, further preferably a divalent heterocyclic ring group represented by the formula 51 or the formula 64, since an organic film transistor produced by using the film of the present invention is more excellent in electric field effect mobility.

The polymer compound contained in the film of the present invention has a polystyrene-equivalent number-average molecular weight (Mn) measured by gel permeation chromatography (hereinafter, referred to as "GPC") of usually $1\times10^3$ to $1\times10^7$. The number-average molecular weight is preferably $3\times10^3$ or more, from the standpoint of forming an excellent film. The number-average molecular weight is preferably $1\times10^6$ or less, from the standpoint of enhancing solubility in a solvent and making film formation easy.

The polymer compound contained in the film of the present invention has high solubility in a solvent (preferably, an organic solvent), and specifically, it preferably has solubility by which a solution containing the polymer compound contained in the composition of the present invention in an amount of 0.1% by weight (hereinafter, referred to as "wt %" in some cases) or more can be prepared, more preferably has solubility by which a solution containing the polymer compound in an amount of 0.4 wt % or more can be prepared.

The number of a structural unit represented by the formula (2) in the polymer compound contained in the film of the present invention may be one in the polymer compound, preferably three or more in the polymer compound, more preferably five or more in the polymer compound.

The polymer compound contained in the film of the present invention may be any of a homopolymer and a copolymer. The copolymer may be any kind of copolymer, and for example, may be any of a block copolymer, a random copolymer, an alternating copolymer or a graft copolymer. The polymer compound contained in the film of the present invention is preferably a copolymer composed of a structural unit represented by the formula (2) and a structural unit represented by the formula (3), more preferably an alternating copolymer composed of a structural unit represented by the formula (2) and a structural unit represented by the formula (3), since an organic film transistor produced by using the film of the present invention is more excellent in electric field effect mobility.

When a group active to the polymerization reaction remains at the molecular chain end of the polymer compound contained in the film of the present invention, the electric field effect mobility of an organic film transistor produced by using the composition of the present invention possibly lowers. Therefore, it is preferable that the molecular chain end is a stable group such as an aryl group, a monovalent aromatic heterocyclic ring group or the like.

<Production Method of Polymer Compound>

Next, the method of producing the polymer compound contained in the film of the present invention will be illustrated.

The polymer compound contained in the film of the present invention may be produced by any method, and for example, a compound represented by the formula: $X^{21}$-$A^{11}$-$X^{22}$ and a compound represented by the formula: $X^{23}$-$A^{12}$-$X^{24}$ are, if necessary dissolved in an organic solvent, if necessary with addition of a base, and subjected to a known polymerization method such as aryl coupling and the like using a suitable catalyst, thus, the polymer compound can be synthesized.

$A^{11}$ represents a structural unit represented by the formula (2) and $A^{12}$ represents a structural unit represented by the formula (3). $X^{21}$, $X^{22}$, $X^{23}$ and $X^{24}$ each independently represent a polymerization reactive group.

The polymerization reactive group includes, for example, a halogen atom, a borate residue, a boric acid residue and an organic tin residue. Here, the boric acid residue denotes a group represented by —$B(OH)_2$.

The organic tin residue includes organic tin residues substituted with three alkyl groups or three cycloalkyl groups (for example, a trialkylstannyl group or a tricycloalkylstannyl group).

The halogen atom as the polymerization reactive group includes, for example, a fluorine atom, a chlorine atom, a bromine atom and an iodine atom.

The borate residue as the polymerization reactive group includes, for example, groups represented by the following formulae.

[chemical formula 34]

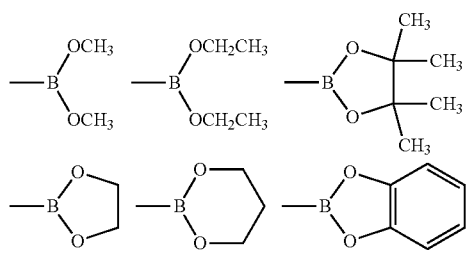

The organic tin residue substituted with three alkyl groups as the polymerization reactive group includes, for example, an organic tin residue substituted with three methyl groups (a trimethylstannyl group) and an organic tin residue substituted with three butyl groups (a tributylstannyl group).

The organic tin residue substituted with a cycloalkyl group includes a tricyclohexylstannyl group.

The above-described polymerization method such as aryl coupling and the like includes, for example, a method of polymerization by the Suzuki coupling reaction (Chemical Review, 1995, vol. 95, pp. 2457-2483) and a method of polymerization by the Stille coupling reaction (European Polymer Journal, 2005, vol. 41, pp. 2923-2933).

The polymerization reactive group is preferably a halogen atom, a borate residue or a boric acid residue in the case of use of a nickel catalyst or a palladium catalyst such as in the Suzuki coupling reaction and the like, and preferably a bromine atom, an iodine atom or a borate residue since the polymerization reaction becomes simple.

When the polymer compound contained in the film of the present invention is polymerized by the Suzuki coupling reaction, the ratio of the total number of moles of a bromine atom and an iodine atom as the above-described polymerization reactive group to the total number of moles of a borate residue as the above-described polymerization reactive group is preferably 0.7 to 1.3, more preferably 0.8 to 1.2.

The polymerization reactive group is preferably a halogen atom, or an organic tin residue substituted with three alkyl groups or three cycloalkyl groups in the case of use of a palladium catalyst such as in the Stille coupling reaction and the like, and preferably a bromine atom, an iodine atom, or an organic tin residue substituted with three alkyl groups or three cycloalkyl groups since the polymerization reaction becomes simple.

When the polymer compound contained in the film of the present invention is polymerized by the Stille coupling reaction, the ratio of the total number of moles of a bromine atom and an iodine atom as the above-described polymerization reactive group to the total number of moles of an organic tin residue (preferably, an organic tin residue substituted with three alkyl groups or three cycloalkyl groups) as the above-described polymerization reactive group is preferably 0.7 to 1.3, more preferably 0.8 to 1.2.

The organic solvent used in polymerization includes, for example, benzene, toluene, xylene, chlorobenzene, dichlorobenzene, tetrahydrofuran and dioxane. These organic solvents may be used each singly or in combination of two or more.

The base used in polymerization includes, for example, inorganic bases such as sodium carbonate, potassium carbonate, cesium carbonate, potassium fluoride, cesium fluoride, tripotassium phosphate and the like, and organic bases such as tetrabutylammonium fluoride, tetrabutylammonium chloride, tetrabutylammonium bromide, tetraethylammonium hydroxide, tetrabutylammonium hydroxide and the like.

The catalyst used for polymerization is preferably a catalyst composed of a transition metal complex such as a palladium complex such as tetrakis(triphenylphosphine)palladium, tris(dibenzylideneacetone)dipalladium, palladium acetate, dichlorobistriphenylphosphinepalladium and the like, and if necessary, of a ligand such as triphenylphosphine, tri-tert-butylphosphine, tricyclohexylphosphine and the like. As these catalysts, those synthesized previously may be used or those prepared in the reaction system may be used as they are. These catalysts may be used each singly or in combination of two or more.

The reaction temperature of polymerization is preferably 0 to 200° C., more preferably 0 to 150° C., further preferably 0 to 120° C.

The reaction time of polymerization is usually 1 hour or more, preferably 2 to 500 hours.

The post treatment of polymerization can be conducted by a known method, and there are, for example, methods in which the reaction solution obtained in the above-described polymerization is added to a lower alcohol such as methanol and the like to deposit a precipitate which is then filtrated and dried.

When the purity of the polymer compound contained in the composition of the present invention is low, it is preferable that the polymer compound is purified by a method such as recrystallization, continuous extraction by a Soxhlet extractor, column chromatography and the like.

The compound represented by the formula (11) can be suitably used as the raw material of the polymer compound contained in the composition of the present invention, in the above-described polymer compound production method.

[chemical formula 35]

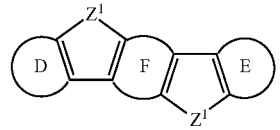

(11)

In the formula (11), Ring D, Ring E, Ring F and $Z^1$ represent the same meaning as described above.

In the formula (11), Ring D and Ring E preferably have a borate residue, a boric acid residue or an organic tin residue.

The compound represented by the formula (11) is preferably a compound represented by the formula (11-1), a compound represented by the formula (11-2) or a compound represented by the formula (11-3), since synthesis of the compound represented by the formula (11) is easy.

[chemical formula 36]

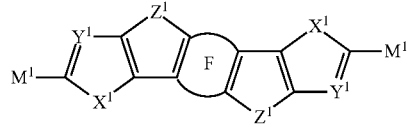

(11-1)

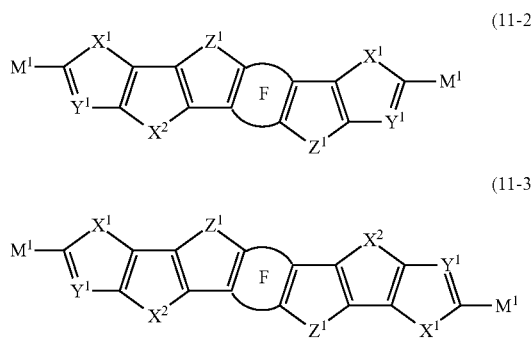

(11-2)

(11-3)

In the formula (11-1) to the formula (11-3), Ring F, $Z^1$, $X^1$, $X^2$ and $Y^1$ represent the same meaning as described above. $M^1$ represents a borate residue, a boric acid residue or an organic tin residue. A plurality of $M^1$ may be the same or different.

The definition and specific examples of the borate residue, the boric acid residue or the organic tin residue are the same as the definition and specific examples of the borate residue, the boric acid residue or the organic tin residue as the above-described polymerization reactive group.

The compound represented by the formula (11) (may also be a compound represented by the formula (11-1) to the formula (11-3)) includes, for example, compounds represented by the formula (5a-11-1) to the formula (5a-11-10), the formula (5a-12-1) to the formula (5a-12-10) and the formula (5a-13-1) to the formula (5a-13-10), and a compound represented by the formula (5a-11-1), the formula (5a-11-2), the formula (5a-11-3), the formula (5a-12-1), the formula (5a-12-3), the formula (5a-12-5), the formula (5a-13-1), the formula (5a-13-3) or the formula (5a-13-5) is preferable, a compound represented by the formula (5a-11-1), the formula (5a-11-2), the formula (5a-11-3), the formula (5a-12-1), the formula (5a-12-3), the formula (5a-13-1) or the formula (5a-13-3) is more preferable, a compound represented by the formula (5a-11-1), the formula (5a-11-2) or the formula (5a-11-3) is further preferable, since synthesis of the compound represented by the formula (11) is easy.

[chemical formula 37]

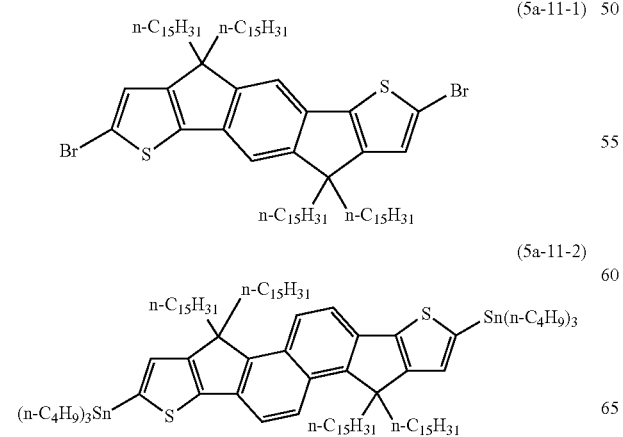

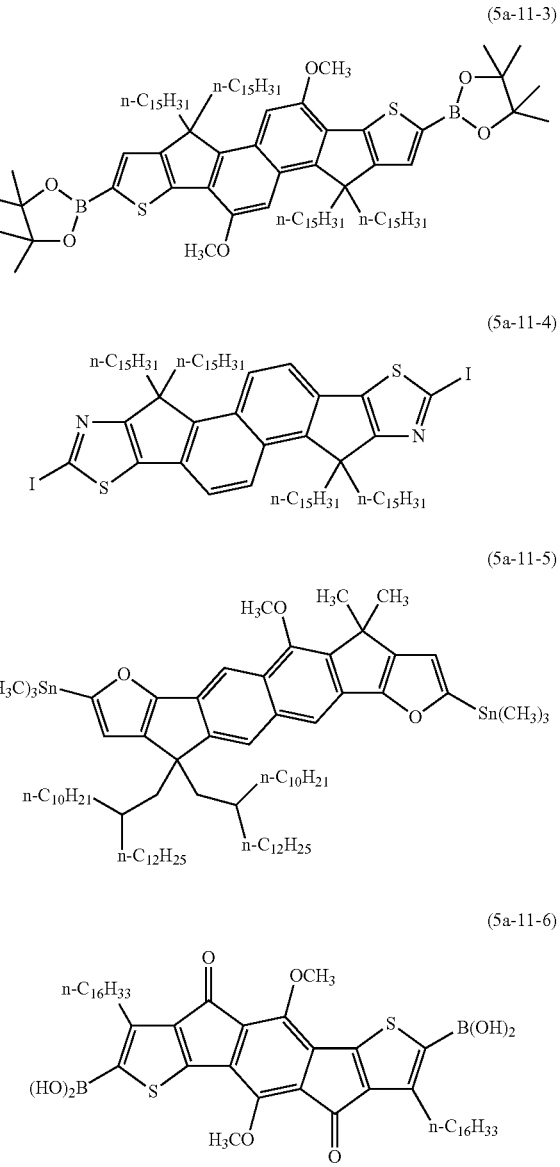

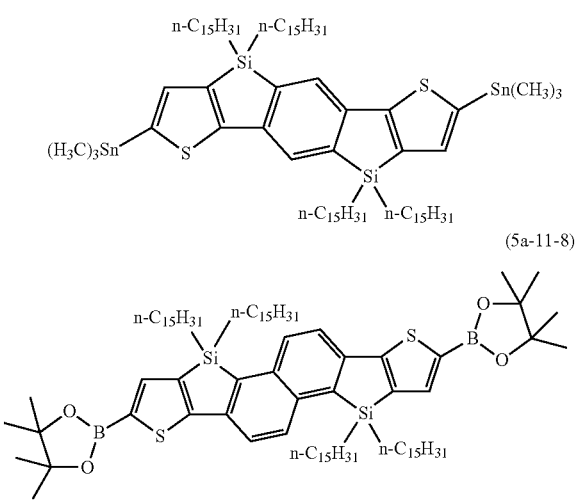

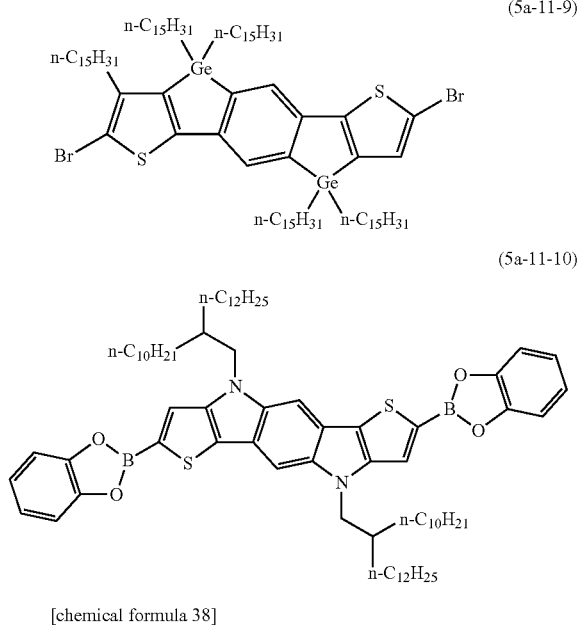
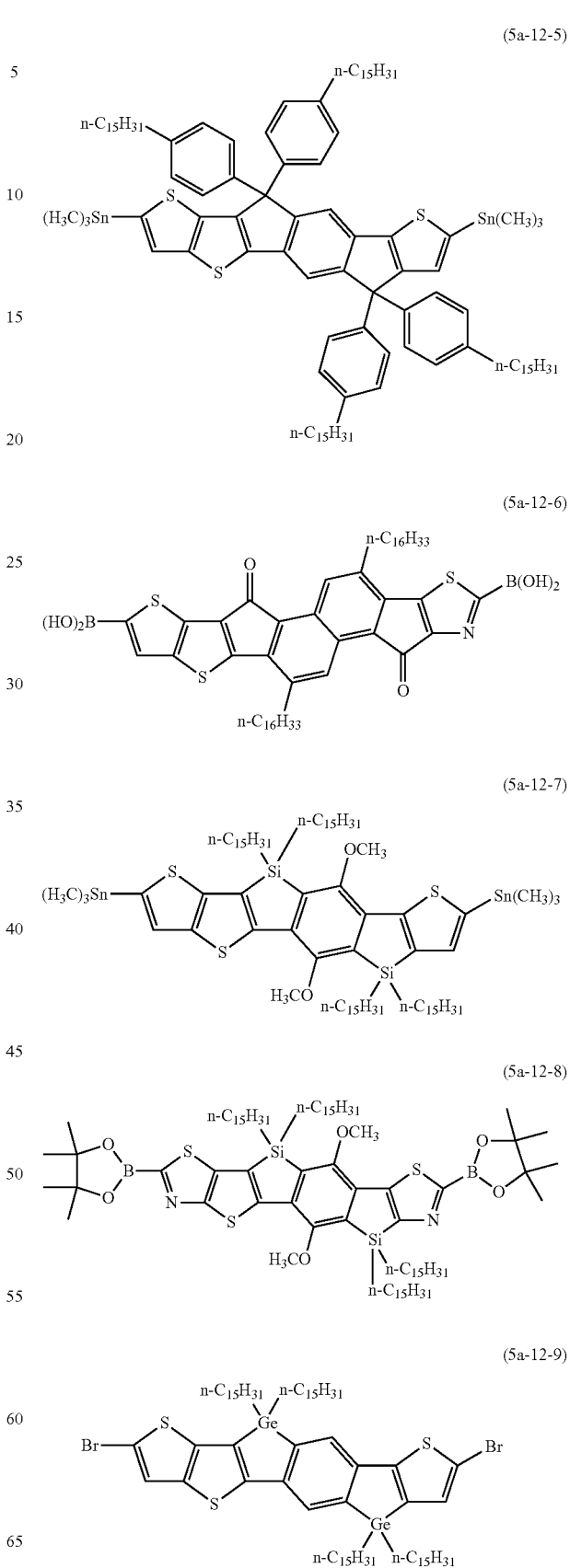

(5a-12-10)
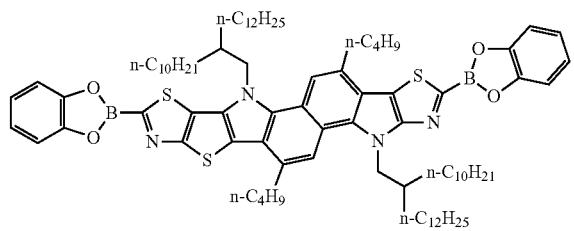

[chemical formula 39]

(5a-13-1)
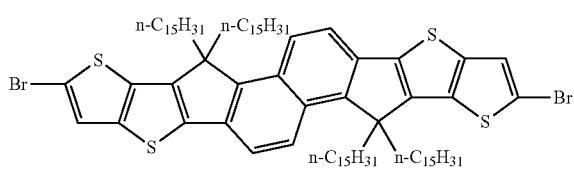

(5a-13-2)
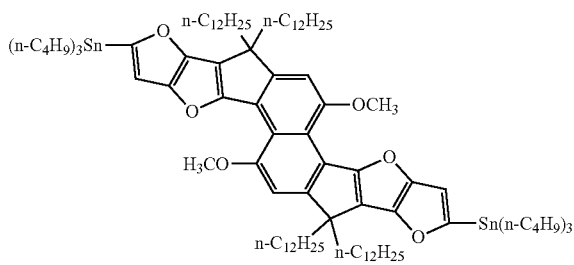

(5a-13-3)
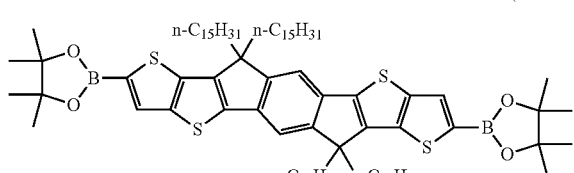

(5a-13-4)
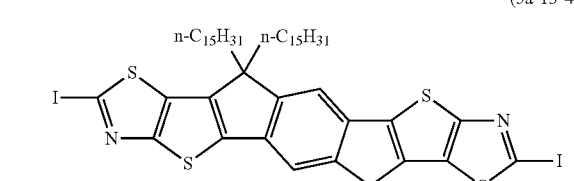

(5a-13-5)
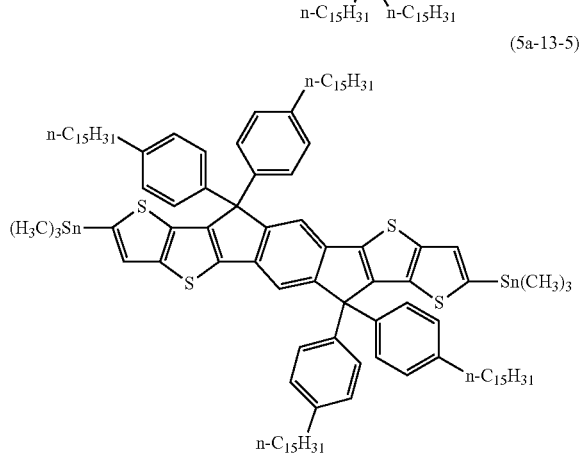

(5a-13-6)
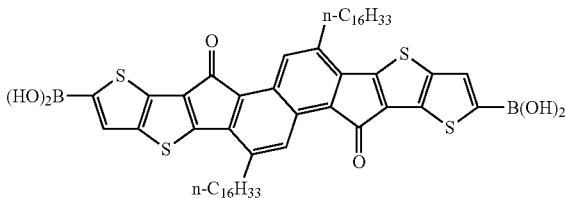

(5a-13-7)
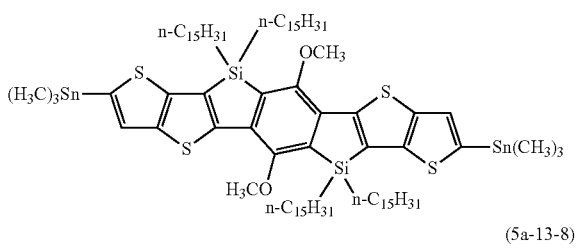

(5a-13-8)
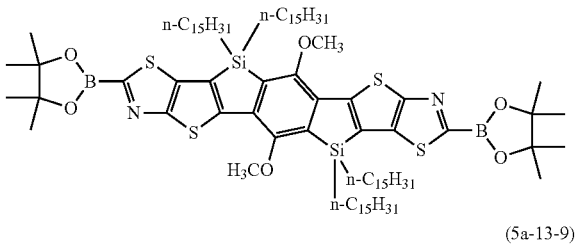

(5a-13-9)
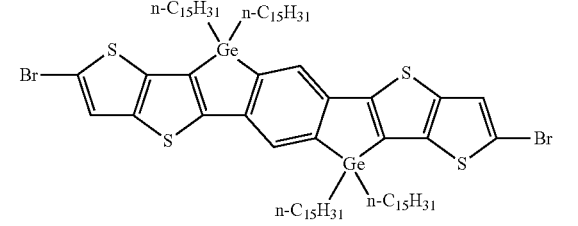

(5a-13-10)
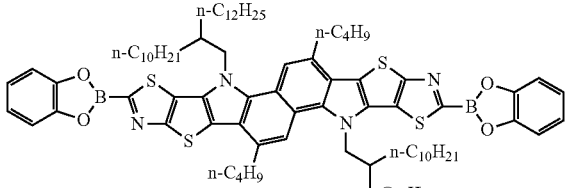

Next, the method of producing the compound represented by the formula (11) is explained.

The compound represented by the formula (11) may be produced by any method, and for example, can be produced by a bromination reaction, the Suzuki coupling reaction, the Wolff-Kishner reduction reaction, the Buchwald-Hartwig amination reaction and an oxidative cyclization reaction, as explained below.

When $Z^1$ is a group represented by the formula (Z-5'), the compound can be produced, for example, by a first step of reacting a compound represented by the formula (S1), a compound represented by the formula (S2) and a compound represented by the formula (S3) by the Suzuki coupling reaction, and a second step of intramolecularly cyclizing a compound represented by the formula (S4) obtained in the first step.

In this case, the resultant compound is a compound represented by the formula (S5). Then, the compound represented by the formula (S5) (I) can be reacted with a halogenating agent such as N-bromosuccinimide and the like, (II) can be subjected to a coupling reaction using a palladium catalyst and the like or (III) can be reacted with an alkyllithium to cause lithiation, and further, reacted with tributylbutyltin chloride and the like, thereby producing the compound represented by the formula (11).

[chemical formula 40]

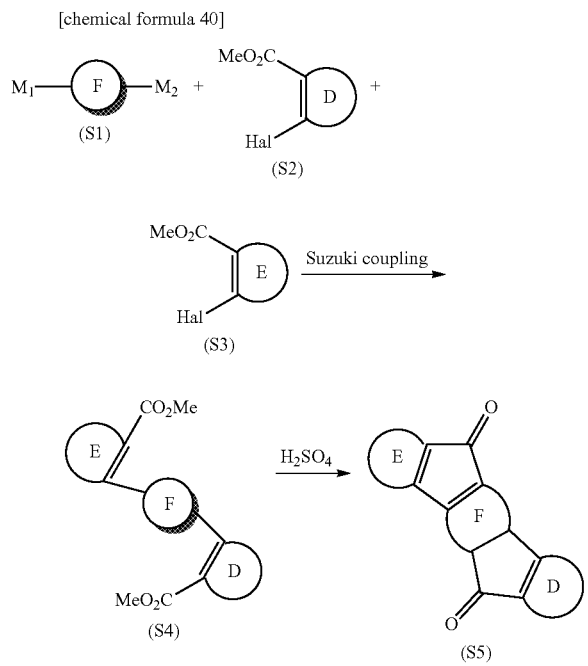

[chemical formula 41]

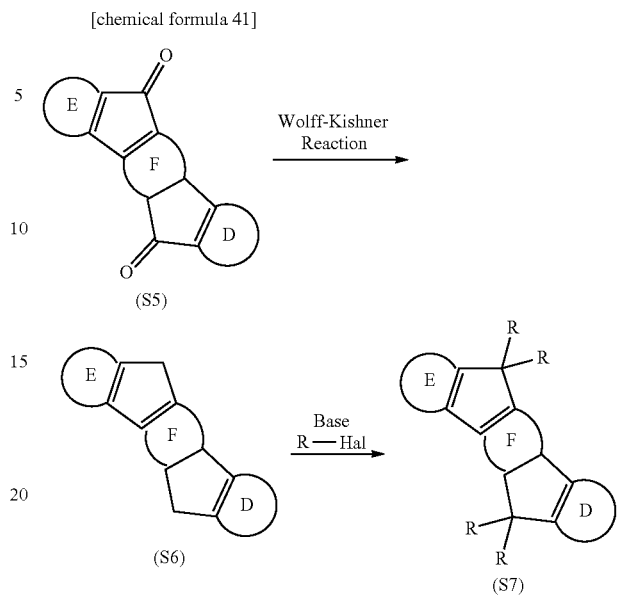

In the formulae (S1) to (S5), Ring D, Ring E and Ring F represent the same meaning as described above. $M_1$ and $M_2$ each independently represent a borate residue or a boric acid residue (a group represented by $-B(OH)_2$). Hal represents an iodine atom, a bromine atom or a chlorine atom. Hal in the formula (S2) and Hal in the formula (S3) may be the same or different.

When $Z^1$ is a group represented by the formula (Z-1'), the compound can be produced, for example, by a first step of reacting a compound represented by the formula (S5) described above by the Wolff-Kishner reduction reaction, and a second step of reacting a compound represented by the formula (S6) obtained in the first step, a base such as a sodium alkoxide and the like, and an alkyl halide.

In this case, the resultant compound is a compound represented by the formula (S7). Then, the compound represented by the formula (S7) (I) can be reacted with a halogenating agent such as N-bromosuccinimide and the like, (II) can be subjected to a coupling reaction using a palladium catalyst and the like or (III) can be reacted with an alkyllithium to cause lithiation, and further, reacted with tributylbutyltin chloride and the like, thereby producing the compound represented by the formula (11).

In the formulae (S5) to (S7), Ring D, Ring E, Ring F and Hal represent the same meaning as described above. R represents an alkyl group, a cycloalkyl group, an alkoxy group, a cycloalkoxy group, an alkylthio group, a cycloalkylthio group, an aryl group or a monovalent heterocyclic ring group, and these groups may have a substituent. A plurality of R may be mutually the same or different.

When $Z^1$ and $Z^2$ are a group represented by the formula (Z-1'), the compound can be produced, in addition, by a first step of reacting a compound represented by the formula (S1), a compound represented by the formula (S8) and a compound represented by the formula (S9) by the Suzuki coupling reaction, a second step of reacting a compound represented by the formula (S10) obtained in the first step with butyllithium to cause lithiation, and further, reacting with a ketone, and a third step of reacting a compound represented by the formula (S11) obtained in the second step with an acid such as trifluoroboric acid, sulfuric acid or the like to cause cyclization.

In this case, the resultant compound is a compound represented by the formula (S7). Then, the compound represented by the formula (S7) (I) can be reacted with a halogenating agent such as N-bromosuccinimide and the like, (II) can be subjected to a coupling reaction using a palladium catalyst and the like or (III) can be reacted with an alkyllithium to cause lithiation, and further, reacted with tributylbutyltin chloride and the like, thereby producing the compound represented by the formula (11).

[chemical formula 42]

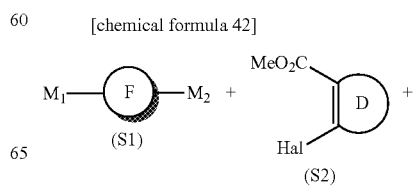

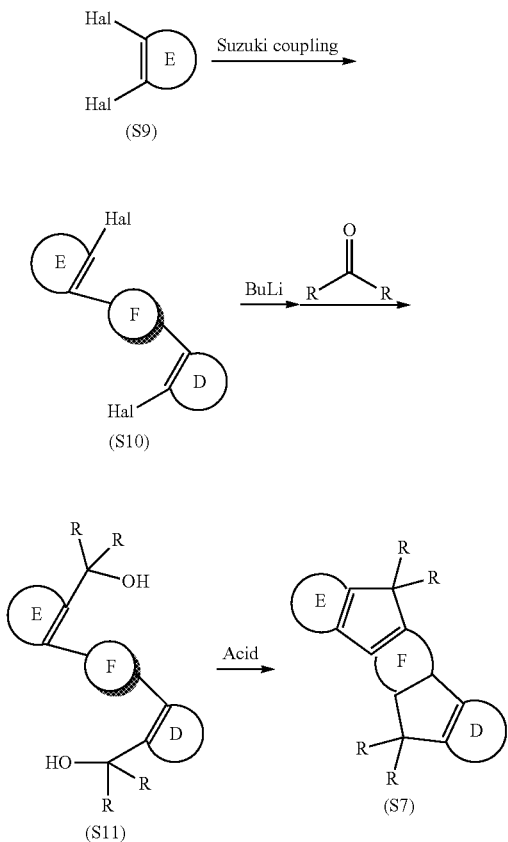

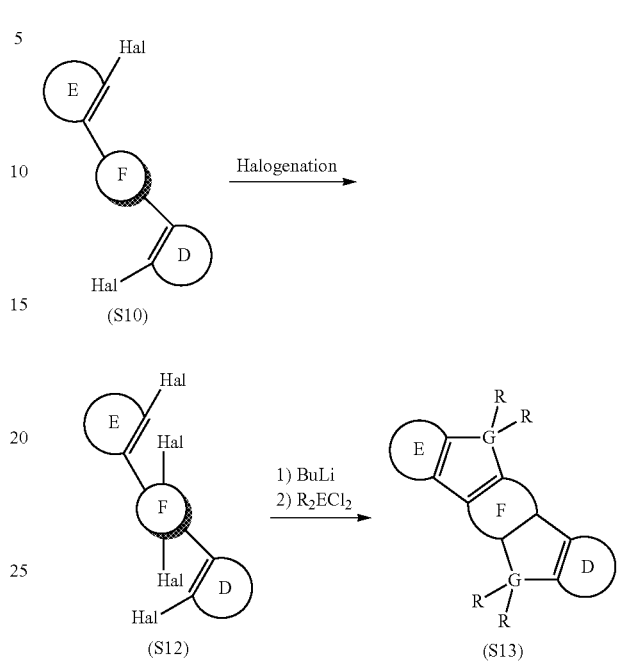

In the formulae (S1) and (S7) to (S11), R, M₁, M₂, Ring D, Ring E, Ring F and Hal represent the same meaning as described above. A plurality of Hal present in the formula (S8) may be the same or different, a plurality of Hal present in the formula (S9) may be the same or different, and Hal in the formula (S8) and Hal in the formula (S9) may be the same or different.

When $Z^1$ is a group represented by the formula (Z-2') or the formula (Z-3'), the compound can be produced, for example, by a first step of reacting a compound represented by the formula (S10) described above with a halogenating agent such as N-bromosuccinimide and the like, and a second step of reacting a compound represented by the formula (S12) obtained in the first step with butyllithium to cause lithiation, and further, reacting with a compound represented by the formula: $R_2ECl_2$, and the like.

In this case, the resultant compound is a compound represented by the formula (S13). Then, the compound represented by the formula (S13) (I) can be reacted with a halogenating agent such as N-bromosuccinimide and the like, (II) can be subjected to a coupling reaction using a palladium catalyst and the like or (III) can be reacted with an alkyllithium to cause lithiation, and further, reacted with tributylbutyltin chloride and the like, thereby producing the compound represented by the formula (11).

[chemical formula 43]

In the formulae (S10), (S12) and (S13), R, Ring D, Ring E, Ring F and Hal represent the same meaning as described above. G represents a silicon atom or a germanium atom. A plurality of Hal present in the formula (S10) may be the same or different, and a plurality of Hal present in the formula (S12) may be the same or different.

When $Z^1$ is a group represented by the formula (Z-4'), the compound can be produced, for example, by reacting a compound represented by the formula (S12) described above and a compound represented by the formula (S14) according to the Buchwald-Hartwig amination reaction. In this case, the resultant compound is a compound represented by the formula (S15). Then, the compound represented by the formula (S15) (I) can be reacted with a halogenating agent such as N-bromosuccinimide and the like, (II) can be subjected to a coupling reaction using a palladium catalyst and the like or (III) can be reacted with an alkyllithium to cause lithiation, and further, reacted with tributylbutyltin chloride and the like, thereby producing the compound represented by the formula (11).

[chemical formula 44]

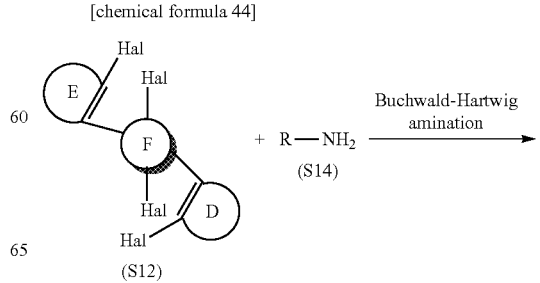

-continued

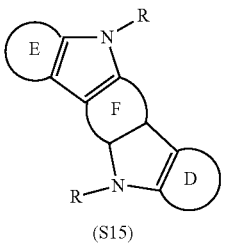
(S15)

In the formulae (S12), (S14) and (S15), R, Ring D, Ring E, Ring F and Hal represent the same meaning as described above. A plurality of Hal present in the formula (S12) may be the same or different.

When $Z^1$ is a group represented by the formula (Z-5'), the compound can be produced, in addition, by a first step of reacting a compound represented by the formula (S16), a compound represented by the formula (S19) and a compound represented by the formula (S20) according to the Suzuki coupling reaction, and a second step of intramolecularly cyclizing a compound represented by the formula (S21) obtained in the first step.

In this case, the resultant compound is a compound represented by the formula (S7). Then, the compound represented by the formula (S7) (I) can be reacted with a halogenating agent such as N-bromosuccinimide and the like, (II) can be subjected to a coupling reaction using a palladium catalyst and the like or (III) can be reacted with an alkyllithium to cause lithiation, and further, reacted with tributylbutyltin chloride and the like, thereby producing the compound represented by the formula (11).

[chemical formula 45]

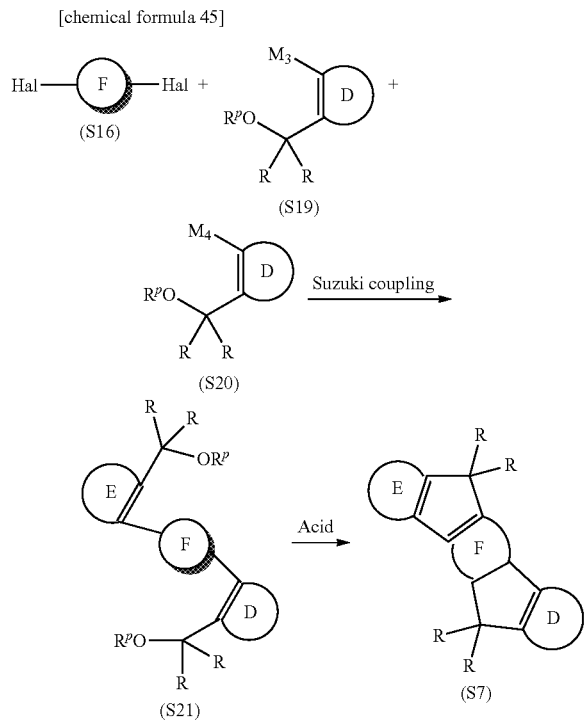

In the formulae (S7), (S16), (S19), (S20) and (S21), R, Ring D, Ring E and Hal represent the same meaning as described above. $M_3$ and $M_4$ each independently represent a borate residue or a boric acid residue (a group represented by $—B(OH)_2$). $R^p$ represents an alkyl group, a silyl group or an acetyl group. A plurality of Hal present in the formula (S24) may be the same or different. $R^p$ in the formula (S19) and $R^p$ in the formula (S20) may be the same or different.

The compound represented by the formula (11) can also be synthesized, for example, according to methods described in JP-A No. 2009-155648, JP-A No. 2009-209134, Japanese Patent Application National Publication No. 2012-500308, Japanese Patent Application National Publication No. 2013-501076 and International Publication WO2013/010614.

<Composition Ratio>

The film of the present invention contains a polymer compound and a compound having carrier transportability. The polymer compound may be contained singly in the film of the present invention or two or more of the polymer compounds may be contained therein. The compound having carrier transportability may be contained singly in the film of the present invention or two or more of the compounds may be contained therein.

The content of the low molecular weight compound having carrier transportability contained in the film of the present invention is 5 to 40 parts by mass with respect to 100 parts by mass of the sum of the polymer compound and the low molecular weight compound, and since an organic film transistor produced by using the film of the present invention is more excellent in electric field effect mobility, the content is preferably 10 to 30 parts by mass.

<Film X-Ray Diffraction Method>

The film of the present invention is a film in which the diffraction intensity A specified by a measuring method A using a film X-ray diffraction method is 3 to 50, and the intensity ratio (A/B) of the diffraction intensity A specified by a measuring method A using a film X-ray diffraction method to the diffraction intensity B specified by a measuring method B using a film X-ray diffraction method is 30 or less:

(Measuring Method A)

the diffraction intensity A is the maximum diffraction intensity in a range of scattering vector of 1 $nm^{-1}$ to 5 $nm^{-1}$ in a profile obtained by an Out-of plane measuring method using a film X-ray diffraction method.

(Measuring Method B)

the diffraction intensity B is the maximum diffraction intensity in a range of scattering vector of 10 $nm^{-1}$ to 21 $nm^{-1}$ in a profile obtained by an In-plane measuring method using a film X-ray diffraction method.

The diffraction intensity A is preferably 3 to 30, more preferably 3 to 10, since an organic film transistor produced by using the film of the present invention is more excellent in electric field effect mobility. When the diffraction intensity A is in these ranges, the low molecular weight compound having carrier transportability contained in the film of the present invention tends to be disproportionately distributed along the thickness direction of the film (specifically, when the film is formed on a substrate, it is distributed disproportionately to the substrate side or the surface side), that is, the diffraction intensity in such ranges is preferable.

The intensity ratio (A/B) of the diffraction intensity A to the diffraction intensity B is preferably 20 or less, more preferably 15 or less, since an organic film transistor produced by using the film of the present invention is more excellent in electric field effect mobility. When the intensity ratio (A/B) is in these ranges, the low molecular weight compound having carrier transportability contained in the film of the present invention tends to be disproportionately distributed along the thickness direction of the film (specifically, when the film is formed on a substrate, it is distributed disproportionately to the substrate side or the surface side), that is, the intensity ratio in such ranges is preferable.

The diffraction intensity A and the diffraction intensity B can be measured by known Out-of-plane and In-plane measurement methods using a film X-ray diffraction method, respectively, and it is preferable that the measurement is conducted according to measuring conditions described below.

Incident X ray wavelength: 1.54 Å
Incident X ray angle: 0.17° to 0.19°
Incident X ray beam size: a diameter of 1 mm
Sample length: 2 mm
Distance between sample and detector: 100 mm to 300 mm
Sample chamber atmosphere: a 50 Pa or less vacuum atmosphere or an atmosphere of an inert gas such as a helium gas and the like
Measurement temperature: room temperature
Substrate: a silicon substrate, a float glass or a sapphire substrate
Detector: an imaging plate detector
Setting of sample: set so that the length in a direction parallel to an incident X ray is 2 mm
X ray irradiation time:
100 min (In-plane measurement method)
720 min (Out-of-plane measurement method)

When the intensity of an incident X ray varies, it is preferable that the diffraction intensity A and the diffraction intensity B are corrected using a correction coefficient S described later.

The correction coefficient S can be determined using, for example, SIGRADUR G (registered trademark) (Grassy carbon manufactured by Hochtemperatur Werkstoffe, thickness: 3 mm). Specifically, the measurement is conducted by a known solid-state X ray transmission method using SIGRADUR G. The resultant two-dimensional X ray diffraction image is integrated in the annular direction in a range of a scattering vector of 9 $nm^{-1}$ to 14 $nm^{-1}$. The resultant integrated value can be divided by 700, to obtain the correction coefficient S.

(Diffraction Intensity A)

Scattering vectors [$nm^{-1}$] can be calculated according to the following formula from scattering angle θ and X ray wavelength λ in a profile obtained by an Out-of-plane measurement method using a film X-ray diffraction method (hereinafter, also referred to as "Out-of-plane profile"), and the diffraction intensity which is maximum in a range of scattering vector of 1 to 5 $nm^{-1}$ in the Out-of-plane profile can be divided by the above-described correction coefficient S, to obtain the diffraction intensity A.

Scattering vector [$nm^{-1}$]=4π/λ×sin θ

In the Out-of-plane profile, the baseline is distorted in some cases by an influence of a substance contained in atmospheric air and the like. In this case, it is preferable to remove the distortion of the baseline. The removal of the distortion of the baseline includes, for example, methods using a least square method.

(Diffraction Intensity B)

The intensity which is maximum in a range of scattering vector of 10 to 21 $nm^{-1}$ in a profile obtained by an In-plane measurement method using a film X-ray diffraction method (hereinafter, also referred to as "In-plane profile") can be divided by the above-described correction coefficient S, to obtain the diffraction intensity B.

<Time of Flight Type Secondary Ion Mass Spectrometry (TOF-SIMS Method)>

The film of the present invention contains a polymer compound and a low molecular weight compound having carrier transportability. The composition ratio Sr in the film surface described later is preferably 0.3 or more, more preferably 0.5 or more, further preferably 0.6 or more, since an organic film transistor produced by using the film of the present invention is more excellent in electric field effect mobility. When the composition ratio Sr is in these ranges, the low molecular weight compound having carrier transportability contained in the film of the present invention is distributed more uniformly in the film surface, that is, the composition ratio Sr in such ranges is preferable.

The composition ratio Sr in the film surface can be measured by a known TOF-SIMS method, and the measurement is preferably conducted according to measuring conditions described below.

Primary ion: $Au^+$, $Au_3^+$, $Bi^+$, $Bi_3^+$, $Bi_3^{++}$, $C_{60}$ or Ar gas cluster
Measurement area: 20 μm to 500 μm square
Mass spectrum: positive mass spectrum or negative mass spectrum
Cumulated number: 8 to 500 times
Dose of primary ion: $10^8$ to $10^{13}$ ion/$cm^2$
Charge correction: low acceleration electron gun is used A film containing a polymer compound and a low molecular weight compound having carrier transportability is subjected to measurement by a TOF-SIMS method, and from the resultant mass spectrum of the film surface, the intensity ($I_1$) of a secondary ion ($M_1$) derived from the polymer compound and the intensity ($I_2$) of a secondary ion ($M_2$) derived from the low molecular weight compound having carrier transportability are calculated.

Next, a film containing only a polymer compound is subjected to measurement by a TOF-SIMS method, and from the resultant mass spectrum of the film surface, the intensity ($I_{O1}$) of a secondary ion ($M_1$) derived from the polymer compound is calculated.

Next, a film containing only a low molecular weight compound having carrier transportability is subjected to measurement by a TOF-SIMS method, and from the resultant mass spectrum of the film surface, the intensity ($I_{O2}$) of a secondary ion ($M_2$) derived from the low molecular weight compound having carrier transportability is calculated.

The composition ratio Sr in the film surface can be calculated according to the following mathematical formula 1.

$$\text{Composition ratio } Sr = (I_2/I_{O2})/((I_1/I_{O1}) + (I_2/I_{O2})) \qquad \text{mathematical formula 1}$$

<Ink Composition>

It is preferable that the film of the present invention is formed using an ink composition, since the film can be formed easily. The ink composition contains a polymer compound, a compound having carrier transportability and a solvent, and may further contain other additives. The suitable solvent includes halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane, bromocyclohexane and the like, halogenated unsaturated hydrocarbon solvents such as chlorobenzene, dichlorobenzene, trichlorobenzene and the like, and additionally, tetrahydrofuran, tetrahydropyran, dioxane, toluene, xylene, mesitylene, tetralin, decalin, bicyclohexyl, cyclohexylbenzene and cyclohexane. It is preferable that the polymer compound and the compound having carrier transportability are those which can be dissolved at a concentration of 0.1% by weight or more in these solvents.

It is preferable that the ink composition manifests suitable viscosity for an application method as described later. The viscosity of the ink composition according to a suitable embodiment can be controlled in a wide range by adjusting the composition ratio of a polymer compound to a compound having carrier transportability.

Thus, the viscosity of the ink composition can be controlled without depending on the kind and the amount of a solvent, resulting in an increase in the degree of freedom of selection of a solvent. For example, even for a substrate having large surface free energy and on which application is usually difficult due to too large contact angle to an application solution (for example, 90 degree or more), a film can be formed thereon by performing suitable adjustment, since the ink composition can be prepared with high degree of freedom. As a result, according to the ink composition of the present embodiment, it becomes possible to successfully form an organic film which is approximately uniform and having high carrier transportability, in production of an organic semiconductor device.

The film of the present invention is largely constituted of a polymer compound and a compound having carrier transpostability, and may partially contain a solvent and other unavoidable components contained in the ink composition. The thickness of the film of the present invention is preferably 1 nm to 100 μm, more preferably 2 nm to 1000 nm, further preferably 5 nm to 200 nm, particularly preferably 5 nm to 50 nm. According to the film having such a thickness, an organic semiconductor device having excellent carrier transportability and sufficient also in strength and the like can be formed.

The film of the present invention can be formed by applying the ink composition described above on a prescribed substrate, and the like. The method of applying the ink composition includes application methods such as, for example, a spin coat method, a casting method, a push coat method, a micro gravure coat method, a gravure coat method, a bar coat method, a roll coat method, a wire bar coat method, a dip coat method, a spray coat method, a screen printing method, a flexo printing method, an offset printing method, an inkjet printing method, a dispenser printing method, a micro contact printing method, a nozzle coat method and a capillary coat method. Of them, a spin coat method, a push coat method, a gravure coat method, a screen printing method, a flexo printing method, an offset printing method, an inkjet printing method, a dispenser printing method, a micro contact printing method, a nozzle coat method or a capillary coat method is preferable.

Application may be conducted also under heated condition. By this, an ink composition having high concentration can be applied, a more uniform film can be formed, and additionally, materials of which application at room temperature has been difficult can be selected and used. Application under heated condition can be attained, for example, by using an ink composition heated previously or by performing application while heating a substrate.

The viscosity of the ink composition which is suitable for the above-described application method is, for example, in a gravure coat method, preferably 0.01 to 1 Pa·s, more preferably 0.05 to 0.2 Pa·s, in a screen printing method, preferably 0.1 to 100 Pa·s, more preferably 0.5 to 50 Pa·s, in a flexo printing method, preferably 0.01 to 1 Pa·s, more preferably 0.05 to 0.5 Pa·s, in an offset printing method, preferably 1 to 500 Pa·s, more preferably 20 to 100 Pa·s, and in an inkjet printing method, preferably 0.1 Pa·s or less, more preferably 0.02 Pa·s or less. The viscosity of the ink composition can be controlled by appropriately setting the composition ratio of a polymer compound to a compound having carrier transportability, or selecting the kind of a solvent, as described above.

The step of forming a film as described above can also be carried out as one step in production of an organic semiconductor device. In this case, for example, a substrate on which a film is to be formed is a structure generated in a production process of an organic semiconductor device. In an organic semiconductor device, a step of imparting prescribed orientation may be further carried out on a film formed as described above, from the standpoint of further enhancing the carrier transportability of the film. In an oriented film, a polymer compound and a compound having carrier transportability in an organic semiconductor composition constituting this are arranged in one direction, therefore, carrier transportability tends to be further enhanced.

As the orientation method, for example, methods which are known as a means for orienting a liquid crystal can be used. Of them, a rubbing method, a photo-aligning method, a shearing method (shear stress applying method), a draw up application method and the like are simple and thus can be utilized easily as the orientation method, and particularly, a rubbing method or a shearing method is preferable.

<Organic Semiconductor Device>

The film of the present invention can exert high carrier (electron or hole) transportability, therefore, electrons or holes injected from an electrode provided on the film or charges generated by light absorption can be transported. In view of this, the film of the present invention can be applied to various organic semiconductor devices such as an organic film transistor, an organic film solar battery, an organic electroluminescent device, an organic electric field effect transistor sensor (hereinafter, referred to also as "OFET sensor"), an organic conductivity modulation type sensor and the like, by utilizing these properties. These organic semiconductor devices will be individually explained below.

(Organic Film Transistor)

The organic film transistor using the film of the present invention includes one having a constitution having a source electrode and a drain electrode, an organic semiconductor layer (active layer) acting as a current pathway between these electrodes, and a gate electrode controlling the quantity of current passing the current pathway, in which the organic semiconductor layer is constituted of the film of the present invention. Such an organic film transistor includes, for example, an electric field effect organic film transistor and an electrostatic induction organic film transistor.

The electric field effect organic film transistor preferably has a source electrode and a drain electrode, an organic semiconductor layer (active layer) acting as a current pathway between these electrodes, a gate electrode controlling the quantity of current passing the current pathway, and an insulation layer disposed between the organic semiconductor layer and the gate electrode. Particularly, it is preferable that a source electrode and a drain electrode are disposed in contact with an organic semiconductor layer (active layer), and further, a gate electrode is disposed sandwiching an insulation layer in contact with the organic semiconductor layer. In the electric field effect organic film transistor, the organic semiconductor layer is constituted of the film of the present invention.

The electrostatic induction organic film transistor preferably has a source electrode and a drain electrode, an organic semiconductor layer (active layer) acting as a current pathway between these electrodes, and a gate electrode controlling the quantity of current passing the current pathway, wherein this gate electrode is disposed in the organic semiconductor layer. Particularly, it is preferable that a source electrode, a drain electrode and, a gate electrode disposed in an organic semiconductor layer are disposed in contact with the organic semiconductor layer. Here, the gate electrode may have a structure by which a current pathway flowing from a source electrode to a drain electrode can be formed and the quantity of current passing the current pathway can be controlled by voltage applied to the gate electrode, and for example, a comb-shaped electrode is mentioned. Also in the electrostatic induction organic film transistor, the organic semiconductor layer is constituted of the film of the present invention.

The organic semiconductor layer may partially contain a solvent and other unavoidable components used in production. The thickness is preferably 1 nm to 100 μm, more preferably 2 nm to 1000 nm, further preferably 5 nm to 500 nm, particularly preferably 20 nm to 200 nm, from the standpoint of having excellent carrier transportability and from the standpoint of easily forming an organic film having sufficient strength.

As the gate insulation layer, a gate insulation film composed of an inorganic insulator or an organic insulator can be used. The inorganic insulator includes silicon oxide, silicon nitride, aluminum oxide, aluminum nitride and titanium oxide. The organic insulator includes polyethylene, polyester, polyimide, polyphenylene sulfide, organic glass, polyvinyl alcohol, polyvinyl phenol, poly-p-xylene and polyacrylonitrile. The inorganic insulator and the organic insulator may each be used singly or two or more of them may be used in combination. The thickness of the gate insulation layer is preferably 50 to 1000 nm.

In the gate electrode, materials such as metals such as gold, platinum, silver, copper, chromium, palladium, aluminum, indium, molybdenum, low resistance polysilicon, low resistance amorphous silicon and the like and tin oxide, indium oxide, indium.tin oxide (ITO) and the like can be used. These materials may be each used singly or two or more of them may be used in combination. Further, as the gate electrode, a silicon substrate doped at high concentration may be used. The silicon substrate doped at high concentration has a nature as a gate electrode and a nature as a substrate together. Hence, in the case of use of the silicon substrate doped at high concentration, representation of a substrate in the following figures may be omitted, in an organic film transistor in which a substrate and a gate electrode are in contact. The thickness of the gate electrode is preferably 0.02 to 100 μm.

The source electrode and the drain electrode are preferably constituted of a low resistance material, and the thicknesses of the source electrode and the drain electrode are each preferably 0.02 to 1000 μm.

The substrate includes a glass substrate, a flexible film substrate, a plastic substrate and the like. The thickness of the substrate is preferably 10 to 2000 μm.

In an organic film transistor, a layer composed of a compound different from an organic semiconductor material contained in an organic semiconductor layer may be allowed to intervene between source and drain electrodes and the organic semiconductor layer. By intervention of such a layer, contact resistance between source and drain electrodes and the organic semiconductor layer is reduced and the carrier mobility of the organic film transistor can be further enhanced in some cases.

The layer containing a compound different from the film of the present invention as an organic semiconductor layer includes layers containing, for example, low molecular weight compounds having electron or hole transportability; alkali metals, alkaline earth metals, rare earth metals, complexes of these metals with an organic compound; halogens such as iodine, bromine, chlorine, iodine chloride and the like; sulfur oxide compounds such as sulfuric acid, anhydrous sulfuric acid, sulfur dioxide, sulfuric acid salt and the like; nitrogen oxide compounds such as nitric acid, nitrogen dioxide, nitric acid salt and the like; halogenated compounds such as perchloric acid, hypochlorous acid and the like; aromatic thiol compounds such as alkylthiol compounds, aromatic thiols, fluorinated alkyl aromatic thiols and the like.

Next, a typical example of an electric field effect organic film transistor will be illustrated referring to drawings.

FIG. 1 is a schematic cross-sectional view an organic film transistor (electric field effect organic film transistor) according to a first embodiment. The organic film transistor 100 shown in FIG. 1 has a substrate 1, a source electrode 5 and a drain electrode 6 formed at a prescribed interval on the substrate 1, an organic semiconductor layer 2 so formed on the substrate 1 as to over the source electrode 5 and the drain electrode 6, an insulation layer 3 formed on the organic semiconductor layer 2, and a gate electrode 4 so formed on the insulation layer 3 as to cover a region of the insulation layer 3 between the source electrode 5 and the drain electrode 6.

FIG. 2 is a schematic cross-sectional view of an organic film transistor (electric field effect organic film transistor) according to a second embodiment. The organic film transistor 110 shown in FIG. 2 has a substrate 1, a source electrode 5 formed on the substrate 1, an organic semiconductor layer 2 so formed on the substrate 1 as to cover the source electrode 5, a drain electrode 6 formed at a prescribed interval from the source electrode 5 on the organic semiconductor layer 2, an insulation layer 3 formed on the organic semiconductor layer 2 and the drain electrode 6, and a gate electrode 4 so formed on the insulation layer 3 as to cover a region of the insulation layer 3 between the source electrode 5 and the drain electrode 6.

FIG. 3 is a schematic cross-sectional view of an organic film transistor (electric field effect organic film transistor) according to a third embodiment. The organic film transistor 120 shown in FIG. 3 has a substrate 1, a gate electrode 4 formed on the substrate 1, an insulation layer 3 so formed on the substrate 1 as to cover the gate electrode 4, a source electrode 5 and a drain electrode 6 so formed at a prescribed interval on the insulation layer 3 as to partially cover a region of the insulation layer 3 where the gate electrode 4 is formed beneath, and an organic semiconductor layer 2 so formed on the insulation layer 3 as to partially cover the source electrode 5 and the drain electrode 6.

FIG. 4 is a schematic cross-sectional view of an organic film transistor (electric field effect organic film transistor) according to a fourth embodiment. The organic film transistor 130 shown in FIG. 4 has a substrate 1, a gate electrode 4 formed on the substrate 1, an insulation layer 3 so formed on the substrate 1 as to cover the gate electrode 4, a source electrode 5 so formed on the insulation layer 3 as to partially cover a region of the insulation layer 3 where the gate electrode 4 is formed beneath, an organic semiconductor layer 2 so formed on the insulation layer 3 as to partially cover the source electrode 5, and a drain electrode 6 so formed on the insulation layer 3 at a prescribed interval from the source electrode 5 as to partially cover a region of the organic semiconductor layer 2 where the gate electrode 4 is formed beneath.

FIG. 5 is a schematic cross-sectional view of an organic film transistor (electrostatic induction organic film transistor) according to a fifth embodiment. The organic film transistor 140 shown in FIG. 5 has a substrate 1, a source electrode 5 formed on the substrate 1, an organic semiconductor layer 2 formed on the source electrode 5, a plurality of gate electrodes 4 formed at a prescribed interval on the organic semiconductor layer 2, an organic semiconductor layer 2a so formed on the organic semiconductor layer 2 as to cover all the gate electrodes 4 (the material constituting the organic semiconductor layer 2a may be the same as or different from that of the organic semiconductor layer 2), and a drain electrode 6 formed on the organic semiconductor layer 2a.

FIG. 6 is a schematic cross-sectional view of an organic film transistor (electric field effect organic film transistor) according to a sixth embodiment. The organic film transistor 150 shown in FIG. 6 has a substrate 1, an organic semiconductor layer 2 formed on the substrate 1, a source electrode 5 and a drain electrode 6 formed at a prescribed interval on the organic semiconductor layer 2, an insulation layer 3 so formed on the organic semiconductor layer 2 as to partially cover the source electrode 5 and the drain electrode 6, and a gate electrode 4 so formed on the insulation layer 3 as to partially cover a region of the insulation layer 3 where the source electrode 5 is formed beneath and a region of the insulation layer 3 where the drain electrode 6 is formed beneath respectively.

FIG. 7 is a schematic cross-sectional view of an organic film transistor (electric field effect organic film transistor) according to a seventh embodiment. The organic film transistor 160 shown in FIG. 7 has a substrate 1, a gate electrode 4 formed on the substrate 1, an insulation layer 3 so formed on the substrate 1 as to cover the gate electrode 4, an organic semiconductor layer 2 so formed as to cover a region of the insulation layer 3 where the gate electrode 4 is formed beneath, a source electrode 5 so formed on the organic semiconductor layer 2 as to partially cover a region of the organic semiconductor layer 2 where the gate electrode 4 is formed beneath, and a drain electrode 6 so formed on the organic semiconductor layer 2 at a prescribed interval from the source electrode 5 as to partially cover a region of the organic semiconductor layer 2 where the gate electrode 4 is formed beneath.

In the organic film transistors according to the first to seventh embodiments, the organic semiconductor layer 2 and/or the organic semiconductor layer 2a is constituted of the film of the present invention, thereby providing a current pathway (channel) between the source electrode 5 and the drain electrode 6. The gate electrode 4 controls the quantity of current passing a current pathway (channel) in the organic semiconductor layer 2 and/or the organic semiconductor layer 2a by applying voltage.

<Production Method of Organic Film Transistor>

The method of producing an organic film transistor will be illustrated below, referring to the organic film transistor according to the first embodiment shown in FIG. 3 by way of example.

A substrate 1 is not particularly restricted providing it does not disturb a property as an organic film transistor, and a glass substrate, a flexible film substrate and a plastic substrate can also be used.

First, a gate electrode 4 is formed on the substrate 1 by a vapor deposition method, a sputtering method, a plating method, a CVD method and the like. As the gate electrode 4, an n-type silicon substrate doped at high concentration may be used.

Next, an insulation layer 3 is formed on the gate electrode 4 by a CVD method, a plasma CVD method, a plasma polymerization method, a thermal vapor deposition method, a thermal oxidation method, an anodization method, a cluster ion beam vapor deposition method, an LB method, a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method and the like. In the case of use of an n-type silicon substrate doped at high concentration as the gate electrode 4, its surface can be thermally oxidized to form a film of silicon oxide, and this film of silicon oxide may also be used as the insulation layer 3.

Next, a source electrode 5 and a drain electrode 6 are formed on the insulation layer 3 by a vapor deposition method, a sputtering method, a plating method, a CVD method and the like. Though not illustrated in FIG. 3, a layer promoting charge injection may be provided thereafter between the source electrode 5 and the drain electrode 6 and an organic semiconductor layer 2.

When the organic semiconductor layer 2 is formed on the insulation layer 3, it is preferable to use the ink composition described above from the standpoint of production. The organic film transistor of the present invention can be produced using an ink composition by a spin coat method, a casting method, a push coat method, a micro gravure coat method, a gravure coat method, a bar coat method, a roll coat method, a wire bar coat method, a dip coat method, a spray coat method, a screen printing method, a flexo printing method, an offset printing method, an inkjet printing method, a micro contact printing method, a gravure-offset printing method and the like.

After fabrication of an organic film transistor, a protective film is preferably formed on the organic film transistor for protecting the device. By this protective film, the organic film transistor is isolated from atmospheric air and lowering of a property of the organic film transistor can be suppressed. Further, an influence in forming a driving display device on the organic film transistor can be reduced by the protective film.

The method of forming the protective film includes methods of covering with an UV hardening resin, a thermosetting resin, an inorganic SiONx film and the like. For effectively isolating form atmospheric air, it is preferable that a process from fabrication of an organic film transistor until formation of a protective film is conducted without exposing to atmospheric air (for example, in a dried nitrogen atmosphere, in vacuo and the like).

The organic film transistor of the present invention can be suitably used for an organic electroluminescent device, an electronic tag and a liquid crystal display.

The composition or the polymer compound of the present invention can also be used for production of an OFET sensor. In the OFET sensor of the present invention, an organic electric field effect transistor is used as a signal conversion device in outputting an input signal as an electric signal, and sensitivity function or selectivity function is imparted to any structure of a metal, an insulation film and an organic semiconductor layer. The OFET sensor of the present invention includes, for example, a biosensor, a gas sensor, an ion sensor and a humidity sensor.

The biosensor has a substrate and an organic film transistor disposed on the substrate. The organic film transistor has an organic semiconductor layer, a source region and a drain region disposed in contact with the organic semiconductor, a channel region in the organic semiconductor layer disposed between the source region and the drain region, a gate electrode capable of applying electric filed on the channel region, and a gate insulation film disposed between the channel region and the gate electrode. The organic film transistor has a probe (sensitive region) specifically interacting with a standard substance in the channel region and/or the gate insulation film, and when the concentration of the standard substance changes, a characteristic change occurs in the probe, providing the function as a biosensor.

The means for detecting the standard substance in a test sample includes, for example, biosensors in which biomolecules such as nucleic acids, proteins and the like or artificially synthesized functional groups are fixed as a probe to the surface of a solid phase support.

In this method, the standard substance is captured to the surface of a solid phase support by utilizing specific affinity of biomolecules such as a mutual action of complementary nucleic acid chains, a mutual action of an antigen-antibody reaction, a mutual action of an enzyme-substrate reaction, a receptor-ligand mutual action and the like. Therefore, a substance showing specific affinity with the standard substance is selected as a probe.

The probe is fixed to the surface of a solid phase support by a method according to the kind of the probe and the kind of the solid phase support. Alternatively, it is also possible to synthesize a probe on the surface of a solid phase support (for example, a method of synthesizing a probe by a nucleic acid elongating reaction). In any cases, the probe-fixed solid phase support surface is brought into contact with a test sample, and culturing is performed under suitable conditions, thus, a probe-standard substance complex is formed on the surface of the solid phase support. The channel region and/or the gate insulation film itself of the organic film transistor may function as a probe.

The gas sensor has a substrate and an organic film transistor disposed on the substrate. The organic film transistor has an organic semiconductor layer, a source region and a drain region disposed in contact with the organic semiconductor, a channel region in the semiconductor layer disposed between the source region and the drain region, a gate electrode capable of applying electric field to the channel region, and a gate insulation film disposed between the channel region and the gate electrode. The channel region and/or the gate insulation film of the organic film transistor functions as a gas sensitive part. When a detection gas is adsorbed to or desorbed from the gas sensitive part, characteristic changes (of electric conductivity, dielectric constant and the like) occur on the gas sensitive part, providing a function as a gas sensor.

The gas to be detected includes, for example, an electron accepting gas and an electron donating gas. The electron accepting gas includes, for example, gases of halogens such as $F_2$, $Cl_2$ and the like; nitrogen oxide gases; sulfur oxide gases; and gases of organic acids such as acetic acid and the like. The electron donating gas includes, for example, an ammonia gas; gases of amines such as aniline and the like; a carbon monoxide gas; and a hydrogen gas.

The composition or the polymer compound of the present invention can also be used for production of a pressure sensor. The pressure sensor of the present invention has a substrate and an organic film transistor provided on the substrate. The organic film transistor has an organic semiconductor layer, a source region and a drain region disposed in contact with the organic semiconductor, a channel region in the organic semiconductor layer disposed between the source region and the drain region, a gate electrode capable of applying electric field on the channel region, and a gate insulation film disposed between the channel region and the gate electrode. The channel region and/or the gate insulation film of the organic film transistor functions as a pressure sensitive part. When the pressure sensitive part senses pressure, a characteristic change occurs on the pressure sensitive part, providing a function as a pressure sensor.

When the gate insulation film functions as a pressure sensitive part, it is preferable that the gate insulation film contains an organic material, since an organic material is excellent in flexibility and a stretching property as compared with an inorganic material.

When the channel region functions as a pressure sensitive part, the organic film transistor may further have an orientation layer for further enhancing crystallinity of an organic semiconductor contained in the channel region. The orientation layer includes, for example, a monomolecular film formed on the gate insulation film by using a silane coupling agent such as hexamethyldisilazane and the like.

The composition or the polymer compound of the present invention can also be used for production of a conductivity modulation type sensor. The conductivity modulation type sensor of the present invention uses a conductivity measuring device as a signal conversion device in outputting an input signal as an electric signal, and sensitivity function or selectivity function against sensor target input is imparted to a film containing the composition or the polymer compound of the present invention or to a coat of a film containing the composition or the polymer compound of the present invention. The conductivity modulation type sensor of the present invention detects the sensor target input as a variation of conductivity of the composition or the polymer compound of the present invention. The conductivity modulation type sensor of the present invention includes, for example, a biosensor, a gas sensor, an ion sensor and a humidity sensor.

The composition or the polymer compound of the present invention can also be used for production of an amplifying circuit containing an organic electric field effect transistor as an amplifying circuit for amplifying the output signal from various sensors such as a biosensor, a gas sensor, an ion sensor, a humidity sensor, a pressure sensor and the like formed separately.

The composition or the polymer compound of the present invention can also be used for production of a sensor array containing a plurality of various sensors such as a biosensor, a gas sensor, an ion sensor, a humidity sensor, a pressure sensor and the like.

Further, the composition or the polymer compound of the present invention can also be used for production of an amplifying circuit-equipped sensor array containing a plurality of various sensors such as a biosensor, a gas sensor, an ion sensor, a humidity sensor, a pressure sensor and the like formed separately and containing an organic electric field effect transistor as an amplifying circuit for individually amplifying the output signal from each sensor.

EXAMPLES

Examples are shown below for illustrating the present invention further in detail, but the present invention is not limited to them.

(NMR Analysis)

For NMR measurement, a compound was dissolved in deuterated chloroform, and NMR thereof was measured by an NMR apparatus (INOVA300 manufactured by Varian).

(Molecular Weight Analysis)

The number-average molecular weight and the weight-average molecular weight of a polymer compound were determined using gel permeation chromatography (GPC, manufactured by Waters, trade name: Alliance GPC 2000). The polymer compound to be measured was dissolved in ortho dichlorobenzene, and the solution was injected into GPC.

As the mobile phase of GPC, ortho dichlorobenzene was used. As the column, TSKgel GMHHR-H(S)HT (two columns are connected, manufactured by Tosoh Corp.) was used. As the detector, an UV detector was used.

(Measurement by Film X-Ray Diffraction Method)

Measurement by a film X-ray diffraction method was conducted according to the following conditions using an X ray diffraction apparatus (NanoSTAR) manufactured by Bruker.

Incident X ray wavelength: 1.54 Å
Incident X ray angle: 0.180°
Incident X ray beam size: diameter 1 mm
Sample length: 2 mm
Distance between sample and detector: 150 mm
Sample chamber atmosphere: 50 pascal or less vacuum
Measurement temperature: room temperature
Substrate: silicon substrate
X ray generator: Cu-targeted rotating anticathode type (output: 50 kV, 100 mA)
Detector: imaging plate detector (BAS-MS2025, manufactured by Fujifilm Corporation)
Setting of sample: set so that the length in a direction parallel to the incident X ray is 2 mm
X ray irradiation time:
100 min (In-plane measurement method)
720 min (Out-of-plane measurement method)

(Measurement by Time Of Flight Type Secondary Ion Mass Spectrometry (TOF-SIMS Method))

Measurement by a TOF-SIMS method was conducted according to the following conditions using TOF-SIMSV manufactured by ION-TOF.

Primary ion: $Bi^+$
Measurement area: 300 μm square
Mass spectrum: negative mass spectrum
Cumulated number: 32 times
Dose of primary ion: $3.6 \times 10^{11}$ ion/cm$^2$
Charge correction: low acceleration electron gun is used Synthesis Example 1

(Synthesis of Compound 2)

[chemical formula 46]

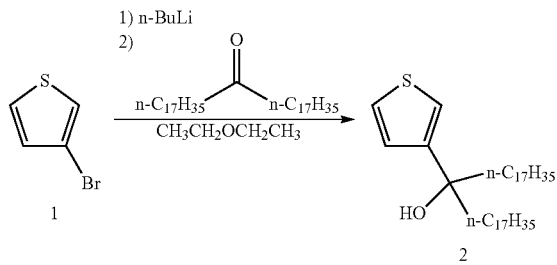

A nitrogen gas atmosphere was prepared in a reaction vessel, then, a compound 1 (32 g, 0.20 mol) and dehydrated diethyl ether (470 mL) were added, and a uniform solution was prepared. While keeping the resultant solution at −68° C., a 1.60 M n-butyllithium hexane solution (135 mL, 0.22 mol) was dropped over a period of 30 minutes. Thereafter, the mixture was stirred for 2 hours at −68° C. Thereafter, to this was added 18-pentriacontanone (69.7 g, 0.14 mol), and the mixture was stirred for 10 minutes at −78° C., then, the mixture was stirred for 5 hours at room temperature (25° C.). Thereafter, water (200 mL) was added to this to stop the reaction, and a 10 wt % acetic acid aqueous solution was added to make the reaction solution acidic. Thereafter, the reaction product was extracted using hexane. The resultant organic layer was washed with water, dried over anhydrous magnesium sulfate, and filtrated. The resultant filtrate was concentrated by an evaporator, then, the solvent was distilled off, to obtain 125 g of a compound 2. The yield was 100%.

$^1$H-NMR (300 MHz, CDCl$_3$): δ (ppm)=0.88 (t, 6H), 1.25 (m, 60H), 1.75 (m, 4H), 6.96 (d, 1H), 7.27 (d, 1H).

Synthesis Example 2

(Synthesis of Compound 3)

[chemical formula 47]

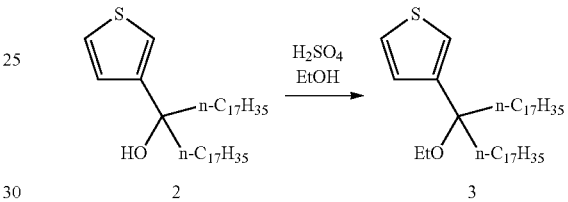

A nitrogen gas atmosphere was prepared in a reaction vessel, then, the compound 2 (232 g, 0.39 mol), dehydrated ethanol (880 mL) and hexane (350 mL) were added, and a suspension was prepared. To the resultant suspension was added 96 wt % concentrated sulfuric acid (31 mL, 0.59 mol), then, the mixture was stirred at room temperature for 6 hours. Thereafter, water (200 mL) was added to this to stop the reaction, and the reaction product was extracted using hexane. The resultant organic layer was washed with water, dried over anhydrous magnesium sulfate, and filtrated. The resultant filtrate was concentrated by an evaporator, then, the solvent was distilled off. The resultant residue was purified using silica gel column chromatography using hexane as a moving bed, to obtain 104 g of a compound 3. The yield was 43%.

$^1$H-NMR (300 MHz, CDCl$_3$): δ (ppm)=0.88 (t, 6H), 1.13 (t, 3H), 1.24 (m, 60H), 1.77 (m, 4H), 3.15 (q, 2H), 7.05 (m, 2H), 7.24 (d, 1H).

Synthesis Example 3

(Synthesis of Compound 4)

[chemical formula 48]

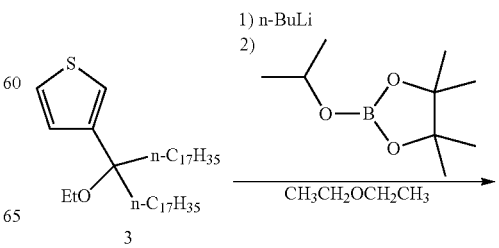

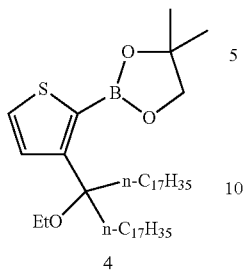

4

A nitrogen gas atmosphere was prepared in a reaction vessel, then, the compound 3 (104 g, 0.17 mol) and dehydrated diethyl ether (1020 mL) were added, and a uniform solution was prepared. While keeping the resultant solution at −68° C., a 1.60 M n-butyllithium hexane solution (136 mL, 0.22 mol) was dropped over a period of 10 minutes. Thereafter, the mixture was stirred for 10 minutes at −68° C., then, the mixture was stirred for 1.5 hours at room temperature (25° C.). Thereafter, while keeping the resultant solution at −68° C., 2-isopropoxy-4,4,5,5-tetramethyl-1,3,2-dioxaborolane (62.5 g, 0.34 mmol) was added. Thereafter, the mixture was stirred for 10 minutes at −68° C., then, the mixture was stirred for 2 hours at room temperature (25° C.). Thereafter, water (100 mL) was added to this to stop the reaction, and the reaction product was extracted using diethyl ether. The resultant organic layer was washed with water, dried over anhydrous magnesium sulfate, and filtrated. The resultant filtrate was concentrated by an evaporator, then, the solvent was distilled off, to obtain 117 g of a compound 4. The yield was 93%.

$^1$H-NMR (300 MHz, CDCl$_3$): δ (ppm)=0.88 (t, 6H), 1.24 (m, 75H), 1.99 (m, 4H), 3.22 (q, 2H), 7.26 (d, 1H), 7.42 (d, 1H).

Synthesis Example 4

(Synthesis of Compound 6)

[chemical formula 49]

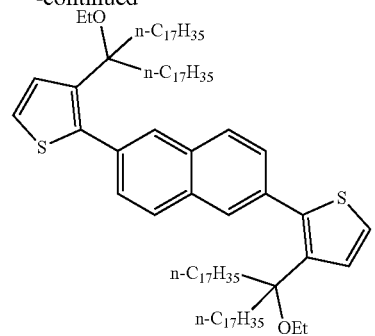

6

A nitrogen gas atmosphere was prepared in a reaction vessel equipped with a reflux condenser, then, a compound 5 (4.80 g, 16.8 mmol) and dry THF (280 mL) were added, and the mixture was deaerated for 30 minutes by bubbling with an argon gas. Thereafter, to this were added tris (dibenzylideneacetone)dipalladium(0) (769 mg, 0.839 mmol), tri-tert-butylphosphonium tetrafluoroborate (1.02 g, 3.36 mmol) and a 3 M potassium phosphate aqueous solution (84 mL), and the mixture was heated at 80° C. Thereafter, a dry THF (170 mL) solution of the compound 4 (44.7 g, 42.0 mmol) which had been deaerated for 30 minutes by bubbling with an argon gas was dropped into this at 80° C. over a period of 5 minutes, and the mixture was heated at the same temperature for 4.5 hours. Thereafter, the reaction product was extracted using hexane (200 mL). The resultant organic layer was washed with saturated saline, dried over anhydrous magnesium sulfate, and filtrated. The resultant filtrate was concentrated by an evaporator, then, the solvent was distilled off. The resultant residue was purified using silica gel column chromatography using a mixed solvent of hexane and chloroform as a moving bed, to obtain 6.8 g of a compound 6. The yield was 30%. This procedure was repeated, to obtain a necessary amount of the compound 6.

$^1$H-NMR (300 MHz, CDCl$_3$): δ (ppm)=0.88 (t, 12H), 0.98 (t, 6H), 1.24 (m, 120H), 1.66 (m, 8H), 3.21 (q, 4H), 7.10 (d, 2H), 7.22 (d, 2H), 7.53 (d, 2H), 7.74 (d, 2H), 7.85 (s, 2H)

Synthesis Example 5

(Synthesis of Compound 7)

[chemical formula 50]

-continued

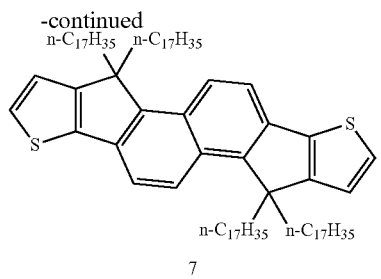

7

A nitrogen gas atmosphere was prepared in a reaction vessel, then, the compound 6 (7.68 g, 5.78 mmol) and dry methylene chloride (190 mL) were added. Thereafter, to this was added a 1 M boron tribromide methylene chloride solution (23.1 mL, 23.1 mmol) at −78° C., then, the mixture was heated up to room temperature, and stirred at room temperature for 4 hours. Thereafter, to this was added water, and the reaction product was extracted using chloroform. The resultant organic layer was washed with water, dried over anhydrous magnesium sulfate, and filtrated. The resultant filtrate was concentrated by an evaporator, then, the solvent was distilled off. The resultant residue was purified using silica gel column chromatography using hexane as a moving bed, to obtain 4.78 g a compound 7. The yield was 67%.

$^1$H-NMR (300 MHz, CD$_2$Cl$_2$): δ (ppm)=0.93 (t, 12H), 1.24 (m, 120H), 2.35 (m, 8H), 7.13 (d, 2H), 7.40 (d, 2H), 7.74 (d, 2H), 8.18 (d, 2H).

Synthesis Example 6

(Synthesis of Compound 8)

[chemical formula 51]

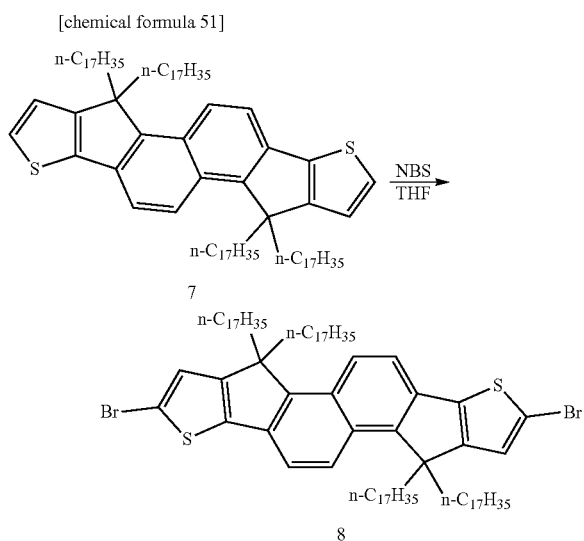

A nitrogen gas atmosphere was prepared in a reaction vessel, then, the compound 7 (4.77 g, 3.78 mmol) and dry THF (375 mL) were added. Thereafter, to this was added N-bromosuccinic imide (1.47 g, 8.26 mmol) at room temperature, and the mixture was stirred at room temperature for 3 hours. Thereafter, to this were added a saturated sodium thiosulfate aqueous solution (10 mL) and water (20 mL), and the mixture was stirred for 5 minutes. Thereafter, the reaction product was extracted using hexane. The resultant organic layer was washed with water, dried over anhydrous magnesium sulfate, and filtrated. The resultant filtrate was concentrated by an evaporator, then, the solvent was distilled off. The resultant residue was purified using silica gel column chromatography using hexane as a moving bed, and recrystallized using hexane, to obtain 4.06 g of a compound 8. The yield was 76%.

$^1$H-NMR (300 MHz, CDCl$_3$): δ (ppm)=0.88 (t, 12H), 1.24 (m, 120H), 2.22 (m, 8H), 7.052 (s, 2H), 7.57 (d, 2H), 7.04 (d, 2H).

Synthesis Example 7

(Synthesis of Polymer Compound A)

[chemical formula 52]

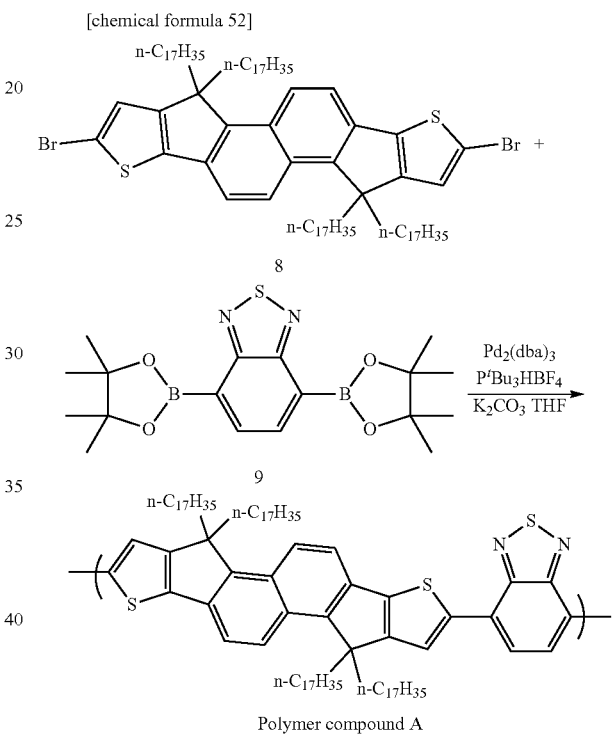

Polymer compound A

A nitrogen gas atmosphere was prepared in a reaction vessel, then, the compound 8 (0.285 g, 0.200 mmol), a compound 9 (0.078 g, 0.200 mmol), tetrahydrofuran (20 mL), tris(dibenzylideneacetone)dipalladium (3.7 mg) and tri-tert-butylphosphonium tetrafluoroborate (4.6 mg) were added, and the mixture was stirred. Thereafter, to this was added a 2 mol/L potassium carbonate aqueous solution (100 mL), and the mixture was heated up to 80° C., then, the mixture was stirred for 5 hours at 80° C. Thereafter, to this was added phenylboronic acid (10.0 mg), and the mixture was stirred for 1 hour at 80° C. Thereafter, to this was added sodium N,N-diethyldithiocarbamate trihydrate (0.1 g), and the mixture was stirred for 3 hours at 80° C. The resultant reaction liquid was dropped into water, then, extracted using toluene. The resultant organic layer was washed with an acetic acid aqueous solution and water, then, purified using a silica gel column. The resultant organic layer was dropped into acetone, to obtain a deposit. The resultant deposit was washed by a Soxhlet apparatus using acetone as a solvent, and dried, to obtain a polymer compound A. The amount obtained was 260 mg, and the polymer compound had a Synthesis Example 8

(Synthesis of Polymer Compound B)

[chemical formula 53]

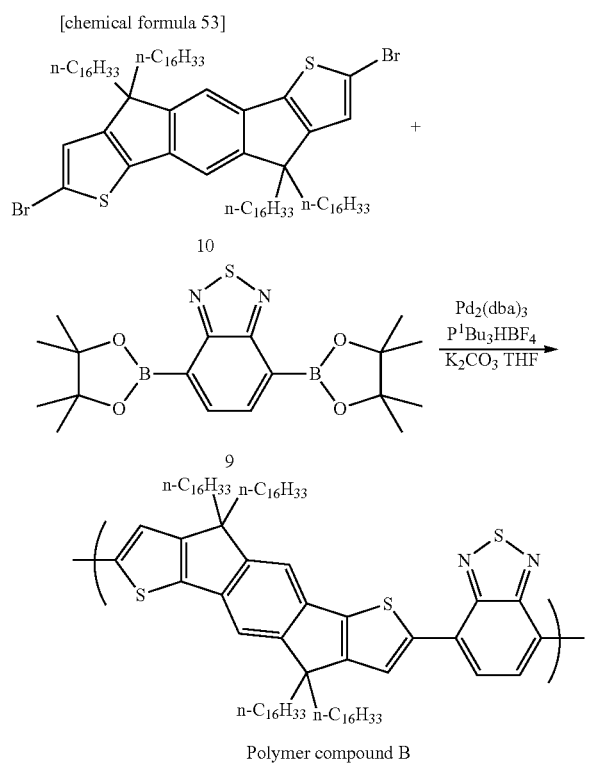

Polymer compound B

A nitrogen gas atmosphere was prepared in a reaction vessel, then, a compound 9 (0.300 g, 0.227 mmol), a compound 10 (0.0881 g, 0.227 mmol) synthesized according to a method described in "J. Am. Chem. Soc., 2010, 132, 11437-11439", tetrahydrofuran (30 mL), tris(dibenzylideneacetone)dipalladium (4.2 mg) and tri-tert-butylphosphonium tetrafluoroborate (5.3 mg) were added, and the mixture was stirred. Thereafter, to this was added a 2 mol/L potassium carbonate aqueous solution (1.13 mL), and the mixture was heated up to 80° C., then, the mixture was stirred for 5 hours at 80° C. Thereafter, to this was added phenylboronic acid (10.0 mg), and the mixture was stirred for 1 hour at 80° C. Thereafter, to this was added sodium N,N-diethyldithiocarbamate trihydrate (0.1 g), and the mixture was stirred for 3 hours at 80° C. The resultant reaction liquid was dropped into water, then, extracted using toluene. The resultant organic layer was washed with an acetic acid aqueous solution and water, then, purified using a silica gel column. The resultant organic layer was dropped into acetone, to obtain a deposit. The resultant deposit was washed by a Soxhlet apparatus using acetone as a solvent, to obtain a polymer compound B. The amount obtained was 272 mg, and the polymer compound had a polystyrene-equivalent number-average molecular weight of $3.6 \times 10^4$ and a polystyrene-equivalent weight-average molecular weight of $1.6 \times 10^5$.

Synthesis Example 9

(Synthesis of Compound 11)

[chemical formula 54]

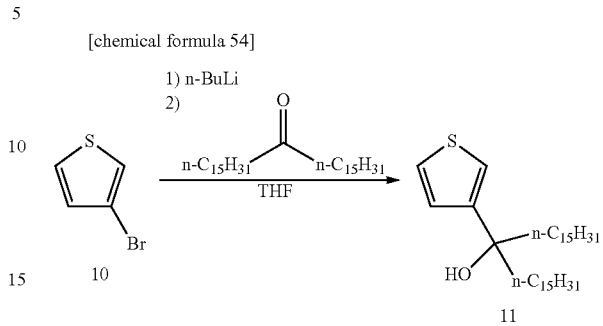

A nitrogen gas atmosphere was prepared in a reaction vessel, then, the compound 10 (16.0 g, 98.1 mmol) and dehydrated diethyl ether (280 mL) were added, and a uniform solution was prepared. While keeping the resultant solution at −68° C., a 1.65 M n-butyllithium hexane solution (65.4 mL, 0.108 mol) was dropped over a period of 10 minutes. Thereafter, the mixture was stirred for 5 hours at −68° C. Thereafter, to this was added 16-hentriacontanone (48.7 g, 0.108 mol), and the mixture was stirred for 10 minutes at −78° C., then, the mixture was stirred for 5 hours at room temperature (25° C.). Thereafter, water (200 mL) was added to this to stop the reaction, and a 10 wt % acetic acid aqueous solution was added to make the reaction solution acidic. Thereafter, the reaction product was extracted using hexane. The resultant organic layer was washed with water, dried over anhydrous magnesium sulfate, and filtrated. The resultant filtrate was concentrated by an evaporator, then, the solvent was distilled off, to obtain 70 g of a compound 11. The yield was 100%.

$^1$H-NMR (300 MHz, CDCl$_3$): δ (ppm)=0.88 (t, 6H), 1.25 (m, 52H), 1.75 (m, 4H), 6.96 (d, 1H), 7.27 (d, 1H).

Synthesis Example 10

(Synthesis of Compound 12)

[chemical formula 55]

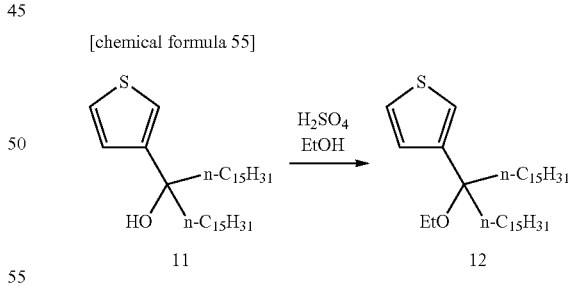

A nitrogen gas atmosphere was prepared in a reaction vessel, then, the compound 11 (53 g, 98 mmol) and dehydrated ethanol (500 mL) were added, and a suspension was prepared. To the resultant suspension was added 96 wt % concentrated sulfuric acid (3.0 mL, 56 mmol), then, the mixture was stirred for 3 hours at room temperature. Thereafter, water (200 mL) was added to this to stop the reaction, and the reaction product was extracted using hexane. The resultant organic layer was washed with water, dried over anhydrous magnesium sulfate, and filtrated. The resultant filtrate was concentrated by an evaporator, then, the solvent was distilled off. The resultant residue was purified using silica gel column chromatography using hexane as a moving bed, to obtain 20.7 g of a compound 12. The yield was 37%.

$^1$H-NMR (300 MHz, CDCl$_3$): δ (ppm)=0.88 (t, 6H), 1.13 (t, 3H), 1.24 (m, 52H), 1.77 (m, 4H), 3.15 (q, 2H), 7.05 (m, 2H), 7.24 (d, 1H).

Synthesis Example 11

(Synthesis of Compound 13)

[chemical formula 56]

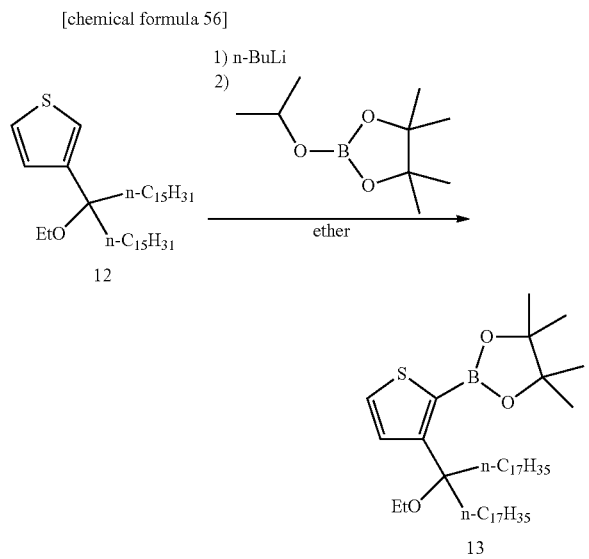

A nitrogen gas atmosphere was prepared in a reaction vessel, then, the compound 12 (2.0 g, 3.6 mmol) and dehydrated diethyl ether (35 mL) were added, and a uniform solution was prepared. While keeping the resultant solution at −68° C., a 1.65 M n-butyllithium hexane solution (2.3 mL, 3.7 mol) was dropped over a period of 10 minutes. Thereafter, the mixture was stirred for 10 minutes at −68° C., then, the mixture was stirred for 1.5 hours at room temperature (25° C.). Thereafter, while keeping the resultant solution at −68° C., 2-isopropoxy-4,4,5,5-tetramethyl-1,3,2-dioxaborolane (0.69 g, 3.7 mmol) was added. Thereafter, the mixture was stirred for 10 minutes at −68° C., then, the mixture was stirred for 2 hours at room temperature (25° C.). Thereafter, water (100 mL) was added to this to stop the reaction, and the reaction product was extracted using diethyl ether. The resultant organic layer was washed with water, dried over anhydrous magnesium sulfate, and filtrated. The resultant filtrate was concentrated by an evaporator, then, the solvent was distilled off, to obtain 2.45 g of a compound 13. The yield was 100%.

$^1$H-NMR (300 MHz, CDCl$_3$): δ (ppm)=1.335 (s, 12H), 1.989 (m, 4H), 3.224 (q, 2H), 7.264 (d, 1H), 7.422 (d, 1H).

Synthesis Example 12

(Synthesis of Compound 14)

[chemical formula 57]

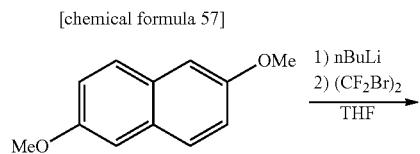

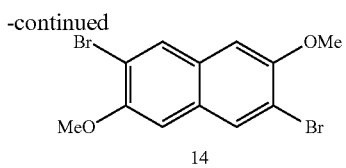

A nitrogen gas atmosphere was prepared in a reaction vessel, then, 2,6-dimethoxynaphthalene (4.00 g, 32.2 mmol) and dehydrated THF (200 mL) were added, and a uniform solution was prepared. Thereafter, a 1.65 M n-butyllithium hexane solution (52 mL, 85 mmol) was dropped into this over a period of 30 minutes, and the mixture was stirred for 78 hours at room temperature. Thereafter, to this was added 1,2-dibromo-1,1,2,2-tetrafluoroethane (22 g, 85 mmol), and the mixture was stirred for 2 hours at room temperature (25° C.). Thereafter, water (200 mL) was added to this to stop the reaction, and the reaction product was extracted using chloroform. The resultant organic layer was washed with water, dried over anhydrous magnesium sulfate, and filtrated. The resultant filtrate was concentrated by an evaporator, then, the solvent was distilled off. The resultant residue was recrystallized using a mixed solvent of chloroform and methanol, to obtain 5.43 g of a compound 14. The yield was 73%.

$^1$H-NMR (300 MHz, CDCl$_3$): δ (ppm)=7.02 (s, 2H), 7.94 (s, 2H).

Synthesis Example 13

(Synthesis of Compound 16)

[chemical formula 58]

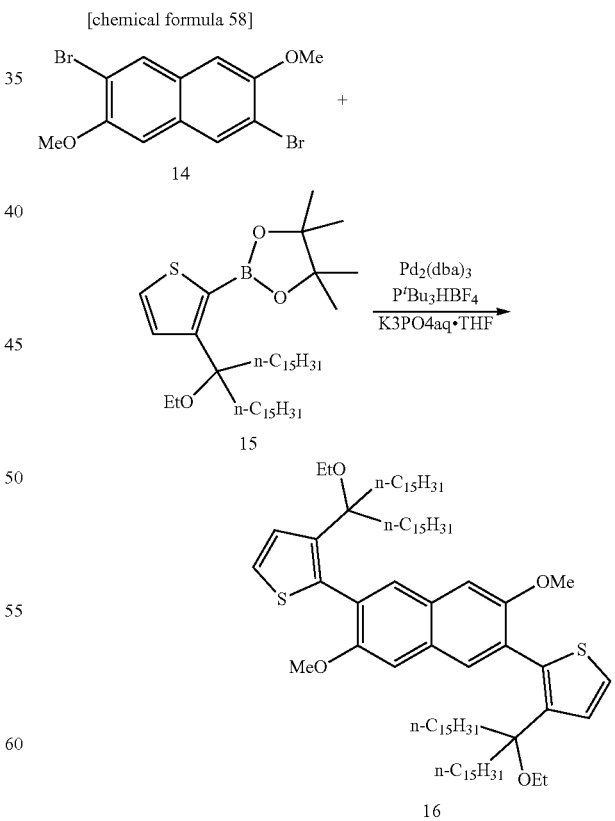

A nitrogen gas atmosphere was prepared in a reaction vessel equipped with a reflux condenser, then, the compound 14 (4.20 g, 12.1 mmol) and dry THF (360 mL) were added, and the mixture was deaerated for 30 minutes by bubbling with argon. Thereafter, to this were added tris(dibenzylideneacetone)dipalladium (0) (556 mg, 0.607 mmol), tri-tert-butylphosphonium tetrafluoroborate (739 mg, 2.43 mmol) and a 3 M potassium phosphate aqueous solution (60 mL, 0.180 mol), and the mixture was heated at 80° C. Thereafter, a dry THF (30 mL) solution of a compound 15 (33.45 g, 48.6 mmol) which had been deaerated for 30 minutes by bubbling with argon was dropped into this at 80° C. over a period of 5 minutes, and the mixture was stirred at the same temperature for 4.5 hours. Thereafter, the reaction product was extracted using hexane (200 mL). The resultant organic layer was washed with saturated saline, dried over anhydrous magnesium sulfate, and filtrated. The resultant filtrate was concentrated by an evaporator, then, the solvent was distilled off. The resultant residue was purified using silica gel column chromatography using a mixed solvent of hexane and chloroform as a moving bed, to obtain 7.3 g of a compound 16. The yield was 46%.

$^1$H-NMR (300 MHz, CDCl$_3$): δ (ppm)=0.88 (t, 12H), 0.98 (t, 6H), 1.24 (m, 104H), 1.56 (m, 8H), 3.22 (q, 4H), 3.78 (s, 6H), 7.15 (d, 2H), 7.28 (d, 2H), 7.36 (d, 2H), 7.85 (d, 2H)

Synthesis Example 14

(Synthesis of Compound 17)

[chemical formula 59]

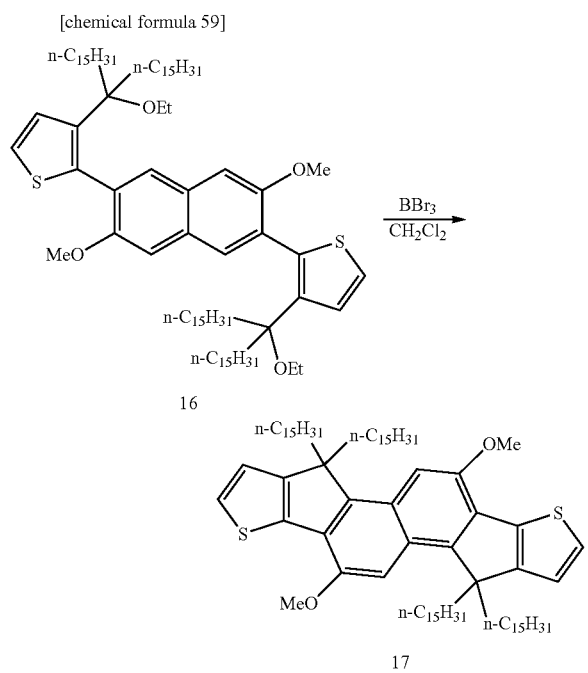

A nitrogen gas atmosphere was prepared in a reaction vessel, then, the compound 16 (4.73 g, 3.61 mmol) and dry methylene chloride (120 mL) were added. Thereafter, to this was added a 1 M boron tribromide methylene chloride solution (14.4 mL, 14.4 mmol) at −50° C., and the mixture was stirred for 4 hours at −50° C. Thereafter, to this was added water at −50° C., and the mixture was heated up to room temperature, then, the reaction product was extracted using chloroform. The resultant organic layer was washed with water, dried over anhydrous magnesium sulfate, and filtrated. The resultant filtrate was concentrated by an evaporator, then, the solvent was distilled off. The resultant residue was purified using silica gel column chromatography using hexane as a moving bed, to obtain 2.33 g of a compound 17. The yield was 53%.

$^1$H-NMR (300 MHz, CDCl$_3$): δ (ppm)=0.88 (t, 12H), 1.24 (m, 104H), 2.26 (m, 8H), 4.10 (s, 6H), 7.03 (d, 2H), 7.35 (d, 2H).

Synthesis Example 15

(Synthesis of Compound 18)

[chemical formula 60]

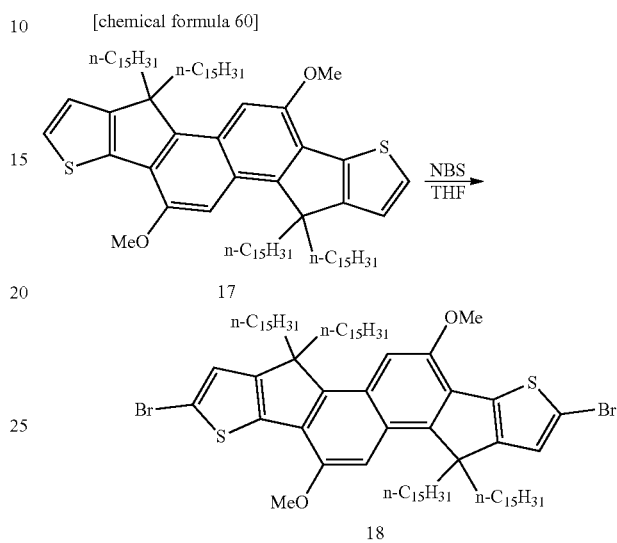

A nitrogen gas atmosphere was prepared in a reaction vessel, then, the compound 17 (2.66 g, 2.18 mmol) and dry THF (220 mL) were added. Thereafter, to this was added N-bromosuccinimide (0.855 g, 4.80 mmol) at room temperature, and the mixture was stirred at room temperature for 3 hours. Thereafter, to this were added a saturated sodium thiosulfate aqueous solution (2 mL) and water (100 mL), and the mixture was stirred for 5 minutes, then, the reaction product was extracted using hexane. The resultant organic layer was washed with water, dried over anhydrous magnesium sulfate, and filtrated. The resultant filtrate was concentrated by an evaporator, then, the solvent was distilled off. The resultant residue was purified using silica gel column chromatography using hexane as a moving bed, and recrystallized using a mixed solvent of hexane and methanol, to obtain 0.67 g of a compound 18. The yield was 22%.

$^1$H-NMR (300 MHz, CDCl$_3$): δ (ppm)=0.85 (t, 12H), 1.24 (m, 104H), 2.16 (m, 8H), 4.08 (s, 6H), 7.04 (s, 2H), 7.25 (s, 2H).

Synthesis Example 16

(Synthesis of Polymer Compound C)

[chemical formula 61]

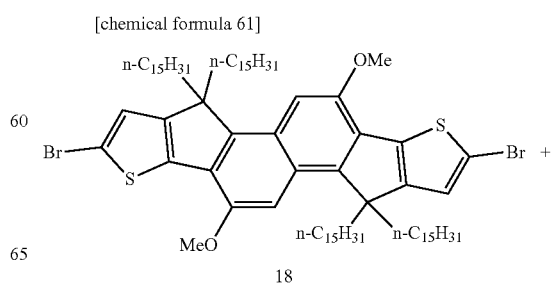

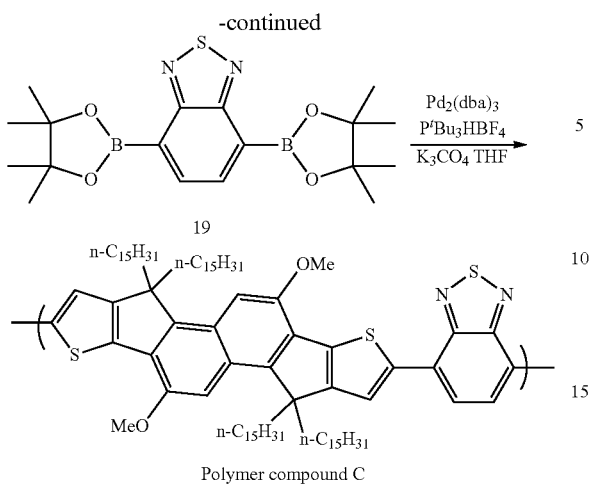

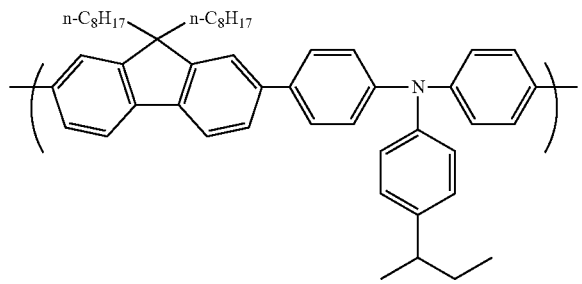

Synthesis Example 18

A nitrogen gas atmosphere was prepared in a reaction vessel equipped with a reflux condenser, then, the compound 18 (137.6 mg, 0.1 mmol) and dry THF (3.5 mL) were added, and the mixture was deaerated for 30 minutes by bubbling with an argon gas. Thereafter, to this were added tris(dibenzylideneacetone)dipalladium (0) (4.58 mg, 5 μmol), tri-tert-butylphosphonium tetrafluoroborate (5.80 mg, 20 μmol), and a 3 M potassium phosphate aqueous solution (0.5 mL, 1.5 mmol) which had been deaerated for 30 minutes by bubbling with an argon gas. The resultant reaction solution was heated up to 80° C., then, a dry THF solution (2.5 mL) of a compound 19 (38.8 mg, 1 mmol) which had been deaerated for 30 minutes by bubbling with an argon gas was dropped, then, the mixture was stirred for 3 hours at 800. Thereafter, to this was added an o-chlorobenzene solution (8 mL) of phenylboric acid (10 mg, 0.082 mmol) which had been deaerated for 30 minutes by bubbling with an argon gas, and the mixture was stirred for 1.5 hours at 80° C. Thereafter, to this were added sodium N,N-diethyldithiocarbamate trihydrate (0.8 g) and water (7.5 g), and the mixture was stirred for 3 hours at 80° C. The organic layer was separated from the resultant reaction solution, then, the resultant organic layer was washed with water and a 10% by weight acetic acid aqueous solution. The resultant organic layer was dropped into acetone (104 mL), to obtain a deposit. The resultant deposit was purified by a silica gel column using o-dichlorobenzene as a developing solvent, then, methanol was poured into the resultant o-dichlorobenzene solution, to obtain a solid. The resultant solid was filtrated, washed by a Soxhlet apparatus using acetone as a solvent, and dried, to obtain 34.0 mg of a polymer compound C. The polystyrene-equivalent number-average molecular weight was $2.2 \times 10^4$ and the polystyrene-equivalent weight-average molecular weight was $4.7 \times 10^5$.

Synthesis Example 17

(Synthesis of Polymer Compound D)

The polymer compound D was synthesized according to a method described in International Publication WO2010/026972.

(Synthesis of Polymer Compound E)

The polymer compound E was synthesized according to a method described in JP-A No. 2012-39103.

[chemical formula 63]

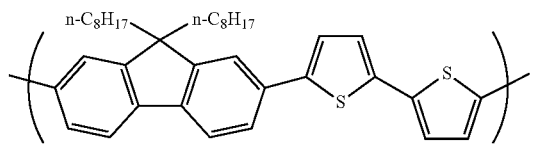

Synthesis Example 19

(Synthesis of Low Molecular Weight Compound a)

The low molecular weight compound a was synthesized according to a method described in "J. Mater. Chem., 2012, 22, 7715".

[chemical formula 64]

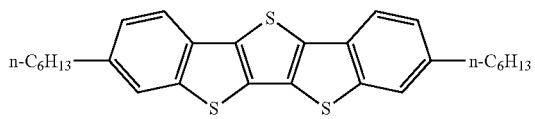

Synthesis Example 20

Synthesis of 1-n-heptyl-4-(4,4,5,5-tetramethyl-1,3,2-dioxaborolan-2-yl)benzene

[chemical formula 65]

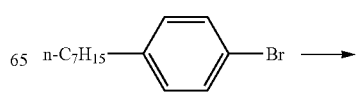

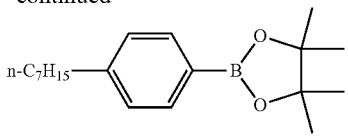

A nitrogen gas atmosphere was prepared in a reaction vessel, then, 1-bromo-4-n-heptylbenzene (25.2 g, 100 mmol) and THF (500 mL) were added, and 1-bromo-4-n-heptylbenzene was dissolved in THF. The resultant solution was cooled down to −78° C., then, a n-BuLi/hexane solution (81.3 mL) (n-BuLi concentration 1.6 M, manufactured by Kanko Kagaku) was dropped over a period of 10 minutes. Thereafter, the mixture was stirred for 30 minutes at −78° C., then, heated up to 0° C. over a period of 45 minutes, and the mixture was stirred for 1 hour at 0° C. The resultant reaction solution was cooled down to −78° C., then, 2-isopropyl-4,4,5,5-tetramethyl-1,3,2-dioxaborolane (24.2 g, 130 mmol) was dropped, and the mixture was stirred for 3 hours at −78° C. Thereafter, the mixture was heated up to room temperature, and the mixture was stirred for 3 hours at room temperature. Saturated saline was added to the resultant reaction solution, and the solution was separated into an organic layer and an aqueous layer. The resultant organic layer was washed with water, then, dried over magnesium sulfate, and concentrated, to obtain 32.8 g of 1-n-pentyloxy-4-(4,4,5,5-tetramethyl-1,3,2-dioxaborolan-2-yl)benzene. The yield was 100%.

Synthesis Example 21

Synthesis of 2,5-bis(4-n-heptylphenyl)-3,4-dimethylsulfanylthiophene

[chemical formula 66]

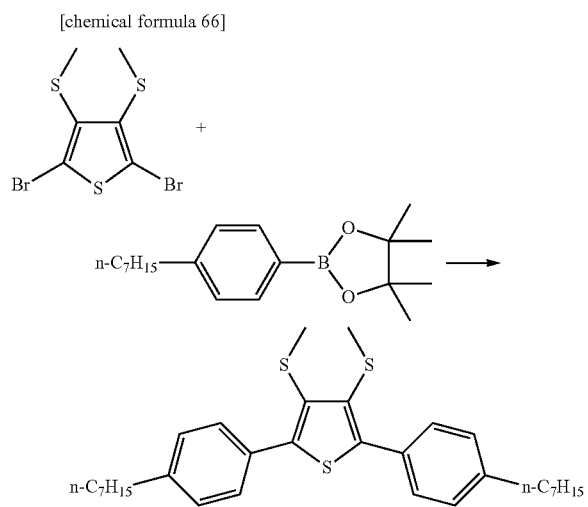

A nitrogen gas atmosphere was prepared in a reaction vessel, then, 2,5-dibromo-3,4-dimethylsulfanylthiophene (12.9 g, 38.5 mmol) synthesized according to a method described in International Publication WO2005/087780 and THF (385 mL) were added, and 2,5-dibromo-3, 4-dimethylsulfanylthiophene was dissolved in THF. To the resultant solution were added 4-n-heptyl-1-(4,4,5,5-tetramethyl-1,3,2-dioxaborolan-2-yl)benzene (30.3 g, 100 mmol) and a sodium carbonate aqueous solution (2.0 M, 115 mL), then, bubbling with a nitrogen gas was performed. Thereafter, to this was added $PdCl_2$ (dppf) (0.63 g, 0.77 mmol), and the mixture was stirred at 85° C. for 7 hours. The resultant reaction solution was cooled down to room temperature, then, an ammonium chloride aqueous solution (200 mL) was added, and the solution was separated into an organic layer and an aqueous layer. The resultant organic layer and a product obtained by extracting the resultant the aqueous layer with THF were mixed. The mixed organic layer was washed with water and a saturated sodium chloride aqueous solution, then, dried over magnesium sulfate and dried, to obtain a coarse product. The resultant coarse product was fractionated using a silica gel column and preparative gel permeation chromatography, to obtain 20.2 g of 2,5-bis(4-n-heptylphenyl)-3,4-dimethylsulfanylthiophene. The yield was 100%.

$^1$H-NMR (300 MHz, $CDCl_3$): δ (ppm)=7.60 (d, J=8.4 Hz, 4H), 7.25 (d, J=8.4 Hz, 4H), 2.65 (t, J=7.6 Hz, 4H), 2.31 (s, 6H), 1.71-1.60 (m, 4H), 1.40-1.29 (m, 16H), 0.90 (t, J=6.8 Hz, 6H)

Synthesis Example 22

Synthesis of 2,5-bis(4-n-heptylphenyl)-3,4-dimethylsulfinylthiophene

[chemical formula 67]

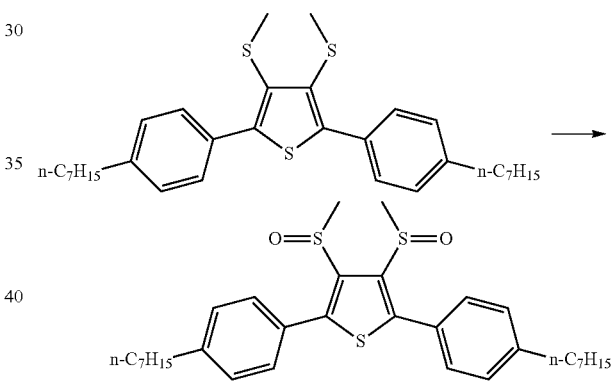

Into a reaction vessel were added 2,5-bis(4-n-heptylphenyl)-3,4-dimethylsulfanylthiophene (20.0 g, 38.0 mmol) and acetic acid (76 mL), and 2,5-bis(4-n-heptylphenyl)-3,4-dimethylsulfanylthiophene was dissolved in acetic acid. A 30% hydrogen peroxide water (2.7 g, 79.8 mmol) was dropped into the resultant solution. The resultant reaction solution was heated up to 50° C., then, stirred for 5.5 hours at 50° C. The resultant reaction solution was cooled down to room temperature, then, a saturated sodium hydrogen carbonate aqueous solution and chloroform (100 mL) were added, and the solution was separated into an organic layer and an aqueous layer. The resultant organic layer and a product obtained by extracting the resultant the aqueous layer with chloroform were mixed. The mixed organic layer was dried over magnesium sulfate and dried, to obtain a coarse product. The resultant coarse product was washed with hexane, to obtain 17.3 g of 2,5-bis(4-n-heptylphenyl)-3,4-dimethylsulfinylthiophene. The yield was 82%.

$^1$H-NMR (300 MHz, $CDCl_3$): δ (ppm)=7.45 (d, J=8.1 Hz, 1.6H), 7.36 (d, J=8.1 Hz, 2.4H), 7.28-7.24 (m, 4H), 3.28 (s, 3.6H), 3.09 (s, 2.4H), 2.70-2.63 (m, 4H), 1.70-1.53 (m, 4H), 1.42-1.28 (m, 16H), 0.92-0.87 (m, 6H).

Synthesis Example 23

(Synthesis of Low Molecular Weight Compound b)

[chemical formula 68]

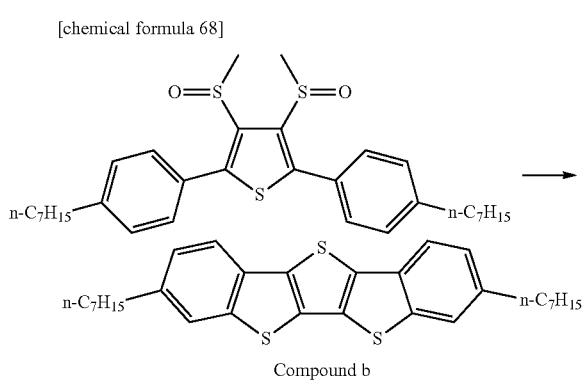

Compound b

Into a reaction vessel was added 96 wt % concentrated sulfuric acid (133.7 mL), and it was cooled to 0° C. Thereafter, to this was added 2,5-bis(4-n-heptylphenyl)-3,4-dimethylsulfinylthiophene (13.4 g, 24.0 mmol), and the mixture was stirred for 5 hours at 0° C. The resultant reaction solution was poured into ice water (500 mL), and a deposited solid was isolated by filtration. The resultant solid was washed with a saturated sodium carbonate aqueous solution, water and methanol in this order, then, recrystallized using toluene, to obtain 5.42 g of a low molecular weight compound b. The yield was 46%.

$^1$H-NMR (300 MHz, CDCl$_3$): δ (ppm)=7.65 (d, J=7.3 Hz, 2H), 7.57 (d, J=1.0 Hz, 2H), 7.19 (dd, J=7.3, 1.0 Hz, 2H), 2.73 (t, J=7.0 Hz, 4H), 1.73-1.63 (m, 4H), 1.40-1.29 (m, 16H), 0.90 (t, J=6.8 Hz, 6H).

Synthesis Example 24

(Synthesis of Low Molecular Weight Compound c)

The low molecular weight compound c was synthesized according to a method described in "Organic Letters, 4 (1), 15-18".

[chemical formula 69]

Low molecular weight compound c

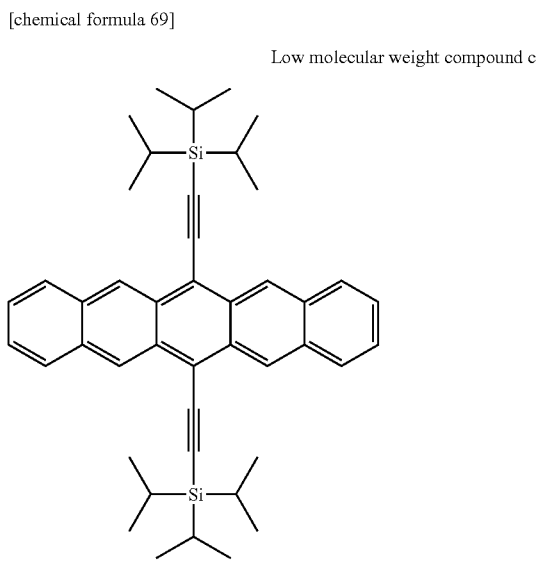

As the low molecular weight compound d, 2,8-difluoro-5,11-bis(triethylsilylethynyl)anthradithiophene manufactured by "Luminescense Technology" was used.

[chemical formula 70]

Low molecular weight compound d

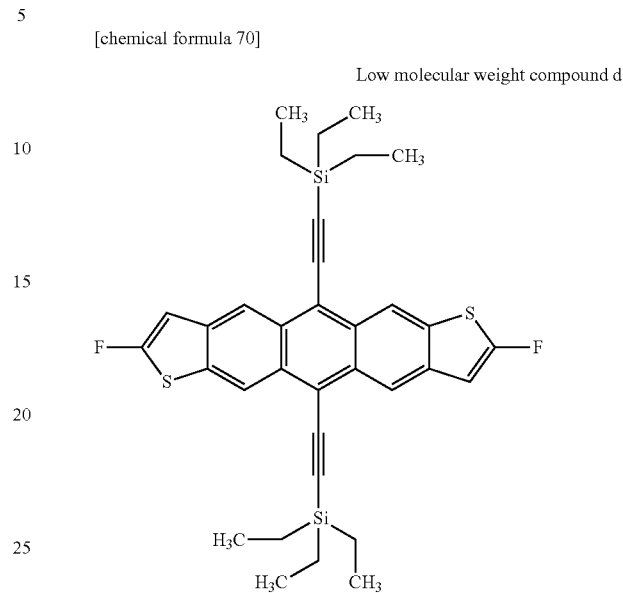

Synthesis Example 25

(Synthesis of Low Molecular Weight Compound e)

The low molecular weight compound e was synthesized according to a method described in "J. Am. Chem. Soc., 2007, 129, 15732-15733".

[chemical formula 71]

Low molecular weight compound e

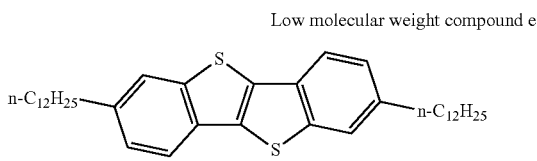

Example 1

(Fabrication and Evaluation of Organic Film Transistor 1)

Using a solution containing the polymer compound B and the low molecular weight compound a, an organic film transistor having a structure shown in FIG. 1 was fabricated.

A glass substrate (substrate 1) was ultrasonically cleaned with acetone for 10 minutes, then, irradiated with ozone UV for 20 minutes.

Next, on this substrate 1, gold acting as a source electrode 5 and a drain electrode 6 was formed by a vapor deposition method using a shadow mask. In this operation, the source electrode 5 and the drain electrode 6 had a channel length of 20 μm and a channel width of 2 mm.

Next, the above-described substrate was immersed in a phenylethyltrichlorosilane toluene solution for 2 minutes, thereby silane-treating the surface of the substrate. Thereafter, the above-described substrate was further immersed in a perfluorobenzenethiol isopropyl alcohol solution for 2 minutes, to modify the surface of the gold electrode formed on the substrate.

Next, a xylene solution containing the polymer compound B and the low molecular weight compound a (0.6% by weight, polymer compound B/low molecular weight compound a=75 parts by mass/25 parts by mass) was prepared, and this xylene solution was filtrated through a membrane filter, to prepare an application solution.

Next, this application solution was spin-coated to form a film having a thickness of 20 nm on the above-described surface-treated substrate 1, the source electrode 5 and the drain electrode 6, and the film was heated on a hot plate at 80° C. for 10 minutes under a nitrogen gas atmosphere, to form an organic semiconductor layer 2.

Next, on this organic semiconductor layer 2, an insulation film made of Teflon (registered trademark) was formed to give a thickness of 445 nm by a spin coat method, and the film was heated on a hot plate at 80° C. for 10 minutes, to form an insulation layer 3.

Next, on this insulation film 3, aluminum acting as a gate electrode 4 was formed by a vapor deposition method using a shadow mask, to fabricate an organic film transistor 1.

Under conditions in which the source-drain voltage Vsd of the resultant organic film transistor 1 was set at −40 V and the gate voltage Vg thereof was varied from 40 to −40 V, the transistor property was measured. The organic film transistor 1 had an electric field effect mobility of 1.05 cm$^2$/Vs.

Measurement Example 1

(Fabrication and Evaluation of Film 1)

A silicon substrate was ultrasonically cleaned with acetone for 10 minutes, then, irradiated with ozone UV for 20 minutes.

Next, the application solution prepared in Example 1 (polymer compound B/low molecular weight compound a=75 parts by mass/25 parts by mass) was spin-coated to form a film having a thickness of 20 nm on the above-described surface-treated silicon substrate, and heated on a hot late at 80° C. for 10 minutes under a nitrogen gas atmosphere, to form a film 1.

A xylene solution containing the polymer compound B (0.6 by weight) was prepared and filtrated through a membrane filter, to prepare an application solution. This application solution was spin-coated to form a film having a thickness of 20 nm on the above-described surface-treated silicon substrate, and the film was heated on a hot plate at 80° C. for 10 minutes under a nitrogen gas atmosphere, to form a film B.

A xylene solution containing the compound a (0.6 by weight) was prepared and filtrated through a membrane filter, to prepare an application solution. This application solution was spin-coated to form a film having a thickness of 20 nm on the above-described surface-treated silicon substrate, and the film was heated on a hot plate at 80° C. for 10 minutes under a nitrogen gas atmosphere, to form a film a.

Using the resultant film 1, measurement by a film X-ray diffraction method was performed. The resultant diffraction intensity A was 5.6, and diffraction intensity A/diffraction intensity B was 2.55.

Using the resultant film 1, film B and film a, TOF-SIMS measurement was performed. The resultant $I_1$ was 19740, the resultant $I_{01}$ was 93466, the resultant $I_2$ was 69450 and the resultant $I_{02}$ was 101488. The composition ratio Sr in the film surface of the film 1 calculated from them was 0.68.

Example 2

(Fabrication and Evaluation of Organic Film Transistor 2)

An organic film transistor 2 was fabricated in the same manner as in Example 1 excepting that a xylene solution containing the polymer compound C and the low molecular weight compound a (0.6% by weight, polymer compound C/low molecular weight compound a=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 2 was set at −40 V and the gate voltage Vg thereof was varied from 40 to −40 V, the transistor property was measured. The organic film transistor 2 had an electric field effect mobility of 1.21 cm$^2$/Vs.

Measurement Example 2

(Fabrication and Evaluation of Film 2)

A film 2 was fabricated in the same manner as in Measurement Example 1 excepting that a xylene solution containing the polymer compound C and the low molecular weight compound a (0.6% by weight, polymer compound C/low molecular weight compound C=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Using the resultant film 2, film X ray measurement was performed. The resultant diffraction intensity A was 7.9 and diffraction intensity A/diffraction intensity B was 6.71.

Example 3

(Fabrication and Evaluation of Organic Film Transistor 3)

An organic film transistor 3 was fabricated in the same manner as in Example 1 excepting that a xylene solution containing the polymer compound A and the low molecular weight compound a (0.6% by weight, polymer compound A/low molecular weight compound a=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 3 was set at −40 V and the gate voltage Vg thereof was varied from 40 to −40 V, the transistor property was measured. The organic film transistor 3 had an electric field effect mobility of 1.69 cm$^2$/Vs.

Measurement Example 3

(Fabrication and Evaluation of Film 3)

A film 3 was fabricated in the same manner as in Measurement Example 1 excepting that a xylene solution containing the polymer compound A and the low molecular weight compound a (0.6% by weight, polymer compound A/low molecular weight compound a=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Using the resultant film 3, film X ray measurement was performed. The resultant diffraction intensity A was 5.0 and diffraction intensity A/diffraction intensity B was 2.09.

Example 4

(Fabrication and Evaluation of Organic Film Transistor 4)

An organic film transistor 4 was fabricated in the same manner as in Example 1 excepting that a xylene solution containing the polymer compound B and the low molecular weight compound b (0.6% by weight, polymer compound B/low molecular weight compound b=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 4 was set at −40 V and the gate voltage Vg thereof was varied from 40 to −40 V, the transistor property was measured. The organic film transistor 4 had an electric field effect mobility of 1.41 cm$^2$/Vs.

Measurement Example 4

(Fabrication and Evaluation of Film 4)

A film 4 was fabricated in the same manner as in Measurement Example 1 excepting that a xylene solution containing the polymer compound B and the low molecular weight compound b (0.6% by weight, polymer compound B/low molecular weight compound b=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Using the resultant film 4, film X ray measurement was performed. The resultant diffraction intensity A was 5.0 and diffraction intensity A/diffraction intensity B was 3.95.

Synthesis Example 26

(Synthesis of Low Molecular Weight Compound f)

[chemical formula 72]

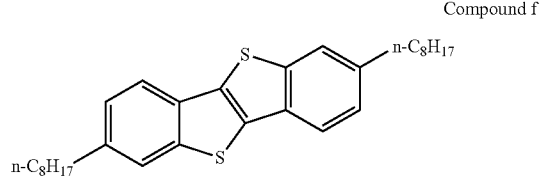

Compound f

The low molecular weight compound f was synthesized according to a method described in "J. Am. Chem. Soc., 2007, 129, 15732-15733".

Synthesis Example 27

(Synthesis of Polymer Compound A-2)

A polymer compound A-2 (240 mg) was synthesized in the same manner as in Synthesis Example 7 excepting that the charging amount of the compound 9 was changed from 0.078 g (0.200 mmol) to 64.4 mg (0.166 mmol). The polymer compound A-2 had a polystyrene-equivalent number-average molecular weight of 8.4×10$^4$ and a polystyrene-equivalent weight-average molecular weight of 1.8×10$^5$.

Example 5

(Fabrication and Evaluation of Organic Film Transistor 12)

An organic film transistor 12 was fabricated in the same manner as in Example 1 excepting that a xylene solution containing the polymer compound A-2 and the low molecular weight compound f (2.0% by weight, polymer compound A-2/low molecular weight compound f=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 12 was set at −40 V and the gate voltage Vg thereof was varied from 40 to −40 V, the transistor property was measured. The organic film transistor 12 had an electric field effect mobility of 3.57 cm$^2$/Vs.

Measurement Example 12

(Fabrication and Evaluation of Film 12)

A film 12 was fabricated in the same manner as in Measurement Example 1 excepting that a xylene solution containing the polymer compound A-2 and the low molecular weight compound f (2.0% by weight, polymer compound A-2/low molecular weight compound f=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Using the resultant film 12, film X ray measurement was performed. The resultant diffraction intensity A was 7.4 and diffraction intensity A/diffraction intensity B was 0.85.

Comparative Example 1

(Fabrication and Evaluation of Organic Film Transistor 5)

An organic film transistor 5 was fabricated in the same manner as in Example 1 excepting that a xylene solution containing the polymer compound D and the low molecular weight compound c (0.6% by weight, polymer compound D/low molecular weight compound c=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 5 was set at −40 V and the gate voltage Vg thereof was varied from 40 to −40 V, the transistor property was measured. The organic film transistor 5 had an electric field effect mobility of 0.01 cm$^2$/Vs.

Measurement Example 5

(Fabrication and Evaluation of Film 5)

A film 5 was fabricated in the same manner as in Measurement Example 1 excepting that a xylene solution containing the polymer compound D and the low molecular weight compound c (0.6% by weight, polymer compound D/low molecular weight compound c=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Using the resultant film 5, film X ray measurement was performed. The resultant diffraction intensity A was 0.2. Since the diffraction intensity B was not over the detection lower limit, diffraction intensity A/diffraction intensity B was uncalculatable.

Comparative Example 2

(Fabrication and Evaluation of Organic Film Transistor 6)

An organic film transistor 6 was fabricated in the same manner as in Example 1 excepting that a xylene solution containing the polymer compound D and the low molecular weight compound d (0.6% by weight, polymer compound D/low molecular weight compound d=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 6 was set at −40 V and the gate voltage Vg thereof was varied from 40 to −40 V, the transistor property was measured. The organic film transistor 6 had an electric field effect mobility of 0.02 $cm^2/Vs$.

Measurement Example 6

(Fabrication and Evaluation of Film 6)

A film 6 was fabricated in the same manner as in Measurement Example 1 excepting that a xylene solution containing the polymer compound D and the low molecular weight compound d (0.6% by weight, polymer compound D/low molecular weight compound d=75 parts by mass/25 parts by mass) was used instead of the xylene solution containing the polymer compound B and the low molecular weight compound a (0.6% by weight, polymer compound B/low molecular weight compound a=75 parts by mass/25 parts by mass). Using the resultant film 6, film X ray measurement was performed. The resultant diffraction intensity A was 0.7 and diffraction intensity A/diffraction intensity B was 3.27.

Comparative Example 3

(Fabrication and Evaluation of Organic Film Transistor 7)

An organic film transistor 7 was fabricated in the same manner as in Example 1 excepting that a xylene solution containing the polymer compound E and the low molecular weight compound e (0.6% by weight, polymer compound E/low molecular weight compound e=90 parts by mass/10 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 7 was set at −40 V and the gate voltage Vg thereof was varied from 40 to −40 V, the transistor property was measured. The organic film transistor 7 had an electric field effect mobility of 0.77 $cm^2/Vs$.

Measurement Example 7

(Fabrication and Evaluation of Film 7)

A film 7 was fabricated in the same manner as in Measurement Example 1 excepting that a xylene solution containing the polymer compound E and the low molecular weight compound e (0.6% by weight, polymer compound E/low molecular weight compound e=90 parts by mass/10 parts by mass) was used instead of the xylene solution containing the polymer compound B and the low molecular weight compound a (0.6% by weight, polymer compound B/low molecular weight compound a=75 parts by mass/25 parts by mass). Using the resultant film 7, film X ray measurement was performed. The resultant diffraction intensity A was 145.4 and diffraction intensity A/diffraction intensity B was 33.19.

Comparative Example 4

(Fabrication and Evaluation of Organic Film Transistor 8)

An organic film transistor 8 was fabricated in the same manner as in Example 1 excepting that a xylene solution containing the polymer compound E and the low molecular weight compound e (0.6% by weight, polymer compound E/low molecular weight compound e=70 parts by mass/30 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 8 was set at −40 V and the gate voltage Vg thereof was varied from 40 to −40 V, the transistor property was measured. The organic film transistor 8 had an electric field effect mobility of 0.49 $cm^2/Vs$.

Measurement Example 8

(Fabrication and Evaluation of Film 8)

A film 8 was fabricated in the same manner as in Measurement Example 1 excepting that a xylene solution containing the polymer compound E and the low molecular weight compound e (0.6% by weight, polymer compound E/low molecular weight compound e=70 parts by mass/30 parts by mass) was used instead of the xylene solution containing the polymer compound B and the low molecular weight compound a (0.6% by weight, polymer compound B/low molecular weight compound a=75 parts by mass/25 parts by mass). Using the resultant film 8, film X ray measurement was performed. The resultant diffraction intensity A was 56.5 and diffraction intensity A/diffraction intensity B was 8.27.

Comparative Example 5

(Fabrication and Evaluation of Organic Film Transistor 9)

An organic film transistor 9 was fabricated in the same manner as in Example 1 excepting that a xylene solution containing the polymer compound E and the low molecular weight compound e (0.6% by weight, polymer compound E/low molecular weight compound e=50 parts by mass/50 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 9 was set at −40 V and the gate voltage Vg thereof was varied from 40 to −40 V, the transistor property was measured. The organic film transistor 9 had an electric field effect mobility of 0.37 $cm^2/Vs$.

Measurement Example 9

(Fabrication and Evaluation of Film 9)

A film 9 was fabricated in the same manner as in Measurement Example 1 excepting that a xylene solution containing the polymer compound E and the low molecular weight compound e (0.6% by weight, polymer compound E/low molecular weight compound e=50 parts by mass/50 parts by mass) was used instead of the xylene solution containing the polymer compound B and the low molecular weight compound a (0.6% by weight, polymer compound B/low molecular weight compound a=75 parts by mass/25 parts by mass). Using the resultant film 9, film X ray measurement was performed. The resultant diffraction intensity A was 31.5 and diffraction intensity A/diffraction intensity B was 7.33.

Comparative Example 6

(Fabrication and Evaluation of Organic Film Transistor 10)

An organic film transistor 10 was fabricated in the same manner as in Example 1 excepting that a xylene solution containing the polymer compound E and the low molecular weight compound e (0.6% by weight, polymer compound E/low molecular weight compound e=30 parts by mass/70 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 10 was set at −40 V and the gate voltage Vg thereof was varied from 40 to −40 V, the transistor property was measured. The organic film transistor 10 had an electric field effect mobility of 0.47 cm$^2$/Vs.

Measurement Example 10

(Fabrication and Evaluation of Film 10)

A film 10 was fabricated in the same manner as in Measurement Example 1 excepting that a xylene solution containing the polymer compound E and the low molecular weight compound e (0.6% by weight, polymer compound E/low molecular weight compound e=30 parts by mass/70 parts by mass) was used instead of the xylene solution containing the polymer compound B and the low molecular weight compound a (0.6% by weight, polymer compound B/low molecular weight compound a=75 parts by mass/25 parts by mass). Using the resultant film 10, film X ray measurement was performed. The resultant diffraction intensity A was 97.6 and diffraction intensity A/diffraction intensity B was 21.30.

Comparative Example 7

(Fabrication and Evaluation of Organic Film Transistor 11)

An organic film transistor 11 was fabricated in the same manner as in Example 1 excepting that a xylene solution containing the polymer compound E and the low molecular weight compound e (0.6% by weight, polymer compound E/low molecular weight compound e=20 parts by mass/80 parts by mass) was used instead of the xylene solution containing the polymer compound B and the low molecular weight compound a (0.6% by weight, polymer compound B/low molecular weight compound a=75 parts by mass/25 parts by mass). Under conditions in which the source-drain voltage Vsd of the resultant organic film transistor 11 was set at −40 V and the gate voltage Vg thereof was varied from 40 to −40 V, the transistor property was measured. The organic film transistor 11 had an electric field effect mobility of 0.48 cm$^2$/Vs.

Measurement Example 11

(Fabrication and Evaluation of Film 11)

A film 11 was fabricated in the same manner as in Measurement Example 1 excepting that a xylene solution containing the polymer compound E and the low molecular weight compound e (0.6% by weight, polymer compound E/low molecular weight compound e=20 parts by mass/80 parts by mass) was used instead of the xylene solution containing the polymer compound B and the low molecular weight compound a (0.6% by weight, polymer compound B/low molecular weight compound a=75 parts by mass/25 parts by mass). Using the resultant film 11, film X ray measurement was performed. The resultant diffraction intensity A was 101.2 and diffraction intensity A/diffraction intensity B was 29.17.

TABLE 1

| | organic semiconductor layer | | electric field | | diffraction |
|---|---|---|---|---|---|
| | polymer compound | low molecular weight compound | effect mobility (cm$^2$/Vs) | diffraction intensity A | intensity A/ diffraction intensity B |
| Example 1 | B (75 parts by mass) | a (25 parts by mass) | 1.05 | 5.6 | 2.55 |
| Example 2 | c (75 parts by mass) | a (25 parts by mass) | 1.21 | 7.9 | 6.71 |
| Example 3 | A (75 parts by mass) | a (25 parts by mass) | 1.69 | 5.0 | 2.09 |
| Example 4 | B (75 parts by mass) | b (25 parts by mass) | 1.41 | 5.0 | 3.95 |
| Example 5 | A-2 (75 parts by mass) | f (25 parts by mass) | 3.57 | 7.4 | 0.85 |
| Comparative Example 1 | D (75 parts by mass) | c (25 parts by mass) | 0.01 | 0.2 | uncalculatable |
| Comparative Example 2 | D (75 parts by mass) | d (25 parts by mass) | 0.02 | 0.7 | 3.27 |

TABLE 1-continued

| | organic semiconductor layer | | electric field | | diffraction |
| | polymer compound | low molecular weight compound | effect mobility (cm²/Vs) | diffraction intensity A | intensity A/ diffraction intensity B |
|---|---|---|---|---|---|
| Comparative Example 3 | E (90 parts by mass) | e (10 parts by mass) | 0.77 | 145.4 | 33.19 |
| Comparative Example 4 | E (70 parts by mass) | e (30 parts by mass) | 0.49 | 56.5 | 8.27 |
| Comparative Example 5 | E (50 parts by mass) | e (50 parts by mass) | 0.37 | 31.5 | 7.33 |
| Comparative Example 6 | E (30 parts by mass) | e (70 parts by mass) | 0.47 | 97.6 | 21.30 |
| Comparative Example 7 | E (20 parts by mass) | e (80 parts by mass) | 0.48 | 101.2 | 29.17 |

INDUSTRIAL APPLICABILITY

According to the present invention, a film which is useful for production of an organic film transistor excellent in electric field effect mobility can be provided. Further, according to the present invention, an organic semiconductor device using the film in an active layer can be provided.

EXPLANATION OF REFERENCE NUMERALS

1 . . . substrate, 2 . . . organic semiconductor layer, 3 . . . insulating layer, 4 . . . gate electrode, 5 . . . source electrode, 6 . . . drain electrode, 100 . . . organic film transistor, 110 . . . organic film transistor, 120 . . . organic film transistor, 130 . . . organic film transistor, 140 . . . organic film transistor, 150 . . . organic film transistor, 160 . . . organic film transistor

The invention claimed is:

1. A film comprising a polymer compound and a low molecular weight compound having carrier transportability, wherein
the content of the low molecular weight compound is 5 to 40 parts by mass with respect to 100 parts by mass of the sum of the polymer compound and the low molecular weight compound,
the diffraction intensity A specified by the following measuring method A is 3 to 50, and
the intensity ratio (A/B) of the diffraction intensity A specified by the following measuring method A to the diffraction intensity B specified by the following measuring method B is 30 or less:
(Measuring method A)
the diffraction intensity A is the maximum diffraction intensity in a range of scattering vector of 1 nm$^{-1}$ to 5 nm$^{-1}$ in a profile obtained by an Out-of plane measuring method using a film X-ray diffraction method,
(Measuring method B)
the diffraction intensity B is the maximum diffraction intensity in a range of scattering vector of 10 nm$^{-1}$ to 21 nm$^{-1}$ in a profile obtained by an In-plane measuring method using a film X-ray diffraction method.

2. The film according to claim 1, wherein the diffraction intensity A is 3 to 30.

3. The film according to claim 1, wherein the intensity ratio (A/B) of the diffraction intensity A to the diffraction intensity B is 20 or less.

4. The film according to claim 1, wherein the low molecular weight compound is a low molecular weight compound represented by the formula (1):

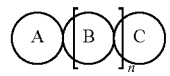

(1)

wherein
n represents an integer of 1 or more;
Ring A and Ring C each independently represent a benzene ring, a 5-membered heterocyclic ring or a 6-membered heterocyclic ring, and these rings may have a substituent;
Ring B represents a benzene ring, a cyclopentadiene ring, a 5-membered heterocyclic ring or a 6-membered heterocyclic ring, and these rings may have a substituent; when there are a plurality of Rings B, they may be the same or different; and
Ring A and Ring B are mutually condensed to form a condensed ring, Ring B and Ring C are mutually condensed to form a condensed ring, and when there are a plurality of Rings B, adjacent Rings B are mutually condensed to form a condensed ring.

5. The film according to claim 4, wherein the compound represented by the formula (1) is a compound represented by the formula (1-1), a compound represented by the formula (1-2), a compound represented by the formula (1-3), a compound represented by the formula (1-4), a compound represented by the formula (1-5), a compound represented by the formula (1-6), a compound represented by the formula (1-7), a compound represented by the formula (1-8), a compound represented by the formula (1-9), a compound represented by the formula (1-10), a compound represented by the formula (1-11), a compound represented by the formula (1-12), a compound represented by the formula (1-13) or a compound represented by the formula (1-14):

-continued
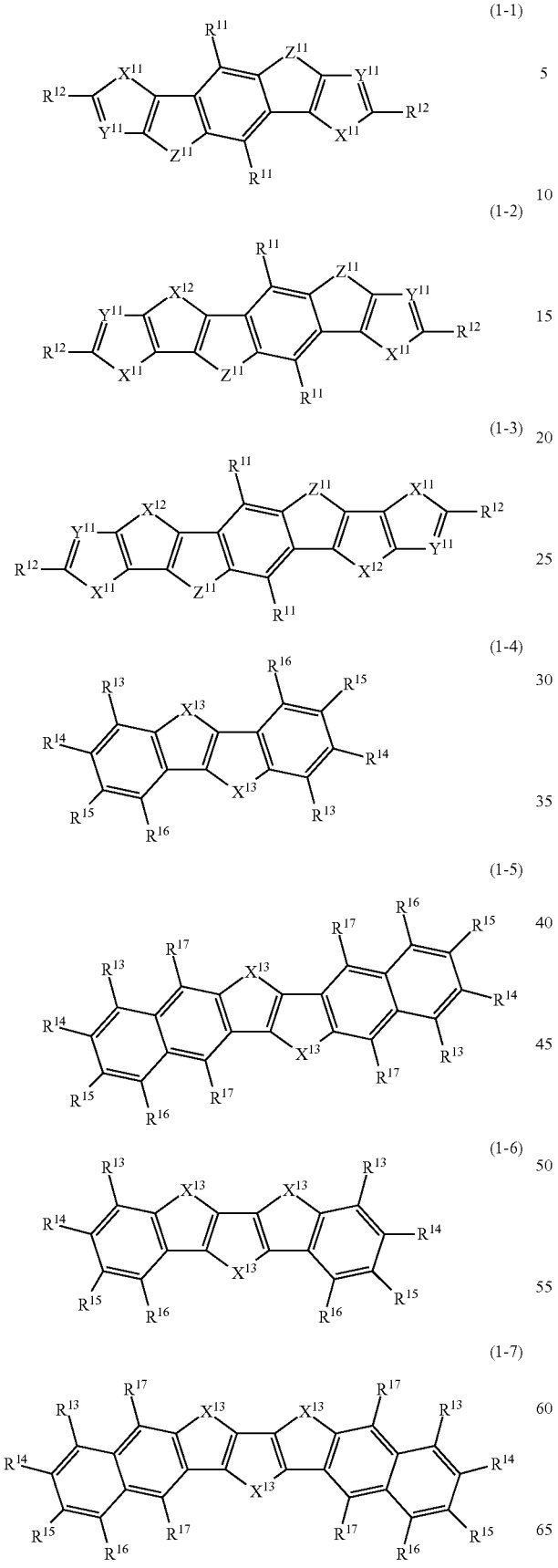
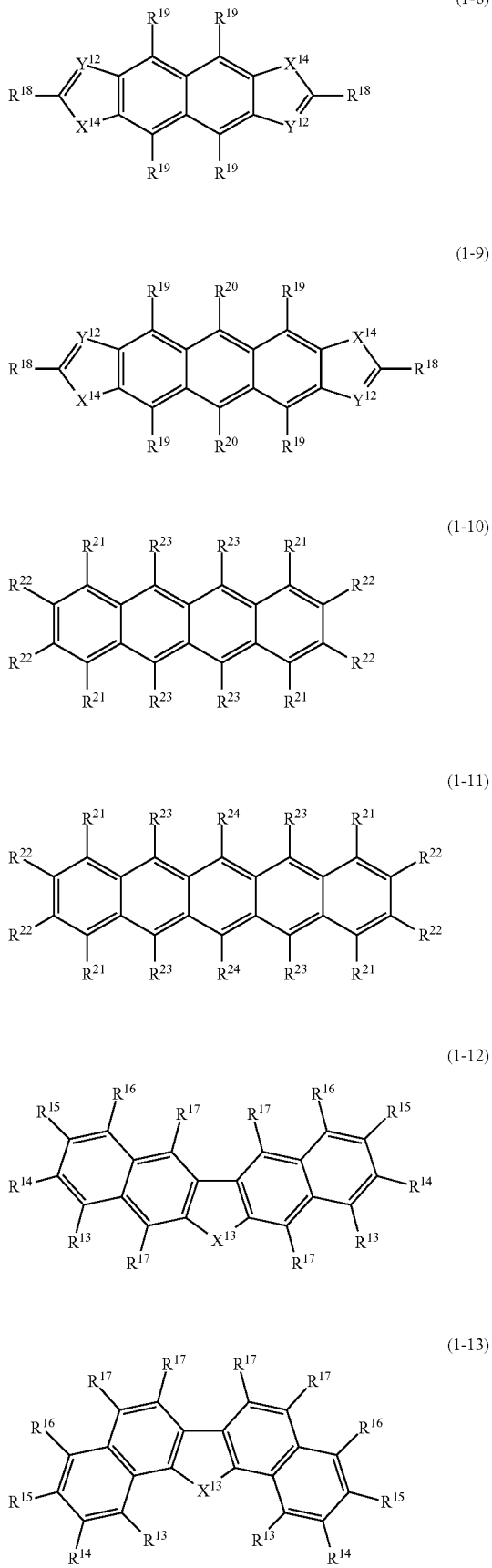

(1-14)

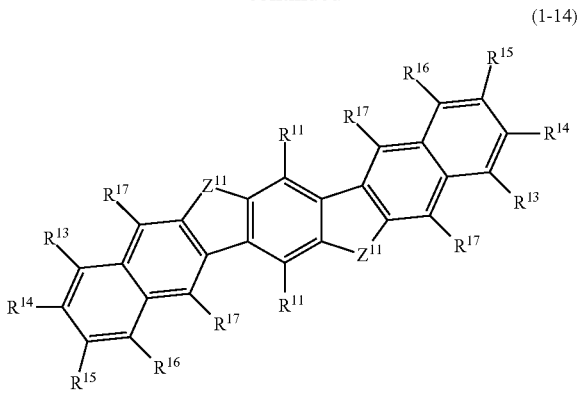

wherein
- $Z^{11}$ represents a group represented by the formula (Z-1), a group represented by the formula (Z-2), a group represented by the formula (Z-3), a group represented by the formula (Z-4) or a group represented by the formula (Z-5), A plurality of $Z^{11}$ may be mutually the same or different;
- $X^{11}$, $X^{12}$, $X^{13}$ and $X^{14}$ each independently represent an oxygen atom, a sulfur atom or a selenium atom, A plurality of $X^{11}$, $X^{13}$ and $X^{14}$ each may be mutually the same or different; when there are a plurality of $X^{12}$, they may be the same or different;
- $Y^{11}$ and $Y^{12}$ each independently represent a nitrogen atom or a group represented by $-CR^2=$, $R^2$ represents a hydrogen atom, an alkyl group, a cycloalkyl group, an alkoxy group, a cycloalkoxy group, an alkylthio group, a cycloalkylthio group, an aryl group, a monovalent heterocyclic group or a halogen atom; of these groups, the alkyl group, the cycloalkyl group, the alkoxy group, the cycloalkoxy group, the alkylthio group, the cycloalkylthio group, the aryl group and the monovalent heterocyclic group each may have a substituent; a plurality of $Y^{11}$ and $Y^{12}$ each may be mutually the same or different;
- $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$ and $R^{24}$ each independently represent a hydrogen atom, an alkyl group, a cycloalkyl group, an alkoxy group, a cycloalkoxy group, an alkylthio group, a cycloalkylthio group, an aryl group, an alkynyl group, a monovalent heterocyclic group or a halogen atom; of these groups, the alkyl group, the cycloalkyl group, the alkoxy group, the cycloalkoxy group, the alkylthio group, the cycloalkylthio group, the aryl group, the alkynyl group and the monovalent heterocyclic group each may have a substituent; and a plurality of $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$ and $R^{24}$ each may be mutually the same or different;

(Z-1)

(Z-2)

(Z-3)

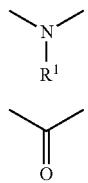

(Z-4)

(Z-5)

wherein $R^1$ represents an alkyl group, a cycloalkyl group, an alkoxy group, a cycloalkoxy group, an alkylthio group, a cycloalkylthio group, an aryl group or a monovalent heterocyclic group, and these groups may have a substituent; and when there are a plurality of $R^1$, they may be the same or different.

6. The film according to claim 1, wherein the polymer compound is a polymer compound containing a structural unit represented by the formula (2):

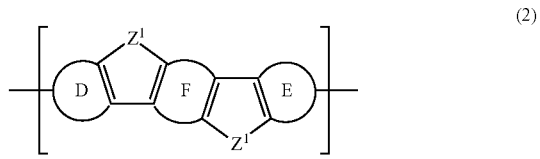

(2)

wherein
- Ring D and Ring E each independently represent a heterocyclic ring, and this heterocyclic ring may have a substituent;
- Ring F represents an aromatic hydrocarbon ring or a heterocyclic ring, and these rings may have a substituent;
- $Z^1$ represents a group represented by the formula (Z-1'), a group represented by the formula (Z-2'), a group represented by the formula (Z-3'), a group represented by the formula (Z-4') or a group represented by the formula (Z-5'), A plurality of $Z^1$ may be mutually the same or different;

(Z-1')

(Z-2')

(Z-3')

(Z-4')

(Z-5')

wherein $R^{1'}$ represents an alkyl group, a cycloalkyl group, an alkoxy group, a cycloalkoxy group, an alkylthio group, a cycloalkylthio group, an aryl group or a monovalent heterocyclic group, and these groups may have a substituent; and when there are a plurality of $R^{1'}$, they may be the same or different.

7. The film according to claim 6, wherein the structural unit represented by the formula (2) is a structural unit represented by the formula (2-1), a structural unit represented by the formula (2-2) or a structural unit represented by the formula (2-3):

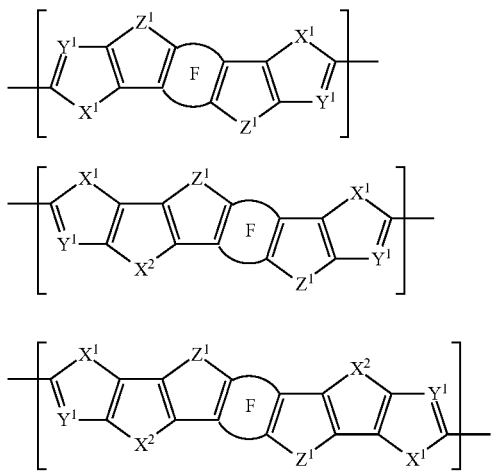

wherein
Ring F and $Z^1$ represent the same meaning as described above;

$X^1$ and $X^2$ each independently represent an oxygen atom, a sulfur atom or a selenium atom, A plurality of $X^1$ may be mutually the same or different; when there are a plurality of $X^2$, they may be the same or different;

$Y^1$ represents a nitrogen atom or a group represented by —$CR^{2'}$=, $R^{2'}$ represents a hydrogen atom, an alkyl group, a cycloalkyl group, an alkoxy group, a cycloalkoxy group, an alkylthio group, a cycloalkylthio group, an aryl group, a monovalent heterocyclic group or a halogen atom; and a plurality of $Y^1$ may be mutually the same or different.

8. An organic semiconductor device having a first electrode and a second electrode and having an active layer between the first electrode and the second electrode, wherein the active layer is the film according to claim 1.

9. The organic semiconductor device according to claim 8, wherein the organic semiconductor device is any one of an organic film transistor, an organic film solar battery, an organic electroluminescent device, an organic electric field effect transistor sensor and an organic conductivity modulation type sensor.

10. The organic semiconductor device according to claim 9, wherein the organic semiconductor device is an organic film transistor.

* * * * *